(12) United States Patent
Funaki et al.

(10) Patent No.: US 6,692,889 B1
(45) Date of Patent: Feb. 17, 2004

(54) PHOTORESIST POLYMERIC COMPOUND AND PHOTORESIST RESIN COMPOSITION

(75) Inventors: Yoshinori Funaki, Himeji (JP); Kiyoharu Tsutsumi, Himeji (JP); Akira Takaragi, Himeji (JP); Keizo Inoue, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 307 days.

(21) Appl. No.: 09/806,857

(22) PCT Filed: Aug. 2, 2000

(86) PCT No.: PCT/JP00/05138

§ 371 (c)(1),
(2), (4) Date: Apr. 5, 2001

(87) PCT Pub. No.: WO01/10916

PCT Pub. Date: Feb. 15, 2001

(30) Foreign Application Priority Data

Aug. 5, 1999 (JP) .......................................... 11-223110
Aug. 5, 1999 (JP) .......................................... 11-223144

(51) Int. Cl.$^7$ .......................... G03F 7/004; C08F 36/00
(52) U.S. Cl. .................... 430/270.1; 430/905; 526/270; 526/281; 526/320
(58) Field of Search ................................ 526/281, 270; 460/270.1, 905

(56) References Cited

U.S. PATENT DOCUMENTS 6,303,266 B1 * 10/2001 Okino et al.
6,391,520 B1 * 5/2002 Nakano et al.

FOREIGN PATENT DOCUMENTS

| EP | A1915077 | 5/1999 |
| EP | A2982628 | 3/2000 |
| EP | A1999474 | 5/2000 |
| EP | A1-1000924 | 5/2000 |
| JP | A2000098612 | 4/2000 |
| JP | A2000147775 | 5/2000 |
| WO | 99/61956 | * 2/1999 |

* cited by examiner

Primary Examiner—Rosemary Ashton
(74) Attorney, Agent, or Firm—Birch, Stewart, Kolasch & Birch, LLP

(57) ABSTRACT

A polymeric compound of the invention includes at least one monomer unit selected from the following formulae (I), (II), (III) and (IV):

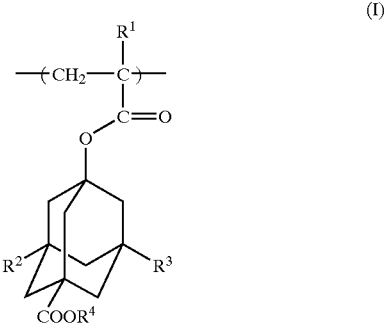

(I)

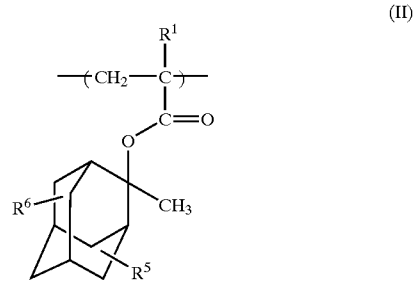

(II)

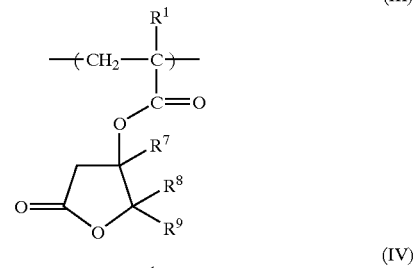

(III)

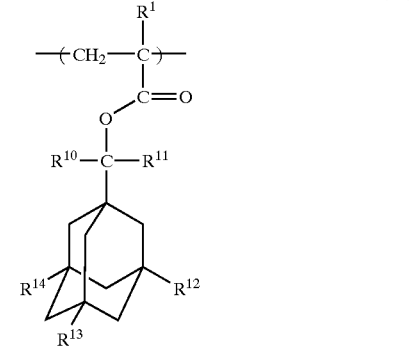

(IV)

(wherein $R^1$ is a hydrogen atom or a methyl group, $R^2$ and $R^3$ are each a hydrogen atom, a hydroxyl group or a —COOR$^4$ group, where $R^4$ is, e.g., a t-butyl group or a 2-tetrahydropyranyl group; $R^5$ and $R^6$ are each a hydrogen atom, a hydroxyl group or an oxo group; $R^7$, $R^8$ and $R^9$ are each a hydrogen atom or a methyl group; $R^{10}$ and $R^{11}$ are each a hydrocarbon group having 1 to 8 carbon atoms; $R^{12}$, $R^{13}$ and $R^{14}$ are each a hydrogen atom, a hydroxyl group or a methyl group, where if all of $R^{12}$ to $R^{14}$ are each a hydrogen atom or a hydroxyl group, $R^{10}$ and $R^{11}$ are not coincidentally methyl groups) [wherein, when the compound includes, for example, a monomer unit of Formula (III), the compound further includes at least one monomer unit selected from among, for example, a monomer unit represented by the following Formula (V):

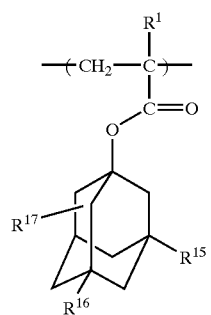

(V)

(wherein $R^{15}$ and $R^{16}$ are each a hydrogen atom, a hydroxyl group or a carboxyl group; $R^{17}$ is a hydroxyl group, an oxo group or a carboxyl group; and $R^1$ has the same meaning as defined above)]. This polymeric compound has high etching resistance, as well as satisfactory transparency, alkali-solubility and adhesion, and is therefore useful as a photoresist resin.

8 Claims, No Drawings

PHOTORESIST POLYMERIC COMPOUND AND PHOTORESIST RESIN COMPOSITION

This application is the national phase under 35 U.S.C. §371 of PCT International Application No. PCT/JP00/05168 which has an International filing date of Aug. 2, 2000, which designated the United States of America.

TECHNICAL FIELD

The present invention relates to a polymeric compound which is useful as a photoresist resin for use in, for example, the micromachining of semiconductors, and to a photoresist resin composition which contains this polymeric compound.

BACKGROUND ART

Positive photoresists for use in manufacturing processes of semiconductors must coincidentally have different characteristics such as a characteristic that an exposed portion is made soluble in alkali by light irradiation, adhesion to silicon wafers, plasma-etching resistance, and transparency to light used. The positive photoresist is generally used as a solution containing a base component polymer, a light-activatable acid generator, and several types of additives for controlling the above characteristics. It is very important for the base component polymer to have the above individual characteristics in balance in order to prepare an appropriate resist according to its use.

The wavelength of a light source in lithography for use in semiconductor manufacturing becomes shorter and shorter in recent years, and ArF excimer laser with a wavelength of 193 nm is promising as a next-generation light source. The use of a unit containing an alicyclic hydrocarbon skeleton has been proposed as a monomer unit for a resist polymer for use in the ArF excimer laser exposure system (e.g., Japanese Patent No. 2776273). Such an alicyclic hydrocarbon skeleton is highly transparent with respect to light with the aforementioned wavelength and is resistant to etching. The use of a polymer having an adamantane skeleton as a resist polymer is also known, which adamantane skeleton exhibits especially high etching resistance among alicyclic hydrocarbon skeletons. However, such alicyclic hydrocarbon skeletons are highly hydrophobic and have therefore low adhesion to substrates, although they have high etching resistance as mentioned above. To relieve this disadvantage, the aforementioned Japanese patent therefore proposes a copolymer containing highly hydrophilic monomer units (adhesion-imparting monomer units) having, for example, a carboxyl group or a lactone ring. However, these monomer units are not resistant to etching, and the etching resistant of the overall polymer becomes insufficient when the polymer contains a sufficient amount of the monomer units to satisfy the required adhesion.

Separately, Japanese Unexamined Patent Application Publication No. 11-109632 has a try at imparting hydrophilicity to an adamantane skeleton by introducing a hydroxyl group thereto. However, the polymer proposed in the publication uses t-butyl (meth)acrylate as a monomer unit (alkali-soluble monomer unit) which becomes soluble in alkali by action of an acid generated by light irradiation, and the etching resistance of the overall polymer is still insufficient.

Attempts have been made to use a monomer unit having an adamantane skeleton itself as an alkali-soluble monomer unit (e.g., Japanese Unexamined Patent Application Publication No. 9-73173, Japanese Unexamined Patent Application Publication No. 9-90637, Japanese Unexamined Patent Application Publication No. 10-274852, Japanese Unexamined Patent Application Publication No. 10-319595, Japanese Unexamined Patent Application Publication No. 11-12326, and Japanese Unexamined Patent Application Publication No. 11-119434). However, monomers lacking etching resistance are used as the adhesion-imparting monomer units in these polymers, and the overall resulting polymers are still insufficient in etching resistance.

DISCLOSURE OF INVENTION

Accordingly, it is an object of the present invention to provide a polymeric compound having not only satisfactory transparency, alkali-solubility, and adhesion but also high etching resistance, as well as to provide a photoresist resin composition containing the polymeric compound.

After intensive investigations, the present inventors found that, when a polymer containing a monomer unit having an adamantane skeleton with a specific structure is used as a photoresist resin, the resulting photoresist resin has satisfactory etching resistance, in addition to excellent transparency, alkali-solubility and adhesion. The present invention has been accomplished based on these findings.

Specifically, the present invention provides, in an aspect, a polymeric compound which includes at least one monomer unit selected from among the following formulae (I), (II), (III) and (IV):

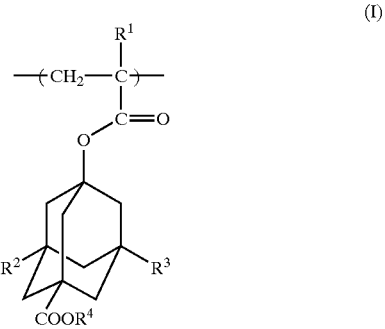

(I)

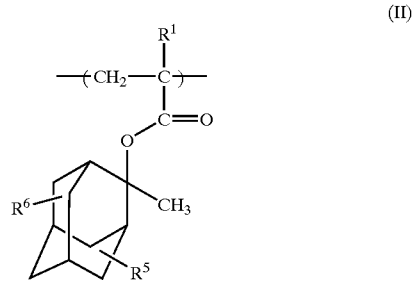

(II)

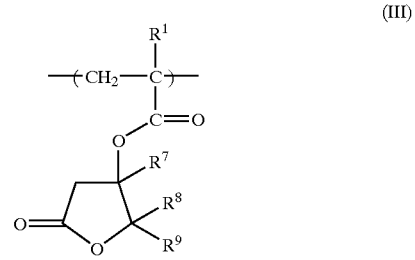

(III)

-continued (IV)

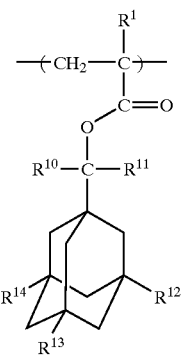

(wherein $R^1$ is a hydrogen atom or a methyl group, $R^2$ and $R^3$ are the same or different and are each a hydrogen atom, a hydroxyl group or a —$COOR^4$ group, where $R^4$ is a t-butyl group, a 2-tetrahydrofuranyl group, a 2-tetrahydropyranyl group or an 2-oxepanyl group; $R^5$ and $R^6$ are the same or different and are each a hydrogen atom, a hydroxyl group or an oxo group; $R^7$, $R^8$ and $R^9$ are the same or different and are each a hydrogen atom or a methyl group; $R^{10}$ and $R^{11}$ are the same or different and are each a hydrocarbon group having 1 to 8 carbon atoms; $R^{12}$, $R^{13}$ and $R^{14}$ are the same or different and are each a hydrogen atom, a hydroxyl group or a methyl group, where if all of $R^{12}$ to $R^{14}$ are each a hydrogen atom or a hydroxyl group, $R^{10}$ and $R^{11}$ are not coincidentally methyl groups)

[wherein, when the polymeric compound comprises a monomer unit of Formula (II) in which $R^5$=$R^6$=H or comprises a monomer unit of Formula (III), the polymeric compound further comprises at least one monomer unit selected from among a monomer unit represented by Formula (I), a monomer unit of Formula (II) in which at least one of $R^5$ and $R^6$ is a hydroxyl group or an oxo group, a monomer unit represented by Formula (IV) and a monomer unit represented by the following Formula (V):

(V)

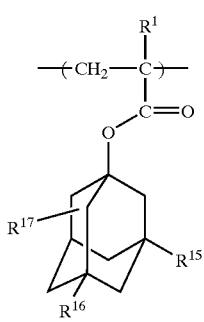

(wherein $R^{15}$ and $R^{16}$ are the same or different and are each a hydrogen atom, a hydroxyl group or a carboxyl group; $R^{17}$ is a hydroxyl group, an oxo group or a carboxyl group; and $R^1$ has the same meaning as defined above)].

The polymeric compound may include at least one monomer unit selected from among Formulae (I), (II) and (III); and at least one monomer unit represented by Formula (V).

Alternatively, the polymeric compound may include at least one monomer unit represented by Formula (IV); and at least one monomer unit (excluding the monomer unit represented by Formula (IV)) selected from the following formulae (VI) and (II):

(VI)

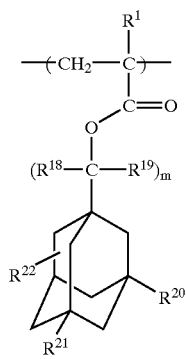

(II)

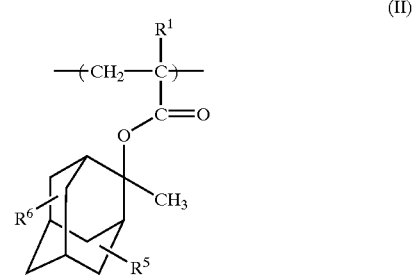

(wherein $R^1$ is a hydrogen atom or a methyl group; $R^{18}$ and $R^{19}$ are the same or different and are each a hydrocarbon group having 1 to 8 carbon atoms; $R^{20}$ and $R^{21}$ are the same or different and are each a hydrogen atom, a hydroxyl group, a carboxyl group or a —COOR group; $R^{22}$ is a hydroxyl group, an oxo group, a carboxyl group or a —COOR group, where R is a t-butyl group, a 2-tetrahydrofuranyl group, a 2-tetrahydropyranyl group or an 2-oxepanyl group; m denotes 0 or 1; and $R^5$ and $R^6$ are the same or different and are each a hydrogen atom, a hydroxyl group or an oxo group).

The polymeric compound may further include at least one monomer unit selected from among a monomer unit represented by the following Formula (VII):

(VII)

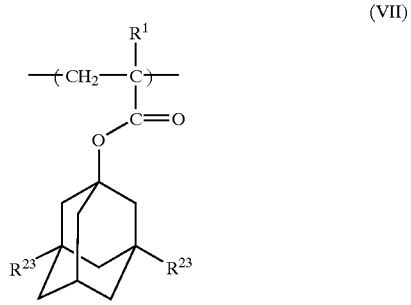

(wherein $R^1$ and $R^{23}$ are the same or different and are each a hydrogen atom or a methyl group), a monomer unit represented by the following Formula (VIII):

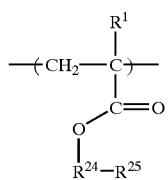

(VIII)

(wherein $R^{24}$ is a tricyclo[$5.2.1.0^{2,6}$]decylmethyl group, a tetracyclo[$4.4.0.1^{2,5}.1^{7,10}$]dodecylmethyl group, a norbornyl group, an isobornyl group or a 2-norbornylmethyl group; R is a substituent of $R^{24}$ and is a hydrogen atom, a hydroxyl group, a hydroxymethyl group, a carboxyl group or a —$COOR^{26}$ group, where $R^{26}$ is a t-butyl group, a 2-tetrahydrofuranyl group, a 2-tetrahydropyranyl group or an 2-oxepanyl group; and $R^1$ has the same meaning as defined above),
a monomer unit represented by the following Formula (IX):

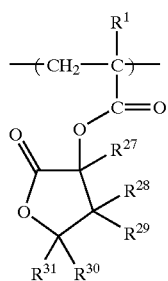

(IX)

(wherein $R^{27}$, $R^{28}$, $R^{29}$, $R^{30}$ and $R^{31}$ are the same or different and are each a hydrogen atom or a methyl group; and $R^1$ has the same meaning as defined above),
a monomer unit represented by the following Formula (X):

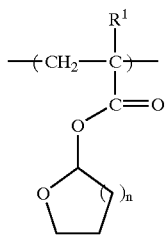

(X)

(wherein n denotes an integer of 1 to 3; and $R^1$ has the same meaning as defined above),
and a monomer unit represented by the following Formula (XI):

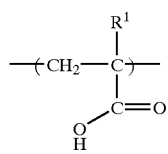

(XI)

(wherein $R^1$ has the same meaning as defined above).

In the polymeric compound, the total content of monomer units each having an adamantane skeleton may occupy, for example, 50% to 100% by weight, and preferably 70% to 100% by weight of total monomer units constituting the polymer.

The polymeric compound can be used as a photoresist resin.

The present invention provides, in another aspect, a photoresist resin composition which includes the polymeric compound and a light-activatable acid generator.

The terms "acrylic (acrylyl)" and "methacrylic (methacrylyl)" as used in the present description may be generically referred to as "(meth)acrylic" or "(meth) acrylyl".

BEST MODE FOR CARRYING OUT THE INVENTION

A polymeric compound of the present invention comprises at least one monomer unit selected from among Formulae (I), (II), (III) and (IV) as a constitutional unit. However, when the polymeric compound comprises a monomer unit of Formula (II) in which $R^5$=$R^6$=H or a monomer unit of Formula (III), the polymeric compound further comprises at least one monomer unit selected from among a monomer unit represented by Formula (I), a monomer unit of Formula (II) in which at least one of $R^5$ and $R^6$ is a hydroxyl group or an oxo group, a monomer unit represented by Formula (IV), and a monomer unit represented by Formula (V).

In Formula (II), $R^5$ and $R^6$ are each a group combined with a carbon atom constituting an adamantane ring. When each of these groups is a hydroxyl group, it is generally combined with the adamantane ring at a bridgehead position. In Formula (V), $R^{17}$ is a group combined with a carbon atom constituting the adamantane ring. When this group is a hydroxyl group or a carboxyl group, it is generally combined with the adamantane ring at a bridgehead position.

In Formula (IV), hydrocarbons each having 1 to 8 carbon atoms in $R^{10}$ and $R^{11}$ include, but are not limited to, methyl, ethyl, propyl, isopropyl, butyl, isobutyl, s-butyl, pentyl, isopentyl, 1-methylbutyl, 1-ethylpropyl, hexyl, isohexyl, 1-methylpentyl, 1-ethylbutyl, heptyl, 1-methylhexyl, octyl, 1-methylheptyl and other $C_1$–$C_8$ alkyl groups; cyclopropyl, cyclopentyl, cyclohexyl, cycloheptyl, cyclooctyl and other $C_3$–$C_8$ cycloalkyl groups; and phenyl group. Among these groups, methyl, ethyl, isopropyl and other $C_1$–$C_3$ alkyl groups are preferred. In this connection, when none of $R^{12}$ to $R^{14}$ is a methyl group (when all of $R^{12}$ to $R^{14}$ are each a hydrogen atom or a hydroxyl group), $R^{10}$ and $R^{11}$ are not coincidentally methyl groups.

In the monomer unit represented by Formula (I), a carboxyl group, which is combined with the adamantane skeleton and is protected with a protective group, is deprotected by action of an acid to thereby form a free carboxyl group. In the monomer unit represented by Formula (II), an adamantane skeleton is eliminated from a carboxylic acid moiety combined with a principle chain by action of an acid to thereby form a free carboxyl group. Additionally, in the monomer unit represented by Formula (III), a lactone ring is eliminated from a carboxylic acid moiety combined with a principle chain by action of an acid to thereby form a free carboxyl group. Furthermore, in the monomer unit represented by Formula (IV), a moiety containing an adamantane skeleton is eliminated from a carboxylic acid moiety combined with a principle chain by action of an acid to thereby form a free carboxyl group. Accordingly, these monomer units of Formulae (I) to (IV) (hereinafter may be referred to as as "monomer unit 1") act as alkali-soluble units which become soluble in developing with an alkali. In this connection, the monomer unit of Formula (III) also has an adhesive function to substrates, since it contains a hydrophilic lactone ring. Of monomer units represented by Formula (IV), a monomer unit, in which at least one (preferably two or three) of $R^{12}$ to $R^{14}$ is a hydroxyl group, has a high hydrophilicity and has an adhesive function.

The polymeric compounds according to the present invention have, as described above, the function of being soluble in alkali and each contain a monomer unit having an adamantane skeleton [the monomer unit of Formula (III) is used in combination with the monomer unit of Formula (I), (II), (IV) or (V)], and therefore have a feature that they are excellent in transparency and are very highly resistant to etching. Additionally, the polymeric compounds can exhibit a satisfactory adhesive function by appropriately incorporating the monomer unit of Formula (III), the monomer unit of Formula (V), a monomer unit of Formula (IV) in which at least one of $R^{12}$ to $R^{14}$ is a hydroxyl group, or another hydrophilic monomer unit. Accordingly, the invented polymeric compounds can be advantageously used as photoresist resins.

In a preferred embodiment of the present invention, the polymeric compound comprises at least one monomer unit selected from among Formulae (I), (II) and (III) (hereinafter may be referred to as "monomer unit 1a"), and at least one monomer unit represented by Formula (V) (hereinafter may be referred to as "monomer unit 2a"). Monomer unit 2a has a highly hydrophilic group (hydroxyl group, carboxyl group or oxo group) combined with the adamantane skeleton and therefore plays a role as a adhesion-imparting unit which improves adhesion to substrates.

The polymeric compound containing both monomer unit 1a and monomer unit 2a has very well-rounded individual characteristics including alkali solubility, adhesion to substrates, plasma-etching resistance and transparency.

In such a polymeric compound containing both monomer unit 1a and monomer unit 2a, the ratio of monomer unit 1a to monomer unit 2a is, for example, such that the former/the latter (by mole) is from about 1/99 to about 99/1, preferably from about 5/95 to about 80/20, and more preferably from about 15/85 to about 65/35.

In another preferred embodiment of the present invention, the polymeric compound comprises at least one monomer unit represented by Formula (IV) (hereinafter may be referred to as "monomer unit 1b") and at least one monomer unit selected from among Formulae (VI) and (II) (excluding the monomer unit represented by Formula (IV)) (hereinafter may be referred to as "monomer unit 2b"). In this connection, monomer unit 2a and monomer unit 2b may be generically referred to as "monomer unit 2".

In Formula (VI), hydrocarbons each having 1 to 8 carbon atoms in $R^{18}$ and $R^{19}$ include similar hydrocarbons to those mentioned above. Among them, methyl, ethyl, isopropyl and other $C_1$–$C_3$ alkyl groups are preferred. $R^{22}$ is a group combined with a carbon atom constituting an adamantane ring. When this group is a hydroxyl group or a carboxyl group, it is generally combined with the adamantane ring at a bridgehead position.

Monomer unit 2b has a highly hydrophilic group (hydroxyl group, carboxyl group or oxo group) combined with the adamantane ring and plays a role as adhesion-imparting unit which improves adhesion to substrates. Additionally, this unit has high etching resistance owing to its adamantane skeleton. In this connection, a monomer unit of Formula (VI) in which m is 1, a monomer unit of Formula (VI) in which $R^{22}$ is a —COOR group, and the monomer unit of Formula (II) each form a free carboxyl group by action of an acid and also have the function of being soluble in alkali. A monomer unit of Formula (VI) in which $R^{20}$ and $R^{21}$ are both hydrogen atoms and $R^{22}$ is a —COOR group, and a monomer unit of Formula (II) in which $R^5$ and $R^6$ are both hydrogen atoms have no adhesion function. However, these monomer units have the function of being soluble in alkali as mentioned above, and the combination use of these monomer units with a monomer unit of Formula (IV) in which at least one (preferably two or three) of $R^{12}$ to $R^{14}$ is a hydroxyl group allows the resulting polymeric compound to have the function of being soluble in alkali and adhesion function in balance.

A polymeric compound having both monomer unit 1b and monomer unit 2b, in which each of the two units has an adamantane skeleton, can yield high etching resistance and is very highly balanced in individual characteristics including alkali solubility, adhesion to substrates, plasma-etching resistance and transparency. In such a polymeric compound, the ratio of monomer unit 1b to monomer unit 2b is, for example, such that the former/the latter (by mole) is from about 1/99 to about 99/1, preferably from about 5/95 to about 80/20, and more preferably from about 15/85 to about 65/35.

The invented polymeric compound may further comprise at least one monomer unit (hereinafter may be referred to as "monomer unit 3") selected from among a monomer unit represented by Formula (VII) having an adamantane skeleton (having neither adhesion function nor the function of being soluble in alkali), a monomer unit represented by Formula (VIII) having a bridged alicyclic hydrocarbon skeleton other than adamantane, a monomer unit represented by Formula (IX) having a lactone skeleton, an acetal monomer unit represented by Formula (X), and a monomer unit represented by Formula (XI) having a carboxyl group, in addition to monomer unit 1, or monomer units 1 and 2.

A polymer composed of a constitutional unit having an adamantane skeleton alone is generally small in entanglement of molecules and tends to have a relatively brittle characteristic. However, this brittleness can be improved by incorporating any of the monomer units of Formulae (VIII) to (XI) into the polymer. Additionally, the monomer units of Formulae (VII) and (VIII) have high etching resistance, the monomer units of Formulae (IX) and (XI) have a adhesion-imparting function, the monomer unit of Formula (X) has the function of being soluble in alkali, and the balance of various characteristics required as a resist resin can be finely controlled according to its use by the aid of each of the aforementioned monomer units. In this connection, of the monomer units of Formula (IX), a monomer unit in which at least one of $R^{27}$ to $R^{31}$ is a methyl group (specifically, $R^{30}$ and $R^{31}$ are methyl groups) is typically preferred.

In such a polymeric compound containing monomer unit 3, the total content of monomer unit 3 occupies, for example, about 1% to 50% by mole, and preferably about 5% to 40% by mole of the total monomer units constituting the polymer.

Of the combinations of the individual monomer units in the invented polymeric compound, specifically preferred combinations are as follows:

(1) a combination of a monomer unit of Formula (I), and a monomer unit of Formula (V) in which $R^{17}$ is a hydroxyl group and $R^{15}$ is a hydrogen atom or a hydroxyl group;

(2) a combination of a monomer unit of Formula (I), and a monomer unit of Formula (V) in which $R^{17}$ is an oxo group and $R^{15}$ is a hydrogen atom or a hydroxyl group;

(3) a combination of a monomer unit of Formula (I), and a monomer unit of Formula (II) in which $R^5$ and $R^6$ are hydroxyl groups;

(4) a combination of a monomer unit of Formula (I) in which $R^2$ is a hydroxyl group, and a monomer unit of Formula (III) (e.g., a monomer unit in which at least one of $R^7$ to $R^9$ is a methyl group, specifically a monomer unit in which $R^8$ and $R^9$ are methyl groups);

(5) a combination of a monomer unit of Formula (I) in which $R^2$ is a hydroxyl group, and a monomer unit of Formula (IX) (e.g., a monomer unit in which at least one of $R^{27}$ to $R^{31}$ is a methyl group);

(6) a combination of a monomer unit of Formula (II) in which $R^5$ and $R^6$ are hydrogen atoms, and a monomer unit of Formula (V) in which $R^{17}$ is a hydroxyl group and $R^{15}$ is a hydrogen atom or a hydroxyl group;

(7) a combination of a monomer unit of Formula (II) in which $R^5$ and $R^6$ are hydrogen atoms, and a monomer unit of Formula (V) in which $R^{17}$ is an oxo group and $R^{15}$ is a hydrogen atom or a hydroxyl group;

(8) a combination of a monomer unit of Formula (II) in which $R^5$ and $R^6$ are hydrogen atoms, and a monomer unit of Formula (II) in which $R^5$ and $R^6$ are hydroxyl groups;

(9) a combination of a monomer unit of Formula (II) in which $R^5$ is a hydroxyl group and $R^6$ is a hydrogen atom, and a monomer unit of Formula (V);

(10) a combination of a monomer unit of Formula (II) in which $R^5$ is a hydroxyl group and $R^6$ is a hydrogen atom, and a monomer unit of Formula (II) in which $R^5$ and $R^6$ are hydroxyl groups;

(11) a combination of a monomer unit of Formula (II) in which $R^5$ is a hydroxyl group and $R^6$ is a hydrogen atom, and a monomer unit of Formula (III) (e.g., a monomer unit in which at least one of $R^7$ to $R^9$ is a methyl group, and specifically a monomer unit in which $R^8$ and $R^9$ are methyl groups);

(12) a combination of a monomer unit of Formula (II) in which $R^5$ is a hydroxyl group and $R^6$ is a hydrogen atom, and a monomer unit of Formula (IX) (e.g., a monomer unit in which at least one of $R^{27}$ to $R^{31}$ is a methyl group);

(13) a combination of a monomer unit of Formula (III), and a monomer unit of Formula (V) in which $R^{17}$ is a hydroxyl group and $R^{15}$ is a hydrogen atom or a hydroxyl group;

(14) a combination of a monomer unit of Formula (III), and a monomer unit of Formula (V) in which $R^{17}$ is an oxo group and $R^{15}$ is a hydrogen atom or a hydroxyl group;

(15) a combination of a monomer unit of Formula (III), and a monomer unit of Formula (II) in which $R^5$ and $R^6$ are hydroxyl groups;

(16) a combination of a monomer unit of Formula (I), a monomer unit of Formula (V), and a monomer unit of Formula (III);

(17) a combination of a monomer unit of Formula (I), a monomer unit of Formula (V), and a monomer unit of Formula (IX);

(18) a combination of a monomer unit of Formula (I), a monomer unit of Formula (V), and a monomer unit of Formula (X);

(19) a combination of a monomer unit of Formula (IV) in which the number of hydroxyl group combined with the adamantane ring is 0 or 1, and a monomer unit of Formula (IV) in which the number of hydroxyl group combined with the adamantane ring is 1 to 3, and specifically 2 or 3;

(20) a combination of a monomer unit of Formula (IV), and a monomer unit of Formula (VI) in which m=0;

(21) a combination of a monomer unit of Formula (IV), and a monomer unit of Formula (VI) in which m=1 and $R^{22}$ is a hydroxyl group;

(22) a combination of a monomer unit of Formula (IV) in which at least one of $R^{12}$ to $R^{14}$ is a hydroxyl group, and a monomer unit of Formula (VI) in which m=0 and $R^{22}$ is a —COOR group;

(23) a combination of a monomer unit of Formula (IV), and a monomer unit of Formula (II) in which at least one of $R^5$ and $R^6$ is a hydroxyl group (specifically, a monomer unit in which $R^5=R^6=OH$);

(24) a combination of a monomer unit of Formula (IV) in which at least one of $R^{12}$ to $R^{14}$ is a hydroxyl group, and a monomer unit of Formula (II);

(25) a combination of a monomer unit of Formula (IV), and a monomer unit of Formula (IX) (e.g., a monomer unit in which at least one of $R^{27}$ to $R^{31}$ is a methyl group);

(26) a combination of a monomer unit of Formula (IV), and a monomer unit of Formula (III) (e.g., a monomer unit in which at least one of $R^7$ to $R^9$ is a methyl group, specifically a monomer unit in which $R^8$ and $R^9$ are methyl groups);

(27) a combination of a monomer unit of Formula (IV), a monomer unit of Formula (VI) (specifically, a monomer unit in which m=0), and a monomer unit of Formula (IX);

(28) a combination of a monomer unit of Formula (IV), a monomer unit of Formula (VI) (specifically, a monomer unit in which m=0), and a monomer unit of Formula (III); and

(29) a combination of a monomer unit of Formula (IV), a monomer unit of Formula (VI) (specifically, a monomer unit in which m=0), and a monomer unit of Formula (X).

In the invented polymeric compound, the total content of monomer units each having an adamantane skeleton (Formulae (I), (II), (IV), (V), (VI) and (VII), specifically, Formulae (I), (II), (IV), (V) and (VI)) occupies, for example, about 50% to 100% by weight, and preferably about 70% to 100% by weight of the total monomer units constituting the polymer. Such polymeric compounds exhibit specifically satisfactory etching resistance.

In the present invention, the polymeric compound has a weight average molecular weight (Mw) of, for example, from about 5000 to about 50000, and preferably from about 7000 to about 20000, and a molecular weight distribution (Mw/Mn) of, for example, from about 1.8 to about 3.0. In this connection, the aforementioned Mn means a number average molecular weight (in terms of polystyrene).

Each of the monomer units represented by Formulae (I) to (XI) can be prepared by subjecting an individual corresponding (meth)acrylic ester as a (co-)monomer to polymerization. The polymerization operation can be performed by a conventional technique, such as solution polymerization or melt polymerization, for use in the production of an acrylic polymer.

[Monomer Unit of Formula (I)]

Monomers corresponding to the monomer units of Formula (I) are represented by the following Formula (1):

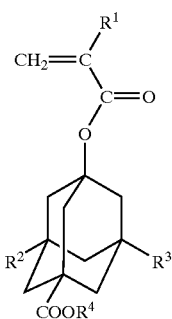

(wherein $R^1$, $R^2$, $R^3$ and $R^4$ have the same meanings as defined above),
of which typical examples are the following compounds:

[1-1] 1-t-butoxycarbonyl-3-(meth)acryloyloxyadamantane ($R^1$=H or $CH_3$, $R^2$=$R^3$=H, $R^4$=t-butyl group);

[1-2] 1,3-bis(t-butoxycarbonyl)-5-(meth)acryloyloxyadamantane [$R^1$=H or $CH_3$, $R^2$=t-butoxycarbonyl group, $R^3$=H, $R^4$=t-butyl group];

[1-3] 1-t-butoxycarbonyl-3-hydroxy-5-(meth)acryloyloxyadamantane ($R^1$=H or $CH_3$, $R^2$=OH, $R^3$=H, $R^4$=t-butyl group);

[1-4] 1-(2-tetrahydropyranyloxycarbonyl)-3-(meth)acryloyloxyadamantane ($R^1$=H or $CH_3$, $R^2$=$R^3$=H, $R^4$=2-tetrahydropyranyl group);

[1-5] 1,3-bis(2-tetrahydropyranyloxycarbonyl)-5-(meth)acryloyloxyadamantane ($R^1$=H or $CH_3$, $R^2$=2-tetrahydropyranyloxycarbonyl group, $R^3$=H, $R^4$=2-tetrahydropyranyl group); and

[1-6] 1-hydroxy-3-(2-tetrahydropyranyloxycarbonyl)-5-(meth)acryloyloxyadamantane ($R^1$=H or $CH_3$, $R^2$=OH, $R^3$=H, $R^4$=2-tetrahydropyranyl group).

The compounds represented by Formula (1) can be obtained, for example, pursuantly to the following reaction process chart:

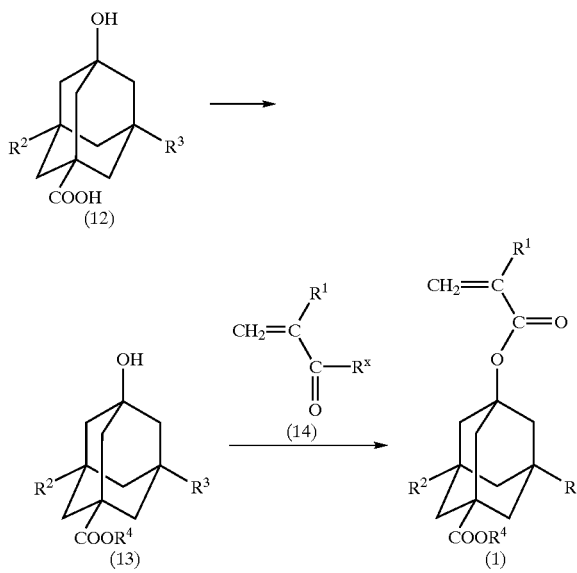

(wherein $R^x$ is a halogen atom, a hydroxyl group, an alkoxy group or an alkenyloxy group; and $R^1$, $R^2$, $R^3$ and $R^4$ have the same meanings as defined above).

In the reaction process chart, carboxyadamantanol derivative (12) can be converted (protection of a carboxyl group) into 1-adamantanol derivative (13) by a conventional process such as a process in which carboxyadamantanol derivative (12) is allowed to react with, for example, isobutylene, dihydrofuran or dihydropyran.

In this procedure, carboxyadamantanol derivative (12) for use as a raw material can be obtained by introducing a hydroxyl group and a carboxyl group on the adamantane ring of an adamantane compound. For example, a hydroxyl group can be introduced into the adamantane ring by a process in which the adamantane compound is brought into contact with oxygen in the presence of a N-hydroxyimide catalyst such as N-hydroxyphthalimide, and where necessary a metallic promoter (co-catalyst) such as a cobalt compound (e.g., cobalt acetate or acetylacetonatocobalt). In this process, the amount of the N-hydroxyimide catalyst is, for example, from about 0.0001 to about 1 mole, and preferably from about 0.001 to about 0.5 mole, relative to 1 mole of the adamantane compound. The amount of metallic promoter is, for example, from about 0.0001 to about 0.7 mole, and preferably from about 0.001 to about 0.5 mole, relative to 1 mole of the adamantane compound. Oxygen is often used in excess to the adamantane compound. A reaction is performed, for example, in a solvent at a temperature of from about 0° C. to about 200° C., and preferably from about 30° C. to about 150° C. at atmospheric pressure or under a pressure (under a load). Such solvents include, for example, acetic acid and other organic acids, acetonitrile and other nitrites, and dichloroethane and other halogenated hydrocarbons. A plurality of hydroxyl groups can be introduced into the adamantane ring by appropriately selecting reaction conditions.

Separately, a carboxyl group can be introduced into the adamantane ring of the adamantane compound by a process in which the adamantane compound is brought into contact with carbon monoxide and oxygen in the presence of the N-hydroxyimide catalyst, and where necessary, the metallic promoter. In the carboxylation reaction, the amount of the N-hydroxyimide catalyst is, for example, from about 0.0001 to about 1 mole, and preferably from about 0.001 to about 0.5 mole, relative to 1 mole of the adamantane compound. The amount of the metallic promoter is, for example, from about 0.0001 to 0.7 mole, and preferably from about 0.001 to about 0.5 mole, relative to 1 mole of the adamantane compound. The amounts of carbon monoxide and oxygen are, for example, 1 mole or more and 0.5 mole or more, respectively, relative to 1 mole of the adamantane compound. The ratio of carbon monoxide to oxygen is, for example, such that the former/the latter (by mole) is from about 1/99 to about 99/1, and preferably from about 50/50 to about 95/5. The carboxylation reaction is performed, for example, in a solvent at a temperature of from about 0° C. to about 200° C., and preferably from about 10° C. to about 150° C. at atmospheric pressure or under a pressure (under a load). Such solvents include, for example, acetic acid and other organic acids, acetonitrile and other nitriles, and dichloroethane and other halogenated hydrocarbons. A plurality of carboxyl groups can be introduced into the adamantane ring by appropriately selecting reaction conditions.

The reaction (esterification reaction) between 1-adamantanol derivative (13) and (meth)acrylic acid or its derivative (14) can be performed by a conventional process using an acid catalyst or a transesterification catalyst. A compound represented by Formula (1) can be efficiently obtained under mild conditions by subjecting 1-adamantanol derivative (13) to a reaction (a transesterification reaction)

with an alkenyl (meth)acrylate such as vinyl (meth)acrylate or 2-propenyl (meth)acrylate in the presence of a catalyst of the compound of Group 3 element of the Periodic Table of Elements (e.g., samarium acetate, samarium trifluoromethanesulfonate, samarium complexes, and other samarium compounds). In this case, the amount of the alkenyl (meth) acrylate is, for example, from about 0.8 to about 5 moles and preferably from about 1 to about 1.5 moles, relative to 1 mole of 1-adamantanol derivative (13). The amount of the catalyst of the compound of Group 3 elements of the Periodic Table of Elements is, for example, from about 0.001 to about 1 mole and preferably from about 0.01 to about 0.25 mole, relative to 1 mole of 1-adamantanol derivative (13). This reaction is performed in a solvent inert toward the reaction at a temperature of, for example, from about 0° C. to about 150° C. and preferably from about 25° C. to about 120° C.

[Monomer Unit of Formula (II)]

Monomers corresponding to the monomer units of Formula (II) are represented by the following Formula (2):

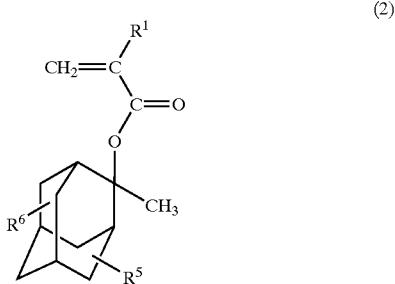

(wherein $R^1$, $R^5$ and $R^6$ have the same meanings as defined above), of which typical examples are the following compounds:

[2-1] 2-(meth)acryloyloxy-2-methyladamantane ($R^1$=H or $CH_3$, $R^5$=$R^6$=H);

[2-2] 1-hydroxy-2-(meth)acryloyloxy-2-methyladamantane ($R^1$=H or $CH_3$, $R^5$=1-OH, $R^6$=H);

[2-3] 5-hydroxy-2-(meth)acryloyloxy-2-methyladamantane ($R^1$=H or $CH_3$, $R^5$=5-OH, $R^6$=H);

[2-4] 1,3-dihydroxy-2-(meth)acryloyloxy-2-methyladamantane ($R^1$=H or $CH_3$, $R^5$=1-OH, $R^6$=3-OH);

[2-5] 1,5-dihydroxy-2-(meth)acryloyloxy-2-methyladamantane ($R^1$=H or $CH_3$, $R^5$=1-OH, $R^6$=5-OH); and

[2-6] 1,3-dihydroxy-6-(meth)acryloyloxy-6-methyladamantane ($R^1$=H or $CH_3$, $R^5$=1-OH, $R^6$=3-OH).

The compounds represented by Formula (2) can be obtained, for example, pursuantly to the following reaction process chart:

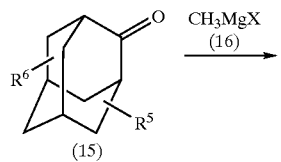

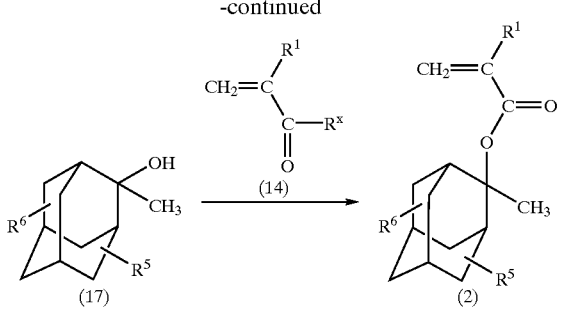

(wherein X is a halogen atom; and $R^1$, $R^5$, $R^6$ and $R^x$ have the same meanings as defined above).

In this reaction process chart, a reaction between adamantanone derivative (15) and Grignard reagent (16) can be performed pursuantly to a conventional Grignard reaction. The amount of Grignard reagent (16) is, forexample, from about 0.7 to about 3 moles and preferably from about 0.9 to about 1.5 moles, relative to 1 mole of adamantanone derivative (15). When adamantanone derivative (15) has hydroxyl group(s) on the adamantane ring, the amount of the Grignard reagent is increased depending on the number thereof. The reaction is performed in a solvent inert toward the reaction, such as diethyl ether, tetrahydrofuran, and other ethers. A reaction temperature is, for example, from about 0° C. to about 150° C. and preferably from about 20° C. to about 100° C.

Thus obtained 2-adamantanol derivative (17) is subjected to a reaction (an esterification reaction) with (meth)acrylic acid or its derivative (14) to thereby yield a compound represented by Formula (2). The esterification reaction can be performed pursuantly to the reaction between the compound of Formula (13) and (meth) acrylic acid or its derivative (14).

Of adamantanone derivatives (15) for use as a raw material in the above process, a compound having a hydroxyl group on the adamantane ring can be produced by a process, in which 2-adamantanone is brought into contact with oxygen in the presence of a N-hydroxyimide catalyst such as N-hydroxyphthalimide, and where necessary, a metallic promoter such as a cobalt compound, a manganese compound or a vanadium compound to thereby introduce a hydroxyl group into the adamantane ring. In this process, the amount of the N-hydroxyimide catalyst is, for example, from about 0.0001 to about 1 mole and preferably from about 0.001 to about 0.5 mole, relative to 1 mole of the 2-adamantanone. The amount of the metallic promoter is, for example, from about 0.0001 to about 0.7 mole and preferably from about 0.001 to about 0.5 mole, relative to 1 mole of the 2-adamantanone. Oxygen is often used in excess to the 2-adamantanone. The reaction is performed in a solvent at a temperature of from about 0° C. to about 200° C. and preferably from about 30° C. to about 150° C. at atmospheric pressure or under a pressure (under a load). Such solvents include, for example, acetic acid and other organic acids, acetonitrile and other nitrites, and dichloroethane and other halogenated hydrocarbons.

Of adamantanone derivatives (15), a compound having a hydroxyl group on the adamantane ring can also be produced by allowing an adamantane to react with oxygen in the presence of the N-hydroxyimide catalyst and a strong acid (e.g., a hydrogen halide or sulfuric acid), and where necessary, the metallic promoter. The amount of the strong acid is, for example, from about 0.00001 to about 1 mole and preferably from about 0.0005 to about 0.7 mole, relative to 1 mole of the adamantane. The other reaction conditions are similar to those in the reaction for the introduction of hydroxyl group.

[Monomer Unit of Formula (III)]

Monomers corresponding to the monomer units of Formula (III) are represented by the following Formula (3):

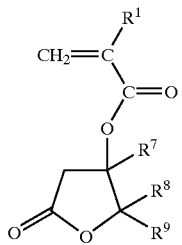

(3)

(wherein $R^1$, $R^7$, $R^8$ and $R^9$ have the same meanings as defined above), of which typical examples are the following compounds:

[3-1] 3-(meth)acryloyloxy-γ-butyrolactone ($R^1$=H or $CH_3$, $R^7$=$R^8$=$R^9$=H);

[3-2] 3-(meth)acryloyloxy-3-methyl-γ-butyrolactone ($R^1$=H or $CH_3$, $R^7$=$CH_3$, $R^8$=$R^9$=H);

[3-3] 3-(meth)acryloyloxy-4-methyl-γ-butyrolactone ($R^1$=H or $CH_3$, $R^7$=$R^9$=H, $R^8$=$CH_3$);

[3-4] 3-(meth)acryloyloxy-3,4-dimethyl-γ-butyrolactone ($R^1$=H or $CH_3$, $R^7$=$R^8$=$CH_3$, $R^9$=H);

[3-5] 3-(meth)acryloyloxy-4,4-dimethyl-γ-butyrolactone ($R^1$=H or $CH_3$, $R^7$=H, $R^8$=$R^9$=$CH_3$); and

[3-6] 3-(meth)acryloyloxy-3,4,4-trimethyl-γ-butyrolactone ($R^1$=H or $CH_3$, $R^7$=$R^8$=$R^9$=$CH_3$).

The compounds represented by Formula (3) can be obtained, for example, pursuantly to the following reaction process chart:

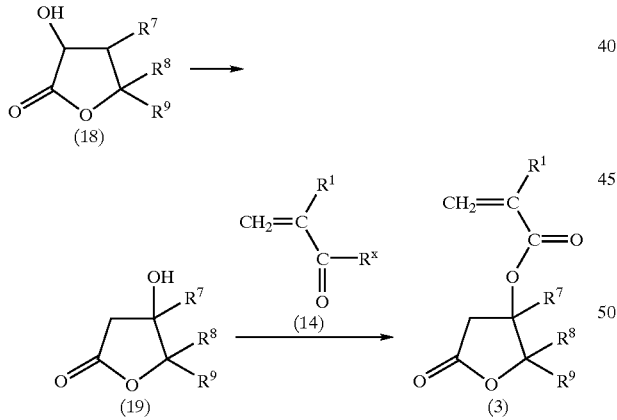

(wherein $R^1$, $R^7$, $R^8$, $R^9$ and $R^x$ have the same meanings as defined above).

In the above reaction process chart, conversion (isomerization) of an α-hydroxy-γ-butyrolactone represented by Formula (18) into a β-hydroxy-γ-butyrolactone represented by Formula (19) can be performed by dissolving the compound of Formula (18) in water or a solvent, where necessary, with small amounts of an acid such as sulfuric acid or hydrochloric acid. The solvent is not specifically limited, and includes, for example, acetonitrile, acetic acid or ethyl acetate. A reaction temperature is, for example, from about 0° C. to about 150° C. and preferably from about 20° C. to about 100° C. α-Hydroxy-γ-butyrolactone (18) for use as a raw material can be produced in the same manner as a compound represented by Formula (32) mentioned below. The compound of Formula (19) can also be obtained by subjecting the compound of Formula (18) to a reaction (a dehydration reaction) with phosphorus pentoxide to yield a corresponding α,β-unsaturated-γ-butyrolactone, allowing this compound to react with a peracid such as hydrogen peroxide or m-chloroperbenzoic acid to epoxidize a double bond, and hydrogenating the same in the presence of a catalyst such as Pd—C. Alternatively, the compound of Formula (19) can also be produced by a conventional process for the preparation of a β-hydroxy-γ-butyrolactone.

A reaction between β-hydroxy-γ-butyrolactone (19) and the (meth)acrylic acid or its derivative represented by Formula (14) can be performed pursuantly to the reaction between the compound of Formula (13) and (meth)acrylic acid or its derivative (14).

[Monomer Unit of Formula (IV)]

Monomers corresponding to the monomer units of Formula (IV) are represented by the following Formula (4):

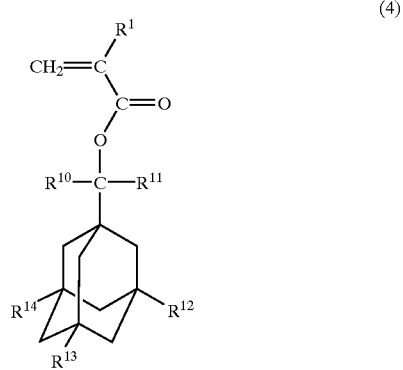

(4)

(wherein $R^1$, $R^{10}$, $R^{11}$, $R^{12}$, $R^{13}$ and $R^{14}$ have the same meanings as defined above), of which typical examples are the following compounds:

[4-1] 1-(1-ethyl-1-(meth)acryloyloxypropyl)adamantane ($R^1$=H or $CH_3$, $R^{10}$=$R^{11}$=ethyl group, $R^{12}$=$R^{13}$=$R^{14}$=H);

[4-2] 1-(1-ethyl-1-(meth)acryloyloxypropyl)-3-hydroxyadamantane ($R^1$=H or $CH_3$, $R^{10}$=$R^{11}$=ethyl group, $R^{12}$=OH $R^{13}$=$R^{14}$=H);

[4-3] 1-(1-(meth)acryloyloxy-1-methylpropyl)adamantane ($R^1$=H or $CH_3$, $R^{10}$=$CH_3$, $R^{11}$=ethyl group, $R^{12}$=$R^{13}$=$R^{14}$=H);

[4-4] 1(1-(meth)acryloyloxy-1-methylpropyl)-3-hydroxyadamantane ($R^1$=H or $CH_3$, $R^{10}$=$CH_3$, $R^{11}$=ethyl group, $R^{12}$=OH, $R^{13}$=$R^{14}$=H);

[4-5] 1-(1-(meth)acryloyloxy-1,2-dimethylpropyl)adamantane ($R^1$=H or $CH_3$, $R^{10}$=$CH_3$, $R^{11}$=isopropyl group, $R^{12}$=$R^{13}$=$R^{14}$=H);

[4-6] 1-(1-(meth)acryloyloxy-1,2-dimethylpropyl)-3-hydroxyadamantane ($R^1$=H or $CH_3$, $R^{10}$=$CH_3$, $R^{11}$=isopropyl group, $R^{12}$=OH, $R^{13}$=$R^{14}$=H);

[4-7] 1-(1-ethyl-1-(meth)acryloyloxypropyl)-3,5-dihydroxyadamantane ($R^1$=H or $CH_3$, $R^{10}$=$R^{11}$=ethyl group, $R^{12}$=$R^{13}$=OH, $R^{14}$=H);

[4-8] 1,3-dihydroxy-5-(1-(meth)acryloyloxy-1-methylpropyl)adamantane ($R^1$=H or $CH_3$, $R^{10}$=$CH_3$, $R^{11}$=ethyl group, $R^2$=$R^{13}$=OH, $R^4$=H); and

[4-9] 1,3-dihydroxy-5-(1-(meth)acryloyloxy-1,2-dimethylpropyl)adamantane ($R^1$=H or $CH_3$, $R^{10}$=$CH_3$, $R^{11}$=isopropyl group, $R^{12}$=$R^{13}$=OH, $R^{14}$=H).

The compounds represented by Formula (4) can be obtained, for example, pursuant to the following reaction process chart:

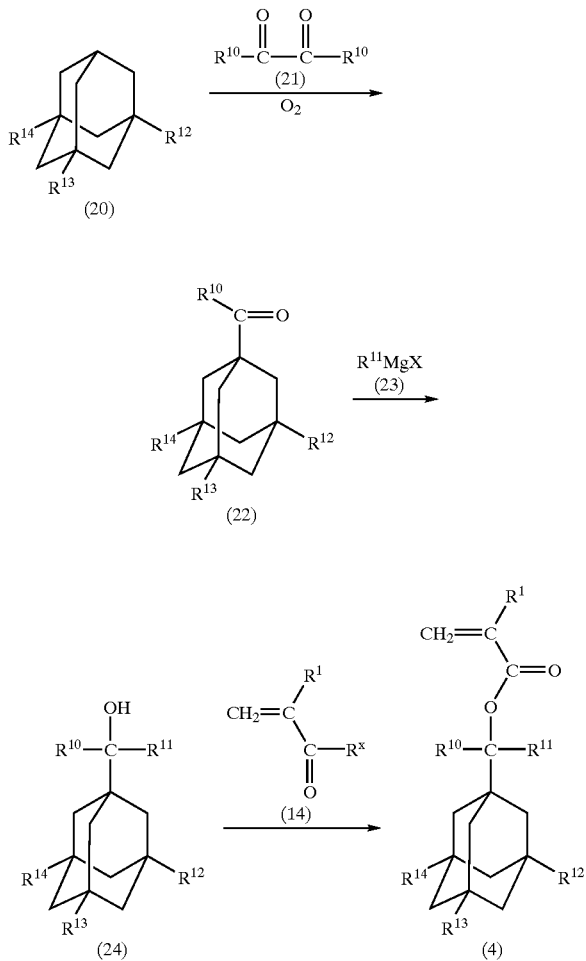

(wherein X, $R^1$, $R^{10}$, $R^{11}$, $R^{12}$, $R^{13}$, $R^{14}$ and $R^x$ have the same meanings as defined above).

Of adamantane derivatives (20) for use as a raw material in this reaction process chart, a compound in which any of $R^{12}$ to $R^{14}$ is a hydroxyl group can be obtained by introducing a hydroxyl group into an adamantane ring. For example, a hydroxyl group can be introduced into the adamantane ring by a process in which an adamantane compound is brought into contact with oxygen in the presence of a N-hydroxyimide catalyst such as N-hydroxyphthalimide and, where necessary, a metallic promoter (co-catalyst) such as a cobalt compound (e.g., cobalt acetate or acetylacetonatocobalt). In this process, the amount of the N-hydroxyimide catalyst is, for example, from about 0.0001 to about 1 mole and preferably from about 0.001 to about 0.5 mole, relative to 1 mole of the adamantane compound. The amount of the metallic promoter is, for example, from about 0.0001 to about 0.7 mole and preferably from about 0.001 to about 0.5 mole, relative to 1 mole of the adamantane compound. Oxygen is often used in excess to the adamantane compound. A reaction is performed, for example, in a solvent at a temperature of from about 0° C. to about 200° C., and preferably from about 30° C. to about 150° C. at atmospheric pressure or under a pressure (under a load). Such solvents include, for example, acetic acid and other organic acids, acetonitrile and other nitrites, and dichloroethane and other halogenated hydrocarbons. A plurality of hydroxyl groups can be introduced into the adamantane ring by appropriately selecting reaction conditions.

A reaction of adamantane derivative (20) with 1,2-dicarbonyl compound (e.g., biacetyl) (21) and oxygen can be performed in the presence of a metallic compound such as a cobalt compound (e.g., cobalt acetate or acetylacetonatocobalt) and/or a N-hydroxyimide catalyst such as N-hydroxyphthalimide. The amount of 1,2-dicarbonyl compound (21) is 1 mole or more (e.g., from about 1 to about 50 moles), preferably from about 1.5 to about 20 moles and more preferably from about 3 to about 10 moles, relative to 1 mole of adamantane derivative (20). The amount of the metallic compound is, for example, from about 0.0001 to about 0.1 mole, relative to 1 mole of adamantane derivative (20). The amount of the N-hydroxyimide catalyst is, for example, from about 0.001 to about 0.7 mole, relative to 1 mole of adamantane derivative (20). Oxygen is often used in excess to adamantane derivative (20). The reaction is generally performed in an organic solvent. Such organic solvents include, but are not limited to, acetic acid and other organic acids, benzonitrile and other nitrites, and trifluoromethylbenzene and other halogenated hydrocarbons. The reaction is performed at a temperature of, for example, from about 30° C. to about 250° C. and preferably from about 40° C. to about 200° C. at atmospheric pressure or under a pressure (under a load).

A reaction between acyladamantane derivative (22) thus obtained and Grignard reagent (23) can be performed pursuantly to a conventional Grignard reaction. The amount of Grignard reagent (23) is, for example, from about 0.7 to about 3 moles and preferably from about 0.9 to about 1.5 moles, relative to 1 mole of acyladamantane derivative (22). When acyladamantane derivative (22) has hydroxyl group(s) on the adamantane ring, the amount of the Grignard reagent is increased depending on the number thereof. The reaction is performed in, for example, an ether such as diethyl ether or tetrahydrofuran. A reaction temperature is, for example, from about 0° C. to about 150° C. and preferably from about 20° C. to about 100° C.

A reaction (an esterification reaction) between adamantanemethanol derivative (24) formed by the above reaction and (meth) acrylic acid or its derivative (14) can be performed pursuantly to the reaction between the compound of Formula (13) and (meth)acrylic acid or its derivative (14).

Of the compounds represented by Formula (4), a compound in which $R^{10}$ and $R^{11}$ are the same groups can be obtained, for example, pursuantly to the following reaction process chart:

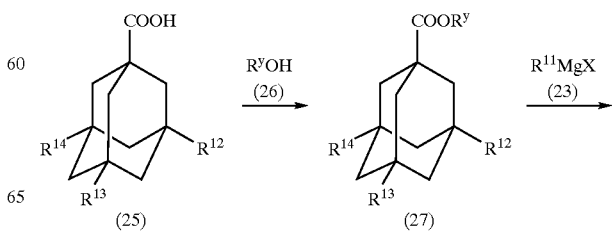

-continued

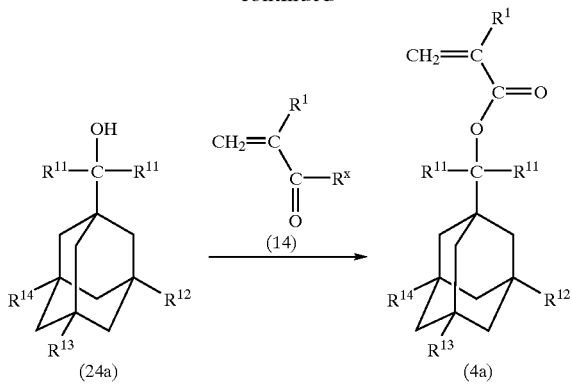

(wherein $R^y$ is a hydrocarbon group; and X, $R^1$, $R^{11}$, $R^{12}$, $R^{13}$, $R^{14}$ and $R^x$ have the same meanings as defined above).

The hydrocarbon group in $R^y$ includes, but is not limited to, methyl, ethyl, propyl, isopropyl and other $C_1$–$C_6$ aliphatic hydrocarbon groups; and phenyl group.

Adamantanecarboxylic acid derivative (25) for use as a raw material in the above reaction process chart can be produced by introducing a carboxyl group into the adamantane ring of an adamantane compound. For example, a carboxyl group can be introduced into the adamantane ring of the adamantane compound by a process in which the adamantane compound is brought into contact with carbon monoxide and oxygen in the presence of a N-hydroxyimide catalyst such as N-hydroxyphthalimide and, where necessary, a metallic promoter (co-catalyst) such as a cobalt compound (e.g., cobalt acetate or acetylacetonatocobalt). In the carboxylation reaction, the amount of the N-hydroxyimide catalyst is, for example, from about 0.0001 to about 1 mole, and preferably from about 0.001 to about 0.5 mole, relative to 1 mole of the adamantane compound. The amount of the metallic promoter is, for example, from about 0.0001 to about 0.7 mole, and preferably from about 0.001 to about 0.5 mole, relative to 1 mole of the adamantane compound. The amounts of carbon monoxide and oxygen are, for example, 1 mole or more and 0.5 mole or more, respectively, relative to 1 mole of the adamantane compound. The ratio of carbon monoxide to oxygen is, for example, such that the former/the latter (by mole) is from about 1/99 to about 99/1, and preferably from about 50/50 to about 95/5. The carboxylation reaction is performed, for example, in a solvent at a temperature of from about 0° C. to about 200° C., and preferably from about 10° C. to about 150° C. at atmospheric pressure or under a pressure (under a load). Such solvents include, for example, acetic acid and other organic acids, acetonitrile and other nitriles, and dichloroethane and other halogenated hydrocarbons. In this connection, a plurality of carboxyl groups can be introduced into the adamantane ring by appropriately selecting reaction conditions.

A reaction between adamantanecarboxylic acid derivative (25) and hydroxy compound (26) can be performed, for example, pursuantly to a conventional esterification process using an acid catalyst.

A reaction between an adamantanecarboxylic ester represented by Formula (27) and Grignard reagent (23) is generally performed in a solvent inert toward the reaction, such as diethyl ether, tetrahydrofuran and other ethers. A reaction temperature is, for example, from about 0° C. to about 100° C. and preferably from about 10° C. to about 40° C. The amount of Grignard reagent (23) is, for example, about 2 to 4 equivalents relative to adamantanecarboxylic ester (27).

A reaction (an esterification reaction) between adamantanemethanol derivative (24a) and (meth)acrylic acid or its derivative (14) can be performed pursuantly to the reaction between the compound represented by Formula (13) and (meth)acrylic acid or its derivative (14). Thus, of the compounds represented by Formula (4), a compound in which $R^{10}$ and $R^{11}$ are the same hydrocarbon group (e.g., $R^{11}$=$R^{11}$=ethyl group) can be easily prepared.

[Monomer Unit of Formula (V)]

Monomers corresponding to the monomer units of Formula (V) are represented by the following Formula (5):

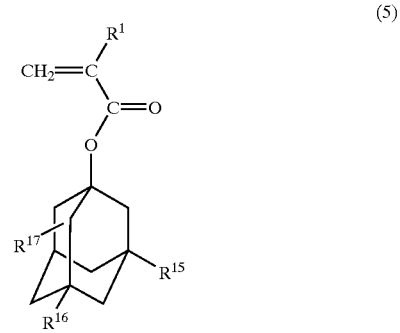

(5)

(wherein $R^1$, $R^{15}$, $R^{16}$ and $R^{17}$ have the same meanings as defined above), of which typical examples include the following compounds: [5-1] 1-hydroxy-3-(meth)acryloyloxyadamantane ($R^1$=H or $CH_3$, $R^{17}$=OH, $R^{15}$=$R^{16}$=H);

[5-2] 1,3-dihydroxy-5-(meth)acryloyloxyadamantane ($R^1$=H or $CH_3$, $R^{17}$=$R^{15}$=OH, $R^{16}$=H);

[5-3] 1-carboxy-3-(meth)acryloyloxyadamantane ($R^1$=H or $CH_3$, $R^{17}$=COOH, $R^{15}$=$R^{16}$=H);

[5-4] 1,3-dicarboxy-5-(meth)acryloyloxyadamantane ($R^1$=H or $CH_3$, $R^{17}$=$R^{15}$=COOH, $R^{16}$=H);

[5-5] 1-carboxy-3-hydroxy-5-(meth)acryloyloxyadamantane ($R^1$=H or $CH_3$, $R^{17}$=OH, $R^{15}$=COOH, $R^{16}$=H);

[5-6] 1-(meth)acryloyloxy-4-oxoadamantane ($R^1$=H or $CH_3$, $R^{17}$=4-oxo group, $R^{15}$=$R^{16}$=H);

[5-7] 3-hydroxy-1-(meth)acryloyloxy-4-oxoadamantane ($R^1$=H or $CH_3$, $R^{17}$=4-oxo group, $R^{15}$=3-OH, $R^{16}$=H); and

[5-8] 7-hydroxy-1-(meth)acryloyloxy-4-oxoadamantane ($R^1$=H or $CH_3$, $R^{17}$=4-oxo group, $R^{15}$=7-OH, $R^{16}$=H).

The compounds represented by Formula (5) can be obtained, for example, pursuantly to the following reaction process chart:

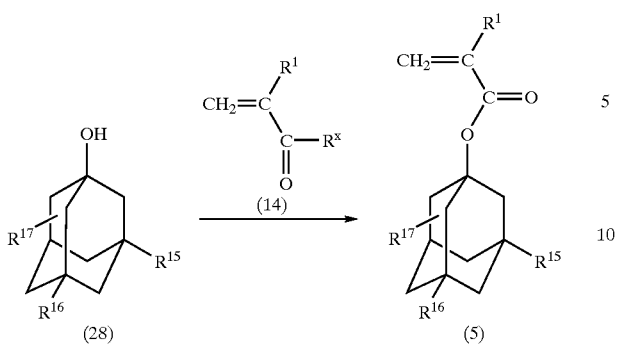

(wherein $R^1$, $R^{15}$, $R^{16}$, $R^{17}$ and $R^x$ have the same meanings as defined above).

In this reaction process chart, a reaction between 1-adamantanol derivative (28) and (meth)acrylic acid or its derivative (14) is performed pursuantly to the reaction between 1-adamantanol derivative (13) and (meth)acrylic acid or its derivative (14). By introducing a hydroxyl group or a carboxyl group into the adamantane ring of an adamantane compound, 1-adamantanol derivative (28) for use as a raw material can be obtained. The introduction of a hydroxyl group and carboxyl group into the adamantane ring can be performed in the same manner as above.

[Monomer Unit of Formula (VI)]

Monomers corresponding to the monomer units of Formula (VI) are represented by the following Formula (6):

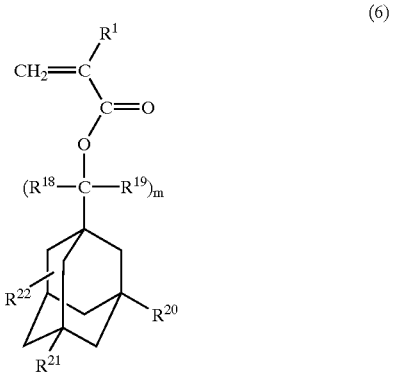

(wherein $R^1$, $R^{18}$, $R^{19}$, $R^{20}$, $R^{21}$, $R^{22}$ and m have the same meanings as defined above), of which typical examples are the following compounds. In this connection, part of compounds represented by Formula (6) in which m=0 overlaps the compounds represented by Formula (5).

[6-1] 1-hydroxy-3-(meth)acryloyloxyadamantane (m=0, $R^1$=H or $CH_3$, $R^{20}$=$R^{21}$=H, $R^{22}$=OH);

[6-2] 1,3-dihydroxy-5-(meth)acryloyloxyadamantane (m=0, $R^1$=H or $CH_3$, $R^{20}$=$R^{22}$=OH, $R^{21}$=H);

[6-3] 1-carboxy-3-(meth)acryloyloxyadamantane (m=0, $R^1$=H or $CH_3$, $R^{20}$=$R^{21}$=H, $R^{22}$=COOH);

[6-4] 1,3-dicarboxy-5-(meth)acryloyloxyadamantane (m=0, $R^1$=H or $CH_3$, $R^{20}$=$R^{22}$=COOH, $R^{21}$=H);

[6-5] 1-carboxy-3-hydroxy-5-(meth)acryloyloxyadamantane (m=0, $R^1$=H or $CH_3$, $R^{20}$=COOH, $R^{21}$=H, $R^{22}$=OH);

[6-6] 1-(meth)acryloyloxy-4-oxoadamantane (m=0, $R^1$=H or $CH_3$, $R^{20}$=$R^{21}$=H, $R^{22}$=4-oxo group);

[6-7] 3-hydroxy-1-(meth)acryloyloxy-4-oxoadamantane (m=0, $R^1$=H or $CH_3$, $R^{20}$=3-OH, $R^{21}$=H, $R^{22}$=4-oxo group);

[6-8] 7-hydroxy-1-(meth)acryloyloxy-4-oxoadamantane (m=0, $R^1$=H or $CH_3$, $R^{20}$=7-OH, $R^{21}$=H, $R^{22}$=4-oxo group)

[6-9] 1,3-dihydroxy-5-(1-(meth)acryloyloxy-1-methylethyl)adamantane (m=1, $R^1$=H or $CH_3$, $R^{18}$=$R^{19}$=$CH_3$, $R^{20}$=$R^{22}$=OH, $R^{21}$=H);

[6-10] 1-t-butoxycarbonyl-3-(meth)acryloyloxyadamantane (m=0, $R^1$=H or $CH_3$, $R^{20}$=$R^{21}$=H, $R^{22}$=t-butoxycarbonyl group);

[6-11] 1,3-bis(t-butoxycarbonyl)-5-(meth)acryloyloxyadamantane [m=0, $R^1$=H or $CH_3$, $R^{20}$=$R^{22}$=t-butoxycarbonyl group, $R^{21}$=H);

[6-12] 1-t-butoxycarbonyl-3-hydroxy-5-(meth)acryloyloxyadamantane (m=0, $R^1$=H or $CH_3$, $R^{20}$=OH, $R^{21}$=H, $R^{22}$=t-butoxycarbonyl group);

[6-13] 1-(2-tetrahydropyranyloxycarbonyl)-3-(meth)acryloyloxyadamantane (m=0, $R^1$=H or $CH_3$, $R^{20}$=$R^{21}$=H, $R^{22}$=2-tetrahydropyranyloxycarbonyl group);

[6-14] 1,3-bis(2-tetrahydropyranyloxycarbonyl)-5-(meth)acryloyloxyadamantane (m=0, $R^1$=H or $CH_3$, $R^{20}$=$R^{22}$=2-tetrahydropyranyloxycarbonyl group, $R^{21}$=H); and

[6-15] 1-hydroxy-3-(2-tetrahydropyranyloxycarbonyl)-5-(meth)acryloyloxyadamantane (m=0, $R^1$=H or $CH_3$, $R^{20}$=OH, $R^{21}$=H, $R^{22}$=2-tetrahydropyranyloxycarbonyl group).

The compound represented by Formula (6) can be obtained, for example, pursuantly to the following reaction process chart:

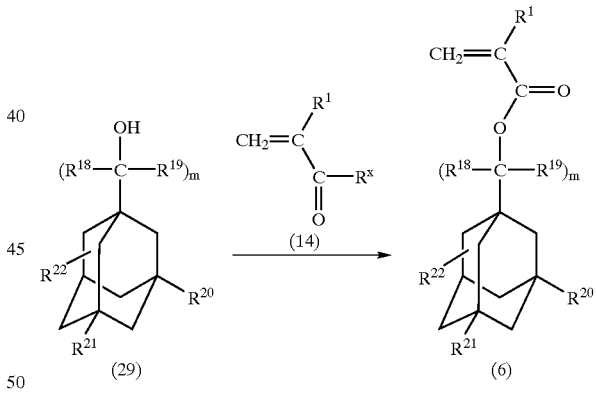

(wherein $R^1$, $R^{18}$, $R^{19}$, $R^{20}$, $R^{21}$, $R^{22}$, $R^x$ and m have the same meanings as defined above).

Of the compounds represented by Formula (29) for use as a raw material in the reaction process chart, a compound in which m=1 can be prepared in the same manner as compound (24) or (24a). Separately, of the compounds represented by Formula (29) for use as a raw material, a compound in which m=0 can be obtained by introducing a hydroxyl group or a carboxyl group into the adamantane ring of an adamantane compound. As the introduction process of hydroxyl group or carboxyl group into the adamantane ring, the aforementioned process can be employed. Of the compounds represented by Formula (29), a compound in which $R^{22}$ is a —COOR group can be produced by subjecting a corresponding carboxylic acid and an alcohol ROH to a conventional esterification reaction.

A reaction (an esterification reaction) between compound (29) and (meth)acrylic acid or its derivative (14) can be performed pursuantly to the reaction between the compound represented by Formula (13) and (meth)acrylic acid or its derivative (14).

[Monomer Unit of Formula (VII)]

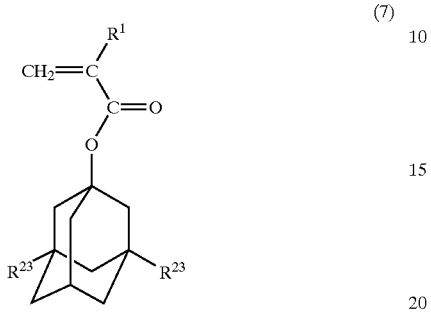
(7)

(wherein $R^1$ and $R^{23}$ have the same meanings as defined above), of which specific examples are the following compounds.

These compounds can be prepared by a conventional or known technique.

[7-1] 1-(meth)acryloyloxyadamantane ($R^1$=H or $CH_3$, $R^{23}$=H); and

[7-2] 1- (meth)acryloyloxy-3,5-dimethyladamantane ($R^1$=H or $CH_3$, $R^{23}$=$CH_3$).

[Monomer Unit of Formula (VIII)]

Monomers constituting the monomer units of Formula (VIII) are represented by the following Formula (8):

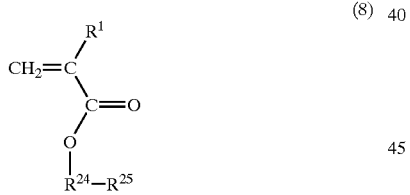
(8)

(wherein $R^1$, $R^{24}$ and $R^{25}$ have the same meanings as defined above), of which typical examples include the following compounds.

These compounds can be obtained by a known or conventional process such as a process in which a corresponding alcohol (HO—$R^{24}$—$R^{25}$) and (meth)acrylic acid or its derivative (14) are subjected to an esterification reaction.

[8-1] 8-hydroxymethyl-4-(meth)acryloyloxymethyltricyclo[5.2.1.0$^{2,6}$]decane;

[8-2] 4-hydroxymethyl-8-(meth)acryloyloxymethyltricyclo[5.2.1.0$^{2,6}$]decane;

[8-3] 4-(meth)acryloyloxymethyltetracyclo[4.4.0.1$^{2,5}$.1$^{7,10}$]dodecane;

[8-4] 2-(meth)acryloyloxynorbornane;

[8-5] 2-(meth)acryloyloxyisobornane; and

[8-6] 2-(meth)acryloyloxymethylnorbornane.

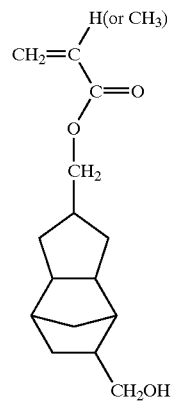
[8-1]

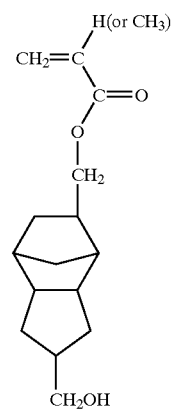
[8-2]

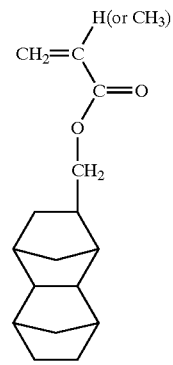
[8-3]

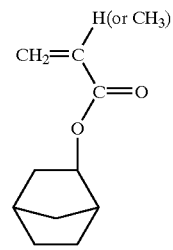
[8-4]

-continued

[8-5]
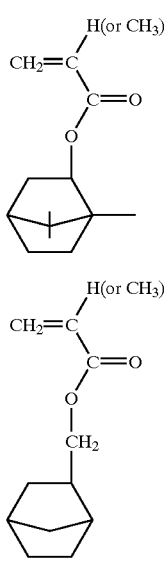

[8-6]
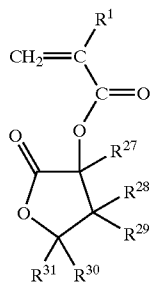

[Monomer Unit of Formula (IX)]

Monomers constituting the monomer units of Formula (IX) are represented by the following Formula (9):

(9)

(wherein $R^1$, $R^{27}$, $R^{28}$, $R^{29}$, $R^{30}$ and $R^{31}$ have the same meanings as defined above), of which typical examples include the following compounds:

[9-1] 2-(meth)acryloyloxy-γ-butyrolactone ($R^1$=H or $CH_3$, $R^{27}$=$R^{28}$=$R^{29}$=$R^{30}$=$R^{31}$=H);

[9-2] 2-(meth)acryloyloxy-2-methyl-γ-butyrolactone ($R^1$=H or $CH_3$, $R^{27}$=$CH_3$, $R^{28}$=$R^{29}$=$R^{30}$=$R^{31}$=H);

[9-3] 2-(meth)acryloyloxy-4,4-dimethyl-γ-butyrolactone ($R^1$=H or $CH_3$, $R^{27}$=$R^{28}$=$R^{29}$=H, $R^{30}$=$R^{31}$=$CH_3$);

[9-4] 2-(meth)acryloyloxy-2,4,4-trimethyl-γ-butyrolactone ($R^1$=H or $CH_3$, $R^{27}$=$R^{30}$=$R^{31}$=$CH_3$, $R^{28}$=$R^{29}$=H);

[9-5] 2-(meth)acryloyloxy-3,4,4-trimethyl-γ-butyrolactone ($R^1$=H or $CH_3$, $R^{27}$=$R^{29}$=H, $R^{28}$=$R^{30}$=$R^{31}$=$CH_3$);

[9-6] 2-(meth)acryloyloxy-2,3,4,4-tetramethyl-γ-butyrolactone ($R^1$=H or $CH_3$, $R^{27}$=$R^{28}$=$R^{30}$=$R^{31}$=$CH_3$, $R^{29}$=H);

[9-7] 2-(meth)acryloyloxy-3,3,4-trimethyl-γ-butyrolactone ($R^1$=H or $CH_3$, $R^{27}$=$R^{31}$=H, $R^{28}$=$R^{29}$=$R^{30}$=$CH_3$);

[9-8] 2-(meth)acryloyloxy-2,3,3,4-tetramethyl-γ-butyrolactone ($R^1$=H or $CH_3$, $R^{27}$=$R^{28}$=$R^{29}$=$R^{30}$=$CH_3$, $R^{31}$=H);

[9-9] 2-(meth)acryloyloxy-3,3,4,4-tetramethyl-γ-butyrolactone ($R^1$=H or $CH_3$, $R^{27}$=H, $R^{28}$=$R^{29}$=$R^{30}$=$R^{31}$=$CH_3$); and

[9-10] 2-(meth)acryloyloxy-2,3,3,4,4-pentamethyl-γ-butyrolactone ($R^1$=H or $CH_3$, $R^{27}$=$R^{28}$=$R^{29}$=$R^{30}$=$R^{31}$=$CH_3$).

The compounds represented by Formula (9) can be obtained, for example, pursuantly to the following reaction process chart:

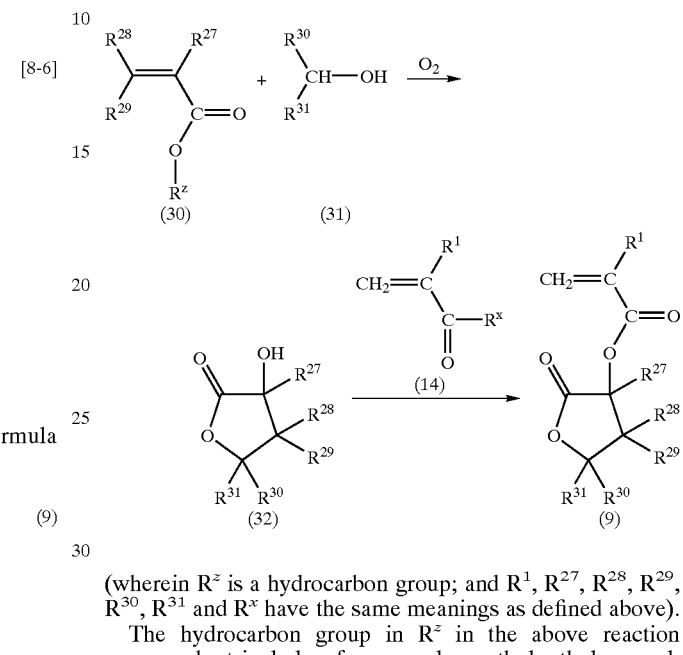

(wherein $R^z$ is a hydrocarbon group; and $R^1$, $R^{27}$, $R^{28}$, $R^{29}$, $R^{30}$, $R^{31}$ and $R^x$ have the same meanings as defined above).

The hydrocarbon group in $R^z$ in the above reaction process chart includes, for example, methyl, ethyl, propyl, s-butyl, t-butyl, vinyl, allyl and other aliphatic hydrocarbon groups (alkyl groups, alkenyl groups or alkynyl groups) each having from about 1 to about 6 carbon atoms; phenyl group, naphthyl group and other aromatic hydrocarbon groups; and cycloalkyl groups and other alicyclic hydrocarbon groups.

A reaction of α,β-unsaturated carboxylic ester (30) with alcohol (31) and oxygen is performed in the presence of a N-hydroxyimide catalyst such as N-hydroxyphthalimide, and where necessary, a metallic promoter such as a cobalt compound (e.g., cobalt acetate or acetylacetonatocobalt). The ratio of α,β-unsaturated carboxylic ester (30) to alcohol (31) can be appropriately selected depending on the types (e.g., cost and reactivity) of the two compounds. For example, alcohol (31) may be used in excess (e.g., about 2 to 50 times by mole) to α,β-unsaturated carboxylic ester (30), and vice versa, α,β-unsaturated carboxylic ester (30) may be used in excess to alcohol (31). The amount of the N-hydroxyimide catalyst is, for example, from about 0.0001 to about 1 mole and preferably from about 0.001 to about 0.5 mole, relative to 1 mole of the compound which is used in a less amount between α,β-unsaturated carboxylic ester (30) and alcohol (31). The amount of metallic promoter is, for example, from about 0.0001 to about 0.7 mole and preferably from about 0.001 to about 0.5 mole, relative to 1 mole of the compound which is used in a less amount between α,β-unsaturated carboxylic ester (30) and alcohol (31). Oxygen is often used in excess to the compound which is used in a less amount among α,β-unsaturated carboxylic ester (30) and alcohol (31). The reaction is performed in a solvent at a temperature of from about 0° C. to about 150° C. and preferably from about 30° C. to about 100° C. at atmospheric pressure or under a pressure (under a load).

Such solvents include, but are not limited to, acetic acid and other organic acids, acetonitrile and other nitrites, trifluoromethylbenzene and other halogenated hydrocarbons, and ethyl acetate and other esters.

A reaction between thus obtained α-hydroxy-γ-butyrolactone derivative (32) and (meth)acrylic acid or its derivative (14) can be carried out pursuantly to the reaction between 1-adamantanol derivative (13) and (meth)acrylic acid or its derivative (14).

[Monomer Unit of Formula (X)]

Monomers constituting the monomer units of Formula (X) are represented by the following Formula (10):

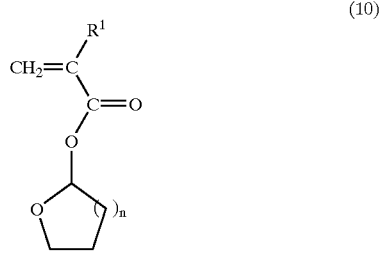

(10)

(wherein $R^1$ and n have the same meanings as defined above), of which typical examples include the following compounds:

[10-1] 2-tetrahydropyranyl (meth)acrylate ($R^1$=H or $CH_3$, n=2); and

[10-2] 2-tetrahydrofuranyl (meth)acrylate ($R^1$=H or $CH_3$, n=1).

[Monomer Unit of Formula (XI)]

Monomers constituting the monomer units of Formula (XI) are represented by the following Formula (11):

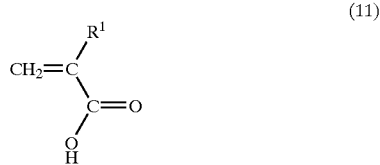

(11)

(wherein $R^1$ has the same meaning as defined above), of which specific examples are the following compounds:

[11-1] (meth)acrylic acid ($R^1$=H or $CH_3$).

The invented polymeric compounds have all of transparency, alkali-solubility, adhesion and etching resistance as described above, and can be advantageously used as photoresist resins.

A photoresist resin composition of the present invention comprises the invented polymeric compound and a light-activatable acid generator.

As the light-activatable acid generator, known or conventional compounds that can efficiently generate an acid by action of exposure can be employed. Such compounds include, but are not limited to, diazonium salts, iodonium salts (e.g., diphenyliodonium hexafluorophosphate), sulfonium salts (e.g., triphenylsulfonium hexafluoroantimonate, triphenylsulfonium hexafluorophosphate, and triphenylsulfonium methanesulfonate), sulfonates [e.g., 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane], oxathiazol derivatives, s-triazine derivatives, disulfone derivatives (e.g., diphenyldisulfone), imide compounds, oxime sulfonates, diazonaphthoquinone, and benzoin tosylate. Each of these light-activatable acid generators can be used alone or in combination.

The amount of the light-activatable acid generator can be appropriately selected depending on the strength of an acid generated by light irradiation or the proportion of each monomer unit in the polymeric compound, and is, for example, from about 0.1 to about 30 parts by weight, preferably from about 1 to about 25 parts by weight, and more preferably from about 2 to about 20 parts by weight, relative to 100 parts by weight of the polymeric compound.

The photoresist resin composition may further comprise additional components. Such additional components include, but are not limited to, alkali-soluble resins (e.g., novolak resins, phenol resins, imide resins, and carboxyl-group-containing resins), and other alkali-soluble components, coloring agents (e.g., dyestuffs), and organic solvents (e.g., hydrocarbons, halogenated hydrocarbons, alcohols, esters, amides, ketones, ethers, Cellosolves, Carbitols, glycol ether esters, and mixtures of these solvents).

The photoresist resin composition is applied onto a base or a substrate and is dried, and the resulting film (resist film) is exposed to light through a -predetermined mask (or is further subjected to post-exposure baking) to form a latent image pattern, and the film is then developed to thereby highly precisely yield a fine pattern.

Such bases or substrates include, for example, silicon wafers, metals, plastics, glasses and ceramics. The photoresist resin composition can be applied using a conventional application means such as a spin coater, a dip coater and a roller coater. The applied film has a thickness of, for example, from about 0.1 to about 20 μm, and preferably from about 0.3 to about 2 μm.

Light rays with different wavelengths, such as ultraviolet rays and X-rays, can be used for exposure. For example, g-ray, i-ray, and excimer laser (e.g., XeCl, KrF, KrCl, ArF, or ArCl) are usually used for semiconductor resists. An exposure energy is, for example, form about 1 to about 1000 $mJ/cm^2$, and preferably from about 10 to about 500 $mJ/cm^2$.

An acid is generated from the light-activatable acid generator by action of light irradiation, and the acid immediately eliminates the protective group (leaving group) of the carboxyl group of the polymeric compound. Thus, a carboxyl group that contributes to solubilized resin is formed. Subsequent development with water or an alkali developer can precisely form a predetermined pattern.

Industrial Applicability

According to the present invention, the polymer includes a monomer unit having an adamantane skeleton of a specific structure and can exhibit high etching resistance in addition to satisfactory transparency, alkali-solubility and adhesion. Accordingly, the invented polymeric compound is useful as a photoresist resin for use in, for example, the micromachining of semiconductors.

EXAMPLES

The present invention will now be illustrated in further detail with reference to several examples below, which are not intended to limit the scope of the invention. A compound indicated by "acrylate" subsequent to a compound number (monomer number) means a compound having an acryloyloxy group, of two compounds corresponding to the compound number described in the specification. A compound indicated by "methacrylate" means a compound having a methacryloyloxy group, of the two compounds. The figure at lower right of the parentheses in the structural formulae is mole percentage of the monomer unit in question.

Production Example 1

Production of 1-Acryloyloxy-3-t-butoxycarbonyladamantane [1-1(Acrylate)]

Initially, 10 mmole of 1-adamantanol, 1 mmole of N-hydroxyphthalimide, 30 ml of acetic acid and 30 ml of 1,2-dichloroethane were placed in an autoclave, and were stirred at 95° C. in a gaseous mixture atmosphere including 15 atm (=1.5 MPa) carbon monoxide and 1 atm (=0.1 MPa) air for 6 hours. The resulting reaction mixture was concentrated, and the concentrate was then subjected to column chromatography on a silica gel to thereby yield 1-carboxy-3-hydroxyadamantane in a yield of 47%.

A total of 25 mmole of acrylyl chloride (acryloyl chloride) was added dropwise to a mixture containing 10 mmole of 1-carboxy-3-hydroxyadamantane thus obtained, 25 mmole of triethylamine and 40 ml of tetrahydrofuran over about 30 minutes. After the completion of addition, the resulting mixture was stirred at room temperature for 2 hours. After adding water, the reaction mixture was extracted with ethyl acetate, and the organic layer was concentrated, and the concentrate was subjected to column chromatography on a silica gel to thereby yield 1-acryloyloxy-3-carboxyadamantane in a yield of 82%.

A mixture of 5 mmole of 1-acryloyloxy-3-carboxyadamantane thus obtained, 50 mmole of isobutene, 0.5 mmole of sulfuric acid and 50 ml of dichloromethane was stirred at 0° C. for 24 hours. After concentrating the reaction mixture, the concentrate was subjected to column chromatography on a silica gel to thereby yield the title compound in a yield of 81%.
[Spectral Data]
$^1$H-NMR (500 MHz, CDCl$_3$) δ: 1.43 (s, 9H), 1.55–2.23 (m, 12H), 2.28 (m, 2H), 5.74 (dd, 1H), 6.03 (dd, 1H), 6.30 (dd, 1H).

Production Example 2

Production of 1-t-Butoxycarbonyl-3-methacryloyloxyadamantane [1-1(Methacrylate)]

The title compound was obtained in the same manner as in Production Example 1, except that methacrylyl chloride (methacryloyl chloride) was used instead of acrylyl chloride.
[Spectral Data]
$^1$H-NMR (500 MHz, CDCl$_3$) δ: 1.45–1.63 (m, 6H), 1.92 (s, 3H), 2.00–2.19 (m, 7H), 2.30 (m, 2H), 5.52 (brs, 1H), 6.02 (brs, 1H).

Production Example 3

Production of 1-Acryloyloxy-3-t-butoxycarbonyl-5-hydroxyadamantane [1-3(Acrylate)]

The title compound was obtained in the same manner as in Production Example 1, except that 1,3-adamantanediol was used instead of 1-adamantanol to synthesis 1-carboxy-3,5-dihydroxyadamantane and that this compound was allowed to react with acrylyl chloride and then with isobutene.
[Spectral Data]
$^1$H-NMR (500 MHz, CDCl$_3$) δ: 1.43 (s, 9H), 1.60–2.22 (m, 12H), 2.38 (brs, 1H), 2.42 (m, 1H), 5.76 (dd, 1H), 6.03 (dd, 1H), 6.31 (dd, 1H).

Production Example 4

Production of 1-t-Butoxycarbonyl-3-hydroxy-5-methacryloyloxyadamantane [1-3 (Methacrylate)]

The title compound was obtained in the same manner as in Production Example 3, except that methacrylyl chloride was used instead of acrylyl chloride.
[Spectral Data]
$^1$H-NMR (500 MHz, CDCl$_3$) δ: 1.43 (s, 9H), 1.62–1.88 (m, 6H), 1.90 (s, 3H), 2.02–2.22 (m, 7H), 2.41 (m, 1H), 5.51 (brs, 1H), 6.02 (brs, 1H).

Production Example 5

Production of 1-Acryloyloxy-3-(2-tetrahydropyranyloxycarbonyl)adamantane [1-4 (Acrylate)]

A mixture of 10 mmole of 1-acryloyloxy-3-carboxyadamantane obtained in the same manner as in Production Example 1, 12 mmole of dihydropyran, 1 mmole of p-toluenesulfonic acid and 30 ml of dichloromethane was stirred at 20° C. for 2. hours. After concentrating the reaction mixture, the resulting concentrate was subjected to column chromatography on a silica gel to thereby yield 1-acryloyloxy-3-(2-tetrahydropyranyloxycarbonyl)adamantane in a yield of 92%.
[Spectral Data]
$^1$H-NMR (60 MHz, CDCl$_3$) δ: 1.2–2.6 (m, 20H), 3.5–4.2 (m, 2H), 5.7–6.6 (m, 4H).

Production Example 6

Production of 1-(2-Tetrahydropyranyloxycarbonyl)-3-methacryloyloxyadamantane [1-4 (Methacrylate)]

The title compound was obtained in a manner pursuant to Production Example 5, except that 1-carboxy-3-methacryloyloxyadamantane obtained as an intermediate in the process of Production Example 2 was used instead of 1-acryloyloxy-3-carboxyadamantane.
[Spectral Data]
$^1$H-NMR (60 MHz, CDCl$_3$) δ: 1.3–2.5 (m, 23H), 3.4–4.3 (m, 2H), 5.65 (brs, 1H), 6.0–6.3 (m, 2H).

Production Example 7

Production of 1-Acryloyloxy-3-hydroxy-5-(2-tetrahydropyranyloxycarbonyl)adamantane [1-6 (Acrylate)]

The title compound was obtained in the same manner as in Production Example 5, except that,-instead of 1-acryloyloxy-3-carboxyadamantane, 1-acryloyloxy-3-carboxy-5-hydroxyadamantane obtained as an intermediate in Production Example 3 was allowed to react with dihydropyran.
[Spectral Data]
$^1$H-NMR (60 MHz, CDCl$_3$) δ: 1.1–2.5 (m, 20H), 3.5–4.2 (m, 2H), 5.7–6.5 (m, 4H).

Production Example 8

Production of 1-Hydroxy-3-(2-tetrahydropyranyloxycarbonyl)-5-methacryloyloxyadamantane [1-6 (Methacrylate)]

The title compound was obtained in the same manner as in Production Example 5, except that 1-carboxy-3-hydroxy- 5-methacryloyloxyadamantane obtained as an intermediate in Production Example 4 was allowed to react with dihydropyran.
[Spectral Data]
$^1$H-NMR (60 MHz, CDCl$_3$) δ: 1.2–2.7 (m, 23H), 3.3–4.2 (m, 2H), 5.6 (brs, 1H), 6.0–6.3 (m, 2H).

Production Example 9

Production of 1-Acryloyloxy-3,5-bis(2-tetrahydropyranyloxycarbonyl)adamantane [1-5 (Acrylate)]

In an autoclave, 10 mmole of 1-adamantanol, 1 mmole of N-hydroxyphthalimide, 30 ml of acetic acid and 30 ml of 1,2-dichloroethane were placed, and were stirred at 95° C. in a gaseous mixture atmosphere of 15 atm (=1.5 MPa) carbon monoxide and 1 atm (=0.1 MPa) air for 6 hours. After concentrating the reaction mixture, the resulting concentrate was subjected to column chromatography on a silica gel to thereby yield 1,3-dicarboxy-5-hydroxyadamantane in a yield of 21%.

The title compound was obtained in a manner pursuant to Production Example 5, except that 1,3-dicarboxy-5-hydroxyadamantane obtained by the above process was used instead of 1-carboxy-3-hydroxyadamantane.
[Spectral Data]
$^1$H-NMR (60 MHz, CDCl$_3$) δ: 1.3–2.7 (m, 25H), 3.4–4.3 (m, 4H), 5.6–6.5 (m, 5H).

Production Example 10

Production of 1,3-bis(2-Tetrahydropyranyloxycarbonyl)-5-methacryloyloxyadamantane [1-5 (Methacrylate)]

The title compound was obtained in a manner pursuant to Production Example 6, except that 1,3-dicarboxy-5-hydroxyadamantane obtained in the process shown in Production Example 9 was used instead of 1-carboxy-3-hydroxyadamantane.
[Spectral Data]
$^1$H-NMR (60 MHz, CDCl$_3$) δ: 1.4–2.6 (m, 28H), 3.4–4.4 (m, 2H), 5.6 (brs, 1H), 6.0–6.3 (m, 2H).

Production Example 11

Production of 1-Acryloyloxy-3-hydroxyadamantane [5-1(Acrylate)]

A total of 13 mmole of acrylyl chloride was added dropwise to a mixture of 10 mmole of 1,3-adamantanediol, 15 mmole of triethylamine and 100 ml of tetrahydrofuran over about 30 minutes. After the completion of addition, the resulting mixture was stirred at 50° C. for 1.5 hours. After adding water, the reaction mixture was extracted with ethyl acetate, the organic layer was concentrated, and the resulting concentrate was subjected to column chromatography on a silica gel to thereby yield the title compound in a yield of 63%.
[Spectral Data]
$^1$H-NMR (CDCl$_3$) δ: 1.47–1.61 (m, 2H), 1.62–1.80 (m, 5H), 2.00–2.17 (m, 6H), 2.34 (m, 2H), 5.75 (dd, 1H), 6.03 (dd, 1H), 6.30 (dd, 1H).

Production Example 12

Production of 1-Hydroxy-3-methacryloyloxyadamantane [5-1 (Methacrylate)]

The title compound was obtained in the same manner as in Production Example 11, except that methacrylyl chloride was used instead of acrylyl chloride.
[Spectral Data]
$^1$H-NMR (CDCl$_3$) δ: 1.48–1.61 (m, 6H), 1.89 (s, 3H), 2.00–2.16 (m, 7H), 2.34 (m, 2H), 5.49 (brs, 1H), 6.01 (brs, 1H).

Production Example 13

Production of 1-Acryloyloxy-3,5-dihydroxyadamantane [5-2 (Acrylate)]

The title compound was obtained in a manner pursuant to Production Example 11, except that 1,3,5-adamantanetriol was used instead of 1,3-adamantanediol.
[Spectral Data]
$^1$H-NMR (DMSO-d$_6$) δ: 1.38–1.96 (m, 12H), 2.22 (m, 1H), 4.60 (brs, 2H), 5.81 (dd, 1H), 6.03 (dd, 1H), 6.21 (dd, 1H).

Production Example 14

Production of 1,3-Dihydroxy-5-methacryloyloxyadamantane [5-2 (Methacrylate)]

The title compound was obtained pursuantly to the process of Production Example 11, except that 1,3,5-adamantanetriol and methacrylyl chloride were used instead of 1,3-adamantanediol and acrylyl chloride, respectively.
[Spectral Data]
1H-NMR (DMSO-d$_6$) δ: 1.38–1.58 (m, 6H), 1.81 (s, 3H), 1.83–1.95 (m, 6H), 2.22 (m, 1H), 4.60 (brs, 2H), 5.58 (brs, 1H), 5.92 (brs, 1H).

Production Example 15

Production of 2-Acryloyloxy-1,5-dihydroxy-2-methyladamantane [2-5 (Acrylate)]

A mixture of 30 mmole of 2-keto-1-adamantanol, 3 mmole of N-hydroxyphthalimide, 0.03 mmole of acetylacetonatocobalt(III) and 35 ml of acetic acid was stirred at 60° C. in an oxygen atmosphere (1 atm (=0.1 MPa)) for 12 hours. The resulting reaction mixture was concentrated, and the concentrate was subjected to column chromatography on a silica gel to thereby yield 2-keto-1,5-adamantanediol as a white solid matter.

Separately, a solution of methylmagnesium bromide in THF (tetrahydrofuran) was prepared from 11 mmole of metal magnesium, 10 mmole of bromomethane and a small amount of iodide. A solution of the above-prepared 2-keto-1,5-adamantanediol in THF was added dropwise to the methylmagnesium bromide solution, and was refluxed for 2 hours The reaction mixture was then added dropwise to a 10% by weight aqueous hydrochloric acid cooled on ice, and the mixture was stirred for 2 hours. The mixture was adjusted to neutrality with a 10% by weight aqueous sodium hydroxide solution, and was separated into an organic layer and an aqueous layer. The aqueous layer was concentrated and was crystallized with acetone to thereby yield 2-methyl-1,2,5-adamantanetriol.

A total of 6.5 mmole of acrylyl chloride was added dropwise to a mixture of 5 mmole of 2-methyl-1,2,5-adamantanetriol, 7.5 mmole of triethylamine and 50 ml of THF over about 15 minutes. After the completion of addition, the resulting mixture was stirred at room temperature for 1.5 hours. After adding water, the reaction mixture was extracted with ethyl acetate, the organic layer was concentrated, and the concentrate was subjected to column chromatography on a silica gel to thereby yield the title compound.

Production Example 16

Production of 2-Acryloyloxy-4,4-dimethyl-γ-butyrolactone [9-3 (Acrylate)]

A mixture of 3 mmole of ethyl acrylate, 3 ml of 2-propanol, 0.6 mmole of N-hydroxyphthalimide, 0.003 mmole of cobalt (II) acetate, 0.010 mmole of acetylacetonatocobalt(III) and 1 ml of acetonitrile was stirred at 60° C. in an oxygen atmosphere (1 atm (=0.1 MPa)) for 12 hours. The reaction mixture was concentrated, and the resulting concentrate was subjected to column chromatography on a silica gel to thereby yield 2-hydroxy-4,4-dimethyl-γ-butyrolactone in a yield of 75%.
[Spectral Data of 2-Hydroxy-4,4-dimethyl-γ-butyrolactone]
$^1$H-NMR (CDCl$_3$) δ: 1.42 (s, 3H), 1.51 (s, 3H), 2.06 (dd, 1H), 2.52 (dd, 1H), 3.03 (brs, 1H), 4.63 (t, 1H).

A mixture of 100 mmole of 2-hydroxy-4,4-dimethyl-γ-butyrolactone thus obtained, 150 mmole of acrylyl chloride, 150 mmole of triethylamine and 300 ml of toluene was stirred at 25° C. for 4 hours. After adding water to the reaction mixture, the resulting organic layer was concentrated, and the concentrate was subjected to column chromatography on a silica gel to thereby yield 2-acryloyloxy-4,4-dimethyl-γ-butyrolactone in a yield of 85%.
[Spectral Data of 2-Acryloyloxy-4,4-dimethyl-γ-butyrolactone]
$^1$H-NMR (CDCl$_3$) δ: 1.42 (s, 3H), 1.52 (s, 3H), 2.06 (dd, 1H), 2.52 (dd, 1H), 5.65 (dd, 1H), 5.77 (dd, 1H), 6.03 (dd, 1H), 6.32 (dd, 1H).

Production Example 17

Production of 2-Methacryloyloxy-4,4-dimethyl-γ-butyrolactone [9-3 (Methacrylate)]

The title compound was obtained in the same manner as in Production Example 16, except that methacrylyl chloride was used instead of acrylyl chloride.
[Spectral Data]
$^1$H-NMR (CDCl$_3$) δ: 1.42 (s, 3H), 1.48 (s, 3H), 1.90 (s, 3H), 2.15 (dd, 1H), 2.62 (dd, 1H), 5.66 (brs, 1H), 6.18 (brs, 1H).

Production Example 18

Production of 2-Acryloyloxy-2,4,4-trimethyl-γ-butyrolactone [9-4 (Acrylate)]

The title compound was obtained in the same manner as in Production Example 16, except that ethyl methacrylate was used instead of ethyl acrylate.
[Spectral Data]
$^1$H-NMR (CDCl$_3$) δ: 1.45 (s, 3H), 1.57 (s, 3H), 2.16 (dd, 1H), 2.63 (dd, 1H), 5.74 (dd, 1H), 6.03 (dd, 1H), 6.32 (dd, 1H).

Production Example 19

Production of 2-Methacryloyloxy-2,4,4-trimethyl-γ-butyrolactone [9-4 (Methacrylate)]

The title compound was obtained in the same manner as in Production Example 16, except that ethyl methacrylate and methacrylyl chloride were used instead of ethyl acrylate and acrylyl chloride, respectively.
[Spectral Data]
$^1$H-NMR (CDCl$_3$) δ: 1.47 (s, 3H), 1.59 (s, 3H), 1.68 (d, 3H), 1.94 (dd, 3H), 2.20 (d, 1H), 2.60 (d, 1H), 5.64 (t, 1H), 6.17 (s, 1H).

Production Example 20

Production of 3-Acryloyloxy-4,4-dimethyl-γ-butyrolactone [3-5 (Acrylate)]

In dioxane, 2-hydroxy-4,4-dimethyl-γ-butyrolactone obtained according to the process of Production Example 16 was subjected to a reaction (a dehydration reaction) with an equivalent amount of P$_2$O$_5$ at room temperature to thereby yield a corresponding α,β-unsaturated-γ-butyrolactone (yield: 30%). Next, this substance was allowed to react with m-chloroperbenzoic acid (MCPBA) in methylene chloride at room temperature to thereby yield 2,3-epoxy-4,4-dimethyl-γ-butyrolactone (yield: 85%). Hydrogen was bubbled into a mixture of 10 mmole of the obtained 2,3-epoxy-4,4-dimethyl-γ-butyrolactone, 1 g of 5% by weight Pd—C and 20 ml of tetrahydrofuran at room temperature for 11 hours. The resulting reaction mixture was filtrated and was concentrated, and the concentrate was subjected to column chromatography on a silica gel to thereby yield 3-hydroxy-4,4-dimethyl-γ-butyrolactone in a yield of 63%.

The obtained 3-hydroxy-4,4-dimethyl-γ-butyrolactone was allowed to react with acrylyl chloride in the same manner as in Production Example 16 to thereby yield the title compound (yield: 87%).
[Spectral Data]
MS m/e: 185 (M$^+$); IR (cm$^{-1}$): 3040, 1770, 1650, 1150.

Production Example 21

Production of 3-Methacryloyloxy-4,4-dimethyl-γ-butyrolactone [3-5 (Methacrylate)]

The title compound was obtained in the same manner as in Production Example 20, except that methacrylyl chloride was used instead of acrylyl chloride.
[Spectral Data]
MS m/e: 199 (M$^+$); IR (cm$^{-1}$): 3045, 1772, 1190.

Production Example 22

Production of 3-Acryloyloxy-3,4,4-trimethyl-γ-butyrolactone [3-6 (Acrylate)]

Using ethyl crotonate instead of ethyl acrylate, the procedure of Production Example 16 was repeated to thereby yield 2-hydroxy-3,4,4-trimethyl-γ-butyrolactone in a yield of 15%. The obtained 2-hydroxy-3,4,4-trimethyl-γ-butyrolactone was subjected to a reaction (a dehydration reaction) with an equivalent amount of P$_2$O$_5$ in dioxane at room temperature to thereby yield a corresponding α,β-unsaturated γ-butyrolactone (yield: 34%). This substance was then allowed to react with m-chloroperbenzoic acid (MCPBA) in methylene chloride at room temperature to thereby yield 2,3-epoxy-3,4,4-trimethyl-γ-butyrolactone (yield: 75%). Hydrogen was bubbled into a mixture of 10 mmole of the obtained 2,3-epoxy-3,4,4-trimethyl-γ-butyrolactone, 1 g of 5% by weight Pd—C and 20 ml of tetrahydrofuran at room temperature for 11 hours. The resulting reaction mixture was filtrated and was concentrated, and the concentrate was subjected to column chromatography on a silica gel to thereby yield 3-hydroxy-3,4,4-trimethyl-γ-butyrolactone in a yield 82%.

The obtained 3-hydroxy-3,4,4-trimethyl-γ-butyrolactone was allowed to react with acrylyl chloride in the same manner as in Production Example 16 to thereby yield the title compound (yield: 85%).

[Spectral Data]
MS m/e: 199 (M+); IR (cm$^{-1}$): 3020, 1768, 1210.

Production Example 23

Production of 3-Methacryloyloxy-3,4,4-trimethyl-γ-butyrolactone [3-6 (Methacrylate)]

The title compound was obtained in the same manner as in Production Example 22, except that methacrylyl chloride was used instead of acrylyl chloride.
[Spectral Data]
MS m/e: 211 (M+); IR (cm$^{-1}$): 3010, 1765, 1200.

Production Example 24

Production of 1-(1-Acryloyloxy-1-ethylpropyl)adamantane [4-1 (Acrylate)]

In a flask, 61.51 g (0.060 mole) of a 13% by weight ethylmagnesium bromide-tetrahydrofuran solution previously prepared from ethyl bromide and metal magnesium was placed. To this solution, a solution of 4.76 (0.02 mole) of n-butyl 1-adamantanecarboxylate in 7.21 g of tetrahydrofuran was added dropwise, while maintaining the inner temperature at 35° C. or lower. After the completion of adding, the resulting mixture was stirred at room temperature for 1 hour.

The above-obtained reaction mixture was added dropwise to 32.37 g of a 10% by weight aqueous sulfuric acid solution, while maintaining the inner temperature at 35° C. or lower, and the resulting mixture was neutralized with a 5% by weight aqueous sodium hydroxide solution to thereby separate the mixture. The aqueous layer was extracted with two portions of 22.24 g of benzene, and the extract was added to the organic layer and the resulting mixture was rinsed with 22.24 g of an aqueous saturated sodium hydroxide solution and was dried over anhydrous sodium sulfate. The dried mixture was then filtrated, and the filtrate was concentrated under a reduced pressure to thereby yield α,α-diethyl-1-adamantanemethanol. A yield on the basis of n-butyl 1-adamantanecarboxylate was 45.5%.
[Spectral Data of α,α-Diethyl-1-adamantanemethanol]
GC-MS m/e: 204, 193, 175, 161, 147, 135, 86, 79, 67, 57, 41.

A total of 15 mmole of acrylyl chloride was added dropwise to a mixture of 10 mmole of α,α-diethyl-1-adamantanemethanol thus obtained, 20 mmole of triethylamine and 40 ml of tetrahydrofuran over about 30 minutes. After the completion of addition, the resulting mixture was stirred at room temperature for 6 hours. After adding water, the reaction mixture was concentrated, and the concentrate was subjected to column chromatography on a silica gel to thereby yield the title compound in a yield of 72%.
[Spectral Data]
$^1$H-NMR (500 MHz, CDCl$_3$) δ: 1.15–1.55 (m, 10H), 1.59–1.76 (m, 10H), 2.03 (m, 3H), 5.72 (dd, 1H), 6.04 (dd, 1H), 6.28 (dd, 1H).

Production Example 25

Production of 1-(1-Ethyl-1-methacryloyloxypropyl)adamantane [4-1 (Methacrylate)]

The title compound was obtained in the same manner as in Production Example 24, except that methacrylyl chloride was used instead of acrylyl chloride.

[Spectral Data]
$^1$H-NMR (500 MHz, CDCl$_3$) δ: 1.13–1.76 (m, 20H), 2.07 (m, 3H), 5.47 (brs, 1H), 6.00 (brs, 1H).

Production Example 26

Production of 1-(1-Acryloyloxy-1-methylpropyl)adamantane [4-3 (Acrylate)]

A mixture of 0.3 mole of adamantane, 1.8 mole of biacetyl, 1.5 mmole of cobalt(II) acetate and 300 ml of acetic acid was stirred at 60° C. in an oxygen atmosphere (1 atm (=0.1 MPa)) for 4 hours. The resulting reaction mixture was concentrated to about 20% by weight, and was then extracted with ethyl acetate, was dried, and was rinsed with hexane to thereby yield 1-acetyladamantane in a yield of 52% with a conversion from adamantane of 87%.

Separately, 1.1 mole of metal magnesium was placed in a flask, and the inside atmosphere of the flask was replaced with nitrogen, and a solution of 1.0 mole of ethyl bromide in 500 ml of ethyl ether was placed in the flask in such an amount that the metal magnesium was submerged in the solution. A reaction was then initiated with a small amount of iodine, and the remainder ethyl ether solution of ethyl bromide was added dropwise to the mixture at such a rate that the solvent was gently refluxed. After the completion of addition, the reflux operation was continued for further 2 hours.

A solution of 1.0 mole of the above-prepared 1-acetyladamantane in 1000 ml of ethyl ether was added dropwise to the above-obtained reaction mixture at such a rate that the solvent was gently refluxed. After the completion of addition, the reflux operation was continued for further 2 hours. The resulting reaction mixture was gradually added dropwise to a 10% by weight hydrochloric acid (in an amount corresponding to HCl: 1 mole) cooled on ice, while stirring, and the mixture was stirred for further 2 hours at a temperature in a range from 0° C. to room temperature.

A 10% aqueous sodium hydroxide solution was added to the reaction mixture to adjust the mixture to around neutrality, and the neutralized mixture was separated into an aqueous layer and an organic layer; the aqueous layer was extracted with two portions of 1000 ml of ethyl ether; the extract was added to the organic layer and the mixture was concentrated; and the concentrate was cooled and crystallized to yield α-ethyl-α-methyl-1-adamantanemethanol in a yield of 46%.

A total of 10 mmole of acrylyl chloride was added to a mixture of 10 mmole of α-ethyl-α-methyl-1-adamantanemethanol thus obtained, 10 mmole of triethylamine and 40 ml of tetrahydrofuran over about 30 minutes. After the completion of addition, the resulting mixture was stirred at room temperature for 6 hours. After adding water, the reaction mixture was concentrated, and the concentrate was subjected to column chromatography on a silica gel to thereby yield the title compound in a yield of 74%.
[Spectral Data]
$^1$H-NMR (CDCl$_3$) δ: 1.14–1.37 (m, 5H), 1.48 (s, 3H), 1.55–1.78 (m, 10H), 2.04 (m, 3H), 5.73 (dd, 1H), 6.05 (dd, 1H), 6.29 (dd, 1H).

Production Example 27

Production of 1-(1-Methacryloyloxy-1-methylpropyl)adamantane [4-3 (Methacrylate)]

The title compound was obtained in the same manner as in Production Example 26, except that methacrylyl chloride was used instead of acrylyl chloride.

[Spectral Data]
$^1$H-NMR (CDCl$_3$) δ: 1.18–1.43 (m, 5H), 1.50 (s, 3H), 1.53–1.80 (m, 10H), 2.10 (m, 3H), 5.52 (brs, 1H), 6.02 (brs, 1H).

Production Example 28

Production of 1-(1-Acryloyloxy-1,2-dimethylpropyl)-3-hydroxyadamantane [4-6 (Acrylate)]

The procedure of Production Example 26 was repeated, except that 0.3 mole of 1-adamantanol was used instead of adamantane, to thereby yield 1-acetyl-3-adamantanol in a yield of 20% with a conversion from 1-adamantanol of 82%.

[Spectral Data of 1-Acetyl-3-adamantanol]
IR (cm$^{-1}$): 3401, 2897, 2854, 1683, 1430, 1019, 605; $^{13}$C-NMR (CDCl$_3$) δ: 24.3, 29.9, 34.8, 36.8, 43.9, 45.4, 49.6, 67.9, 212.4.

Separately, 1.1 mole of metal magnesium was placed in a flask, and the inside atmosphere of the flask was replaced with nitrogen, and a solution of 1.0 mole of 2-bromopropane in 500 ml of ethyl ether was placed in the flask in such an amount that the metal magnesium was submerged in the solution. A reaction was then initiated with a small amount of iodine, and the remainder ethyl ether solution of 2-bromopropane was added dropwise to the mixture at such a rate that the solvent was gently refluxed. After the completion of addition, the reflux operation was continued for further 2 hours.

A solution of 0.5 mole of 1-acetyl-3-adamantanol thus obtained in 1000 ml of ethyl ether was added dropwise to the above-obtained reaction mixture at such a rate that the solvent was gently refluxed. After the completion of addition, the reflux operation was continued for further 2 hours. The resulting reaction mixture was added dropwise to a 10% by weight hydrochloric acid (in an amount corresponding to HCl: 1 mole) cooled on ice, while stirring, and the mixture was stirred for further 2 hours at a temperature in a range from 0° C. to room temperature.

A 10% aqueous sodium hydroxide solution was added to the reaction mixture to adjust the mixture to around neutrality, and the neutralized mixture was separated into an aqueous layer and an organic layer; the aqueous layer was extracted with two portions of 1000 ml of ethyl ether; the extract was added to the organic layer and the mixture was concentrated; and the concentrate was cooled and crystallized to yield 3-hydroxy-α-isopropyl-α-methyl-1-adamantanemethanol in a yield of 67%.

[Spectral Data of 3-Hydroxy-α-isopropyl-α-methyl-1-adamantanemethanol]
MS m/e: 238 ([M$^+$]), 220, 202, 187, 172, 157, 144.

A total of 10 mmole of acrylyl chloride was added dropwise to a mixture of 10 mmole of 3-hydroxy-α-isopropyl-α-methyl-1-adamantanemethanol thus obtained, 10 mmole of triethylamine and 40 ml of tetrahydrofuran over about 30 minutes. After the completion of addition, the resulting mixture was stirred at room temperature for 6 hours. After adding water, the reaction mixture was concentrated, and the concentrate was subjected to column chromatography on a silica gel to thereby yield the title compound in a yield of 67%.

[Spectral Data]
$^1$H-NMR (CDCl$_3$) δ: 1.21 (m, 1H), 1.41 (d, 6H), 1.42–1.80 (m, 13H), 2.28 (m, 2H), 5.76 (dd, H), 6.02 (dd, 1H), 6.30 (dd, 1H).

Production Example 29

Production of 1-(1-Methacryloyloxy-1,2-dimethylpropyl)-3-hydroxyadamanta ne [4-6 (Methacrylate)]

The title compound was obtained in the same manner as in Production Example 28, except that methacrylyl chloride was used instead of acrylyl chloride.

[Spectral Data]
MS m/e: 294 ([M$^+$]), 276, 222, 204, 151, 133, 73, 55.

Production Example 30

Production of 1,3-Dihydroxy-5-(1-methacryloyloxy-1-methylethyl)adamantane [6-9 (Methacrylate)]

A mixture of 1 mole of 1-adamantanecarboxylic acid, 0.1 mole of N-hydroxyphthalimide, 1 mmole of acetylacetonatocobalt(II) and 2.5 L of acetic acid was stirred at 75° C. in an oxygen atmosphere (1 atm (=0.1 MPa)) for 12 hours. The resulting reaction mixture was concentrated and was then subjected to column chromatography on a silica gel to thereby yield 3,5-dihydroxy-1-adamantanecarboxylic acid.

A mixture of 300 mmole of 3,5-dihydroxy-1-adamantanecarboxylic acid thus obtained, 450 mmole of n-butanol, 15 mmole of sulfuric acid and 900 ml of toluene was stirred under reflux of toluene for 5 hours. The reaction mixture was concentrated and was then subjected to column chromatography on a silica gel to thereby yield n-butyl 3,5-dihydroxy-1-adamantanecarboxylate.

A mixture of 200 mmole of n-butyl 3,5-dihydroxy-1-adamantanecarboxylate thus obtained, 440 mmole of 2-methoxyethoxymethyl chloride, 440 mmole of triethylamine and 400 ml of tetrahydrofuran (THF) was refluxed for 3 hours. The reaction mixture was concentrated and was then subjected to column chromatography on a silica gel to thereby yield n-butyl 3,5-bis(2-methoxyethoxymethoxy)-1-adamantanecarboxylate.

Separately, 0.55 mole of metal magnesium was placed in a flask, and the inside atmosphere of the flask was replaced with nitrogen, and a solution of 0.5 mole of bromomethane in 250 ml of THF was placed in the flask in such an amount that the metal magnesium was submerged in the solution. A reaction was then initiated with a small amount of iodine, and the remainder THF solution of bromomethane was added dropwise to the mixture at such a rate that the solvent was gently refluxed. After the completion of addition, the reflux operation was continued for further 2 hours to thereby yield a methylmagnesium bromide solution.

A solution of 100 mmole of n-butyl 3,5-bis(2-methoxyethoxymethoxy)-1-adamantanecarboxylate in 150 ml of THF was added dropwise to the above-prepared methylmagnesium bromide solution at such a rate that the solvent was gently refluxed. After the completion of addition, the reflux operation was continued for further 2 hours. The resulting reaction mixture was added dropwise to a 10% by weight hydrochloric acid cooled on ice, while stirring, and the mixture was stirred for further 2 hours at a temperature in a range from 0° C. to room temperature. A 10% by weight aqueous sodium hydroxide solution was added to the reaction mixture to adjust the mixture to around neutrality, and the neutralized mixture was separated into an aqueous layer and an organic layer; the aqueous layer was extracted with toluene; the extract was added to the organic layer and the mixture was concentrated; and the concentrate was subjected to column chromatography on a silica gel to thereby yield α,α-dimethyl-3,5-bis(2-methoxyethoxymethoxy)-1-adamantanemethanol.

A total of 30 mmole of methacrylyl chloride was added dropwise to a mixture of 20 mmole of α,α-dimethyl-3,5-bis(2-methoxyethoxymethoxy)-1-adamantanemethanol thus obtained, 40 mmole of triethylamine and 80 ml of THF over about 30 minutes. After the completion of addition, the resulting mixture was stirred at room temperature for 6 hours. After adding water, the resulting reaction mixture was extracted with ethyl acetate, the organic layer was concentrated, and the concentrate was subjected to column chromatography on a silica gel to thereby yield 1-(1-methacryloyloxy-1-methylethyl)-3,5-bis(2-methoxyethoxymethoxy)adamantane.

A mixture of 10 mmole of 1-(1-methacryloyloxy-1-methylethyl)-3,5-bis(2-methoxyethoxymethoxy) adamantane thus obtained, 1 mmole (in terms of HCl) of 6N-HCl and 40 ml of acetone was stirred at room temperature for 5 hours. The resulting reaction mixture was incorporated with an aqueous ammonium chloride solution, was extracted with ethyl acetate, the organic layer was concentrated, and the concentrate was subjected to column chromatography on a silica gel to thereby yield the title compound.

[Spectral Data]

$^1$H-NMR (500 MHz, DMSO-d$_6$) δ: 1.33–1.97 (m, 21H), 2.22 (m, 1H), 4.68 (brs, 2H), 5.74 (brs, 1H), 5.91 (brs, 1H).

Example 1

Synthesis of Resin Having the Following Structure

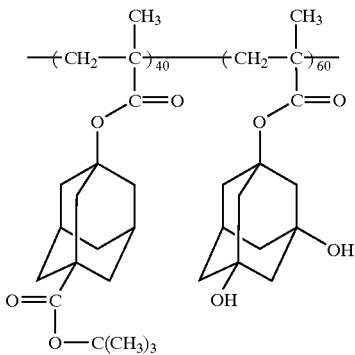

In an Erlenmeyer flask, 4.61 g (15.0 mmole) of monomer [1-1] (methacrylate), 5.38 g (22.5 mmole) of monomer [5-2] (methacrylate) and 0.96 g of an initiator ("V-65" produced by Wako Pure Chemical Industries, Ltd.) were placed, and were completely dissolved in 25 g of THF (tetrahydrofuran) to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.03 g of the target resin. The recovered polymer was subjected to GPC analysis to find that the polymer had a weight average molecular weight (Mw) of 8800 and a dispersion (Mw/Mn) of 2.20. In $^1$H-NMR (in DMSO-d6) spectrum, signals were observed at 0.8–2.5 (broad), 1.6, 1.9, 2.1 and 4.6 ppm.

Example 2

Synthesis of Resin Having the Following Structure

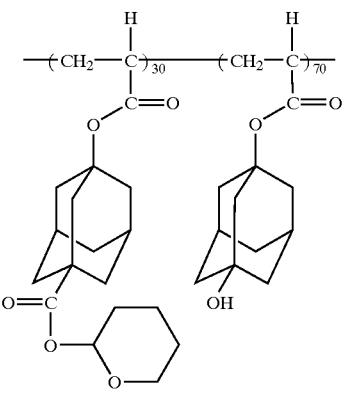

In an Erlenmeyer flask, 4.20 g (12.6 mmole) of monomer [1-4] (acrylate), 6.51 g (29.3 mmole) of monomer [5-1] (acrylate) and 1.07 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.55 g of the target resin. The recovered polymer was subjected to GPC analysis to find that the polymer had a weight average molecular weight (Mw) of 9500 and a dispersion (Mw/Mn) of 2.20. In $^1$H-NMR (in DMSO-d6) spectrum, signals were observed at 0.8–2.5 (broad), 1.6, 1.9, 2.1, 4.6 and 5.9 ppm.

Example 3

Synthesis of Resin Having the Following Structure

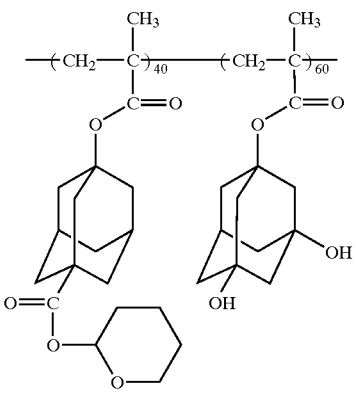

In an Erlenmeyer flask, 4.20 g (12.6 mmole) of monomer [1-4] (methacrylate), 4.49 g (18.9 mmole) of monomer [5-2] (methacrylate) and 0.87 g of an initiator ("V-65" produced by Wako Pure Chemical Industries, Ltd.) were placed, and were completely dissolved in 24 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 6.52 g of the target resin. The recovered polymer was subjected to GPC analysis to find that the polymer had a weight average molecular weight (Mw) of 7800 and a dispersion (Mw/Mn) of 1.98. In $^1$H-NMR (in DMSO-d6) spectrum, signals were observed at 0.8–2.5 (broad), 1.6, 1.9, 2.1, 4.6 and 5.9 ppm.

Example 4
Synthesis of Resin Having the Following Structure

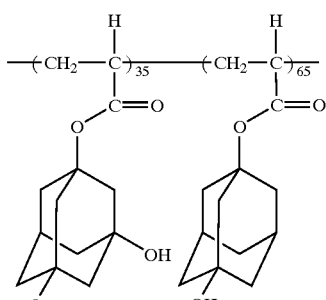

In an Erlenmeyer flask, 5.13 g (13.6 mmole) of monomer [1-3] (acrylate), 4.86 g (20.5 mmole) of monomer [5-1] (acrylate) and 1.00 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.78 g of the target resin. The recovered polymer was subjected to GPC analysis to find that the polymer had a weight average molecular weight (Mw) of 7500 and a dispersion (Mw/Mn) of 2.03. In $^1$H-NMR (in DMSO-d6) spectrum, clear signals were observed at 0.8–2.5 (broad), 1.6, 1.9, 2.1, 4.6 and 5.9 ppm.

Example 5
Synthesis of Resin Having the Following Structure

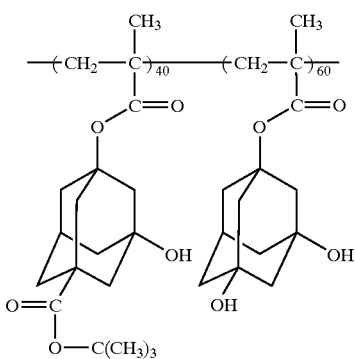

In an Erlenmeyer flask, 5.13 g (13.6 mmole) of monomer [1-3] (methacrylate), 4.86 g (20.5 mmole) of monomer [5-2] (methacrylate) and 0.99 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.78 g of the target resin. The recovered polymer was subjected to GPC analysis to find that the polymer had a weight average molecular weight (Mw) of 9000 and a dispersion (Mw/Mn) of 2.31. In $^1$H-NMR (in DMSO-d6) spectrum, signals were observed at 0.8–2.5 (broad), 1.6, 1.9, 2.1, 4.6 and 5.9 ppm.

Example 6

Synthesis of Resin Having the Following Structure

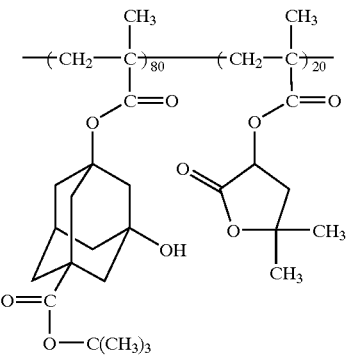

In an Erlenmeyer flask, 8.51 g (26.4 mmole) of monomer [1-3] (methacrylate), 1.21 g (6.60 mmole) of monomer [9-3] (methacrylate) and 0.97 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.55 g of the target resin. The recovered polymer was subjected to GPC analysis to find that the polymer had a weight average molecular weight (Mw) of 7900 and a dispersion (Mw/Mn) of 1.89. In $^1$H-NMR (in DMSO-d6) spectrum, signals were observed at 0.8–2.5 (broad), 1.5, 1.9, 2.1, 4.6 and 5.9 ppm.

Example 7

Synthesis of Resin Having the Following Structure

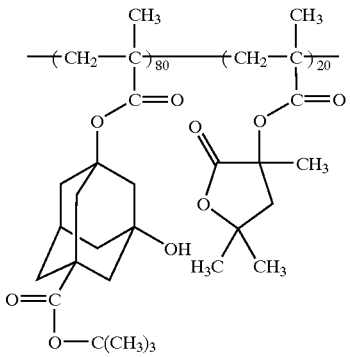

In an Erlenmeyer flask, 8.81 g (27.3 mmole) of monomer [1-3] (methacrylate), 1.31 g (6.84 mmole) of monomer [9-4] (methacrylate) and 0.99 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.24 g of the target resin. The recovered polymer was subjected to GPC analysis to find that the polymer had a weight average molecular weight (Mw) of 8100 and a dispersion (Mw/Mn) of 2.11. In $^1$H-NMR (in DMSO-d6) spectrum, signals were observed at 0.8–2.5 (broad), 1.5, 1.9, 2.1, 4.6 and 5.9 ppm.

Example 8

Synthesis of Resin Having the Following Structure

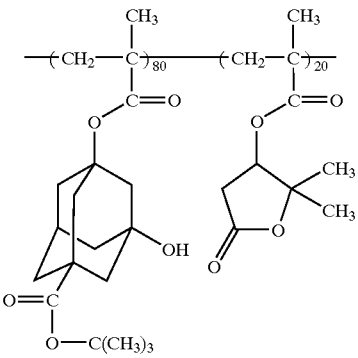

In an Erlenmeyer flask, 8.45 g (26.2 mmole) of monomer [1-3] (methacrylate), 1.30 g (6.56 mmole) of monomer [3-5] (methacrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.05 g of the target resin. The recovered polymer was subjected to GPC analysis to find that the polymer had a weight average molecular weight (Mw) of 7800 and a dispersion (Mw/Mn) of 2.26. In $^1$H-NMR (in DMSO-d6) spectrum, clear signals were observed at 0.8–2.5 (broad), 1.5, 1.9, 2.1, 4.6 and 5.6 ppm.

Example 9

Synthesis of Resin Having the Following Structure

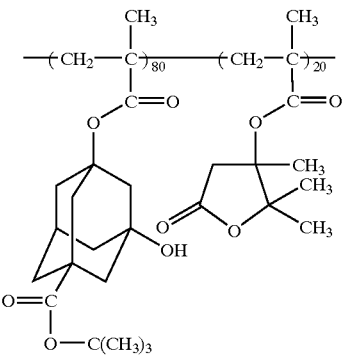

In an Erlenmeyer flask, 8.40 g (26.0 mmole) of monomer [1-3] (methacrylate), 1.38 g (6.52 mmole) of monomer [3-6] (methacrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.78 g of the target resin. The recovered polymer was subjected to GPC analysis to find that the polymer had a weight average molecular weight (Mw) of 9300 and a dispersion (Mw/Mn) of 2.38. In $^1$H-NMR (in DMSO-d6) spectrum, clear signals were observed at 0.8–2.5 (broad), 1.5, 2.1, 4.6 and 5.6 ppm.

Example 10

Synthesis of Resin Having the Following Structure

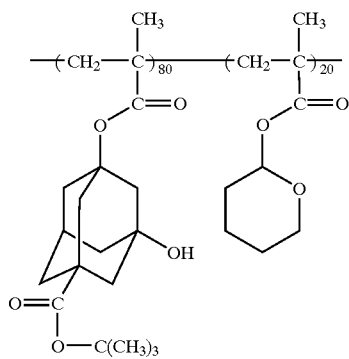

In an Erlenmeyer flask, 9.02 g (28.0 mmole) of monomer [1-3] (methacrylate), 1.19 g (7.00 mmole) of monomer [10-1] (methacrylate) and 1.02 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.78 g of the target resin. The recovered polymer was subjected to GPC analysis to find that the polymer had a weight average molecular weight (Mw) of 8500 and a dispersion (Mw/Mn) of 2.43. In $^1$H-NMR (in DMSO-d6) spectrum, signals were observed at 0.8–2.7 (broad), 1.5, 1.9, 2.1, 3.7, 3.9, 4.6 and 5.9 ppm.

Example 11

Synthesis of Resin Having the Following Structure

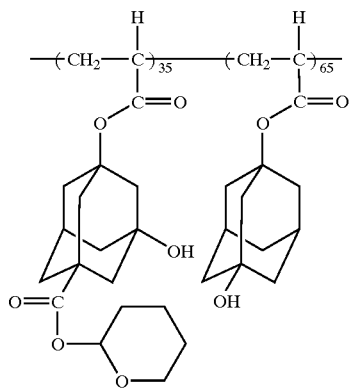

In an Erlenmeyer flask, 4.41 g (12.6 mmole) of monomer [1-6] (acrylate), 5.20 g (23.4 mmole) of monomer [5-1] (acrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.11 g of the target resin. The recovered polymer was subjected to GPC analysis to find that the polymer had a weight average molecular weight (Mw) of 8200 and a dispersion (Mw/Mn) of 2.00. In $^1$H-NMR (in DMSO-d6) spectrum, signals were observed at 0.8–2.5 (broad), 1.5, 1.9, 2.1, 3.7, 3.8, 4.6 and 5.9 ppm.

Example 12

Synthesis of Resin Having the Following Structure

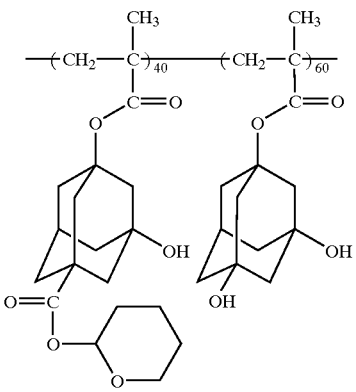

In an Erlenmeyer flask, 5.46 g (15.6 mmole) of monomer [1-6] (methacrylate), 5.20 g (23.4 mmole) of monomer [5-2] (methacrylate) and 1.04 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.76 g of the target resin. The recovered polymer was subjected to GPC analysis to find that the polymer had a weight average molecular weight (Mw) of 8800 and a dispersion (Mw/Mn) of 2.26. In H-NMR (in DMSO-d6) spectrum, signals were observed at 0.8–2.4 (broad), 1.6, 1.9, 2.1, 3.7, 3.9, 4.6 and 5.9 ppm.

Example 13

Synthesis of Resin Having the Following Structure

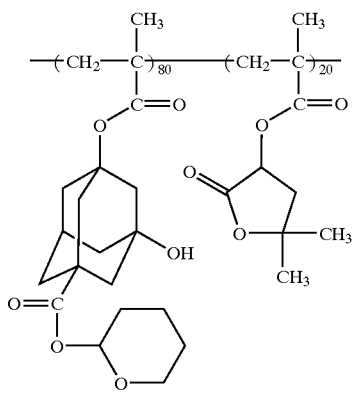

In an Erlenmeyer flask, 8.50 g (24.2 mmole) of monomer [1-6] (methacrylate), 1.13 g (6.07 mmole) of monomer [9-3] (methacrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.96 g of the target resin. The recovered polymer was subjected to GPC analysis to find that the polymer had a weight average molecular weight (Mw) of 7400 and a dispersion (Mw/Mn) of 2.26. In $^1$H-NMR (in DMSO-d6) spectrum, strong signals were observed at 0.8–2.4 (broad), 1.6, 1.9, 2.1, 4.6 and 5.3 ppm.

Example 14

Synthesis of Resin Having the Following Structure

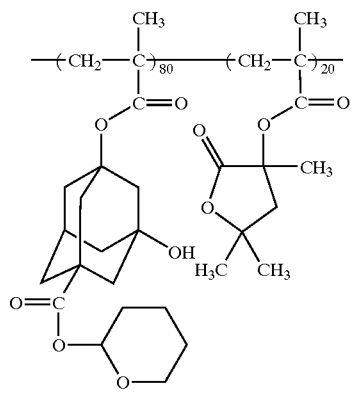

In an Erlenmeyer flask, 8.40 g (24.1 mmole) of monomer [1-6] (methacrylate), 1.10 g (6.04 mmole) of monomer [9-4] (methacrylate) and 0.95 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.77 g of the target resin. The recovered polymer was subjected to GPC analysis to find that the polymer had a weight average molecular weight (Mw) of 7800 and a dispersion (Mw/Mn) of 2.26. In $^1$H-NMR (in DMSO-d6) spectrum, signals were observed at 0.8–2.4 (broad), 1.6, 1.9, 2.1, 3.7, 3.9, 4.6 and 5.9 ppm.

Example 15

Synthesis of Resin Having the Following Structure

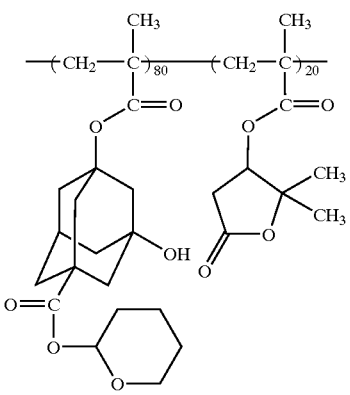

In an Erlenmeyer flask, 8.55 g (23.4 mmole) of monomer [1-6] (methacrylate), 1.08 g (5.87 mmole) of monomer [3-5] (methacrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.81 g of the target resin. The recovered polymer was subjected to GPC analysis to find that the polymer had a weight average molecular weight (Mw) of 9000 and a dispersion (Mw/Mn) of 2.14. In $^1$H-NMR (in DMSO-d6) spectrum, signals were observed at 0.8–2.4 (broad), 1.5, 1.9, 2.1, 4.6 and 5.3 ppm.

Example 16

Synthesis of Resin Having the Following Structure

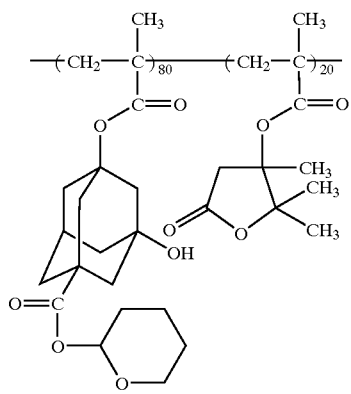

In an Erlenmeyer flask, 8.50 g (24.2 mmole) of monomer [1-6] (methacrylate), 1.13 g (6.07 mmole) of monomer [3-6] (methacrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.96 g of the target resin. The recovered polymer was subjected to GPC analysis to find that the polymer had a weight average molecular weight (Mw) of 8200 and a dispersion (Mw/Mn) of 2.19. In $^1$H-NMR (in DMSO-d6) spectrum, strong signals were observed at 0.8–2.4 (broad), 1.5, 1.9, 2.1, 3.8, 3.9, 4.6 and 5.9 ppm.

Example 17

Synthesis of Resin Having the Following Structure

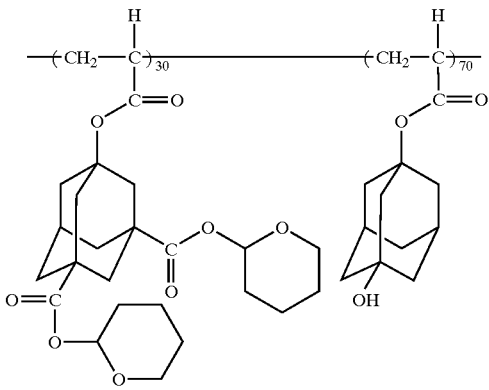

In an Erlenmeyer flask, 5.16 g (11.2 mmole) of monomer [1-5] (acrylate), 5.78 g (26.0 mmole) of monomer [5-1] (acrylate) and 1.13 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.66 g of the target resin. The recovered polymer was subjected to GPC analysis to find that the polymer had a weight average molecular weight (Mw) of 7600 and a dispersion (Mw/Mn) of 2.21. In $^1$H-NMR (in DMSO-d6) spectrum, signals were observed at 0.8–2.5 (broad), 1.6, 1.9, 2.1, 3.8, 3.9, 4.6 and 5.9 ppm.

Example 18

Synthesis of Resin Having the Following Structure

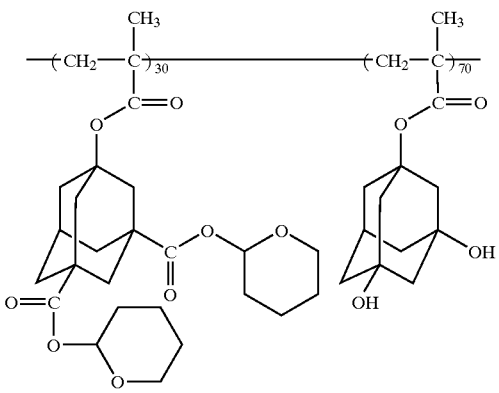

In an Erlenmeyer flask, 5.34 g (11.5 mmole) of monomer [1-5] (methacrylate), 6.01 g (27.0 mmole) of monomer [5-2] (methacrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.56 g of the target resin. The recovered polymer was subjected to GPC analysis to find that the polymer had a weight average molecular weight (Mw) of 9100 and a dispersion (Mw/Mn) of 2.18. In $^1$H-NMR (in DMSO-d6) spectrum, strong signals were observed at 0.8–2.5 (broad), 1.6, 1.9, 2.1, 4.6 and 5.9 ppm.

Example 19
Synthesis of Resin Having the Following Structure

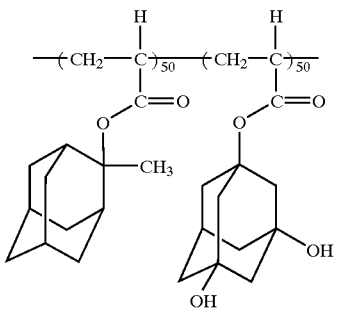

In an Erlenmeyer flask, 4.0 g (21.8 mmole) of monomer [2-1] (acrylate), 5.20 g (21.8 mmole) of monomer [3-2] (acrylate) and 0.92 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.41 g of the target resin. The recovered polymer was subjected to GPC analysis to find that the polymer had a weight average molecular weight (Mw) of 8000 and a dispersion (Mw/Mn) of 2.26. In $^1$H-NMR (in DMSO-d6) spectrum, strong signals were observed at 0.8–2.4 (broad), 1.6, 1.9, 2.1, 4.6 and 5.9 ppm.

Example 20
Synthesis of Resin Having the Following Structure

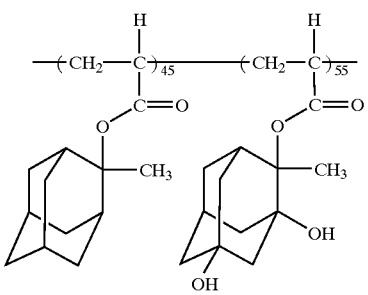

In an Erlenmeyer flask, 4.24 g (19.3 mmole) of monomer [2-1] (acrylate), 5.60 g (23.5 mmole) of monomer [2-5] (acrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.27 g of the target resin. The recovered polymer was subjected to GPC analysis to find that the polymer had a weight average molecular weight (Mw) of 8200 and a dispersion (Mw/Mn) of 2.2. In $^1$H-NMR (in DMSO-d6) spectrum, strong signals were observed at 0. 8–2.5 (broad), 1.6, 1.9, 2.1 and 4.6 ppm.

Example 21
Synthesis of Resin Having the Following Structure

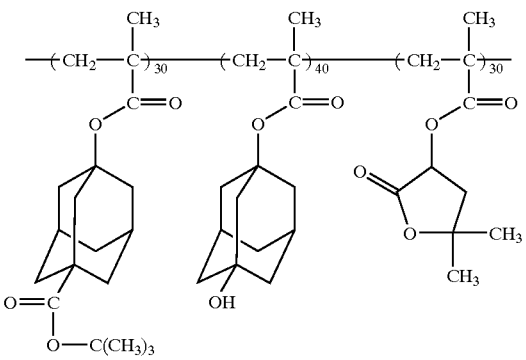

In an Erlenmeyer flask, 4.10 g (13.4 mmole) of monomer [1-1] (methacrylate), 3.97 g (26.0 mmole) of monomer [5-1] (methacrylate), 2.47 g (13.4 mmole) of monomer [9-3] (methacrylate) and 1.05 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.27 g of the target resin. The recovered polymer was subjected to GPC analysis to find that the polymer had a weight average molecular weight (Mw) of 8000 and a dispersion (Mw/Mn) of 2.30. In $^1$H-NMR (in DMSO-d6) spectrum, signals were observed at 0.8–2.4 (broad), 1.6, 1.9, 2.1, 4.7 and 5.6 ppm.

Example 22
Synthesis of Resin Having the Following Structure

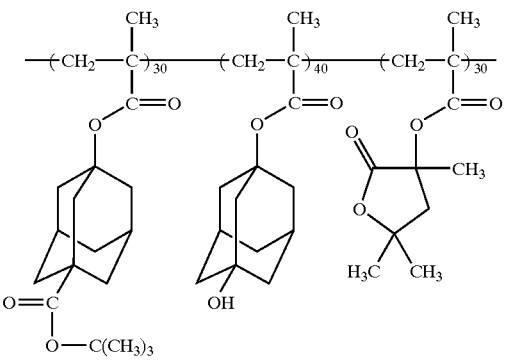

In a flask, 4.10 g (13.4 mmole) of monomer [1-1] (methacrylate), 3.97 g (26.0 mmole) of monomer [5-1]

(methacrylate), 2.65 g (13.4 mmole) of monomer [9-4] (methacrylate) and 1.05 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.19 g of the target resin. The recovered polymer was subjected to GPC analysis to find that the polymer had a weight average molecular weight (Mw) of 8000 and a dispersion (Mw/Mn) of 2.30. In $^1$H-NMR (in DMSO-d6) spectrum, signals were observed at 0.8–2.4 (broad), 1.6, 1.9, 2.1, 4.6, ppm.

Example 23

Synthesis of Resin Having the Following Structure

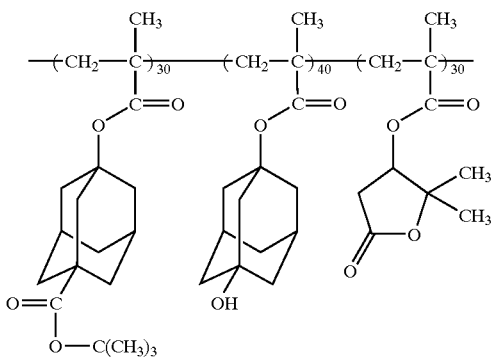

In an Erlenmeyer flask, 4.10 g (13.4 mmole) of monomer [1-1] (methacrylate), 3.97 g (26.0 mmole) of monomer [5-1] (methacrylate), 2.46 g (13.4 mmole) of monomer [3-5] (methacrylate) and 1.05 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.43 g of the target resin. The recovered polymer was subjected to GPC analysis to find that the polymer had a weight average molecular weight (Mw) of 8000 and a dispersion (Mw/Mn) of 2.30. In $^1$H-NMR (in DMSO-d6) spectrum, signals were observed at 0.8–2.4 (broad), 1.6, 1.9, 2.1, 4.6 and 5.3 ppm.

Example 24

Synthesis of Resin Having the Following Structure

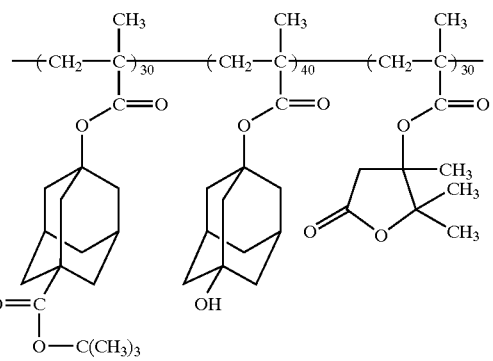

In an Erlenmeyer flask, 4.04 g (13.4 mmole) of monomer [1-1] (methacrylate), 3.97 g (26.0 mmole) of monomer [3-1] (methacrylate), 2.65 g (13.4 mmole) of monomer [3-6] (methacrylate) and 1.05 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.66 g of the target resin. The recovered polymer was subjected to GPC analysis to find that the polymer had a weight average molecular weight (Mw) of 8000 and a dispersion (Mw/Mn) of 2.30. In $^1$H-NMR (in DMSO-d6) spectrum, signals were observed at 0.8–2.4 (broad), 1.6, 1.9, 2.1, 4.6 and 5.3 ppm.

Example 25

Synthesis of Resin Having the Following Structure

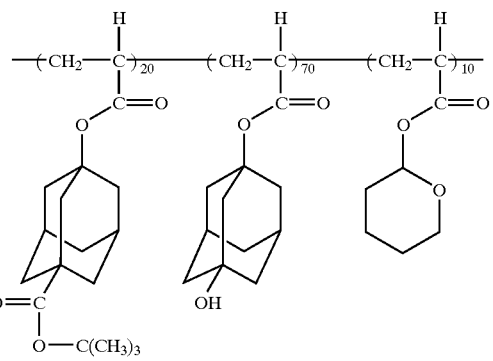

In an Erlenmeyer flask, 2.75 g (9.0 mmole) of monomer [1-1] (acrylate), 6.98 g (31.4 mmole) of monomer [5-1] (acrylate), 0.76 g (13.4 mmole) of monomer [10-1] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.28 g of the target resin. The recovered polymer was subjected to GPC analysis to find that the polymer had a weight average molecular weight (Mw) of 8000 and a dispersion (Mw/Mn) of 2.30. In $^1$H-NMR (in DMSO-d6) spectrum, signals were observed at 0.8-2.4 (broad), 1.6, 1.9, 2.1, 3.8, 3.9, 4.6 and 5.9 ppm.

Example 26

Synthesis of Resin Having the Following Structure

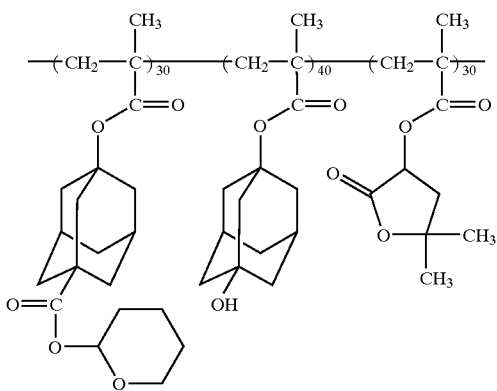

In an Erlenmeyer flask, 4.02 g (11.0 mmole) of monomer [1-4] (methacrylate), 3.47 g (14.7 mmole) of monomer [5-1] (methacrylate), 2.19 g (11.0 mmole) of monomer [9-3] (methacrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.53 g of the target resin. The recovered polymer was subjected to GPC analysis to find that the polymer had a weight average molecular weight (Mw) of 8600 and a dispersion (Mw/Mn) of 2.30. In $^1$H-NMR (in DMSO-d6) spectrum, signals were observed at 0.8–2.4 (broad), 1.6, 1.9, 2.1, 3.8, 3.9, 4.6, 5.3 and 5.9 ppm.

Example 27
Synthesis of Resin Having the Following Structure

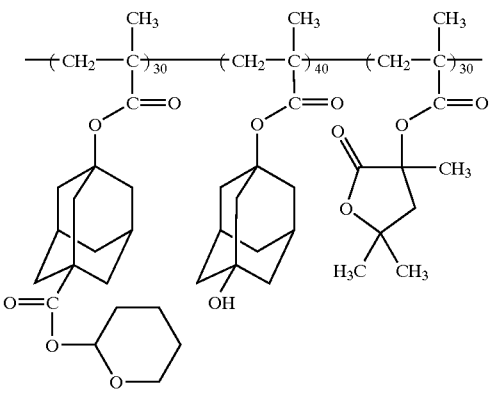

In an Erlenmeyer flask, 4.02 g (11.0 mmole) of monomer [1-4] (methacrylate), 3.47 g (14.7 mmole) of monomer [5-1] (methacrylate), 2.19 g (11.0 mmole) of monomer [9-4] (methacrylate) and 0.96 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.26 g of the target resin. The recovered polymer was subjected to GPC analysis to find that the polymer had a weight average molecular weight (Mw) of 8200 and a dispersion (Mw/Mn) of 2.30. In $^1$H-NMR (in DMSO-d6) spectrum, signals were observed at 0.8–2.4 (broad), 1.5, 1.9, 2.1, 3.8, 3.9, 4.6 and 5.9 ppm.

Example 28
Synthesis of Resin Having the Following Structure

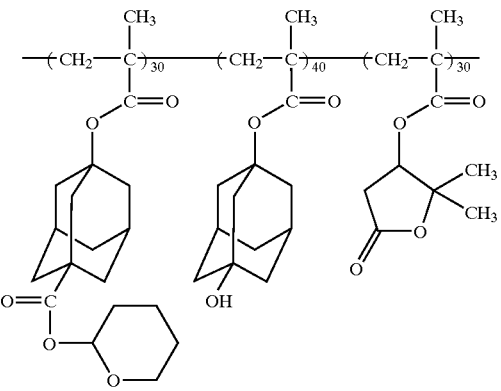

In an Erlenmeyer flask, 4.20 g (11.5 mmole) of monomer [1-4] (methacrylate), 3.63 (15.3 mmole) of monomer [5-1] (methacrylate), 2.28 g (11.5 mmole) of monomer [3-5] (methacrylate) and 1.01 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.26 g of the target resin. The recovered polymer was subjected to GPC analysis to find that the polymer had a weight average molecular weight (Mw) of 8200 and a dispersion (Mw/Mn) of 2.30. In $^1$H-NMR (in DMSO-d6) spectrum, signals were observed at 0.8–2.4 (broad), 1.6, 1.9, 2.1, 3.8, 3.9, 4.64, 5.3 and 5.9 ppm.

Example 29

Synthesis of Resin Having the Following Structure

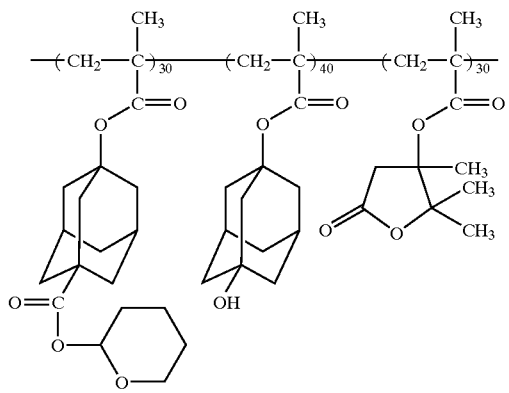

In an Erlenmeyer flask, 4.20 g (11.5 mmole) of monomer [1-4] (methacrylate), 3.63 g (15.3 mmole) of monomer [5-1] (methacrylate), 2.28 g (11.5 mmole) of monomer [3-6] (methacrylate) and 1.01 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.55 g of the target resin. The recovered polymer was subjected to GPC analysis to find that the polymer had a weight average molecular weight (Mw) of 8700 and a dispersion (Mw/Mn) of 2.42. In $^1$H-NMR (in DMSO-d6) spectrum, signals were observed at 0.8–2.4 (broad), 1.5, 1.9, 2.1, 3.8, 3.9, 4.6 and 5.9 ppm.

Example 30

Synthesis of Resin Having the Following Structure

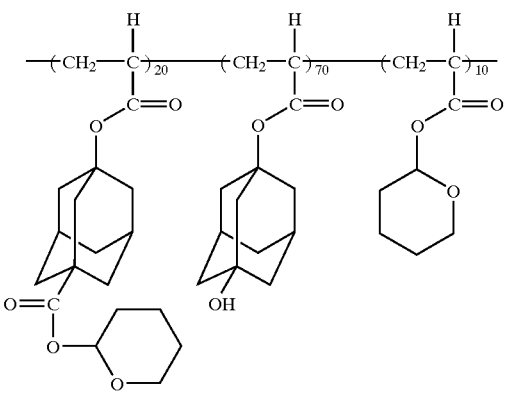

In an Erlenmeyer flask, 2.69 g (8.8 mmole) of monomer [1-4] (acrylate), 6.84 g (30.8 mmole) of monomer [5-1] (acrylate), 0.74 g (4.4 mmole) of monomer [10-1] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.79 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.6, 1.9, 2.1, 3.8, 3.9, 4.6 and 5.9 ppm.

Example 31

Synthesis of Resin Having the Following Structure

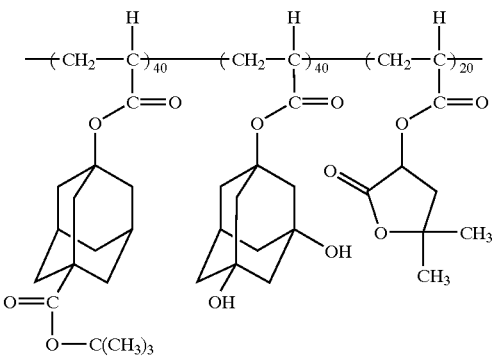

In an Erlenmeyer flask, 2.69 g (8.8 mmole) of monomer [1-1] (acrylate), 6.84 g (30.8 mmole) of monomer [5-2] (acrylate), 0.74 g (4.4 mmole) of monomer [9-3] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.61 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.6, 1.9, 2.1, 3.7, 3.8, 4.6 and 5.9 ppm.

Example 32

Synthesis of Resin Having the Following Structure

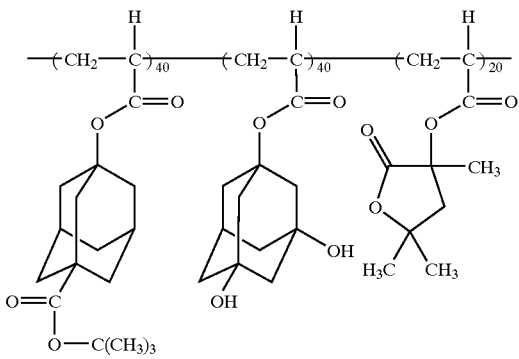

In an Erlenmeyer flask, 5.51 g (18.0 mmole) of monomer [1-1] (acrylate), 4.00 g (18.0 mmole) of monomer [5-2] (acrylate), 1.76 g (9.0 mmole) of monomer [9-4] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.47 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.5, 1.9, 2.1, 3.8, 3.9, 4.6 and 5.9 ppm.

Example 33

Synthesis of Resin Having the Following Structure

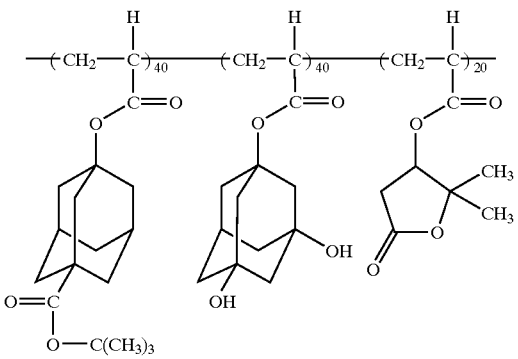

In an Erlenmeyer flask, 4.95 g (16.2 mmole) of monomer [1-1] (acrylate), 3.6 g (16.2 mmole) of monomer [5-2] (acrylate), 1.59 g (8.1 mmole) of monomer [3-5] (acrylate) and 1.00 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.92 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.6, 1.9, 2.1, 3.8, 3.9, 4.6 and 5.9 ppm.

Example 34

Synthesis of Resin Having the Following Structure

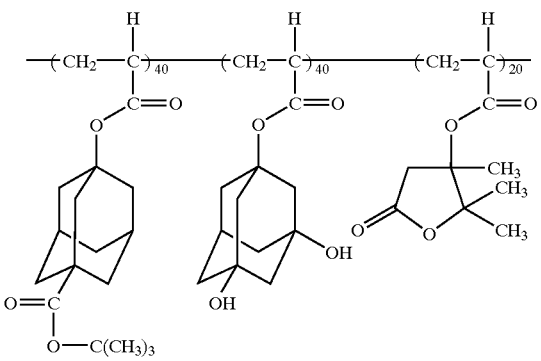

In an Erlenmeyer flask, 4.49 (14.7 mmole) of monomer [1-1] (acrylate), 3.5 g (14.7 mmole) of monomer [5-2] (acrylate), 1.56 g (7.4 mmole) of monomer [3-6] (acrylate) and 1.01 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.81 g of the target resin. The recovered polymer was subjected to GPC analysis to find that the polymer had a weight average molecular weight (Mw) of 8700 and a dispersion (Mw/Mn) of 2.31. In $^1$H-NMR (in DMSO-d6) spectrum, signals were observed at 0.8–2.4 (broad), 1.6, 1.9, 2.2, 3.7, 3.8, 4.6 and 5.9 ppm.

Example 35

Synthesis of Resin Having the Following Structure

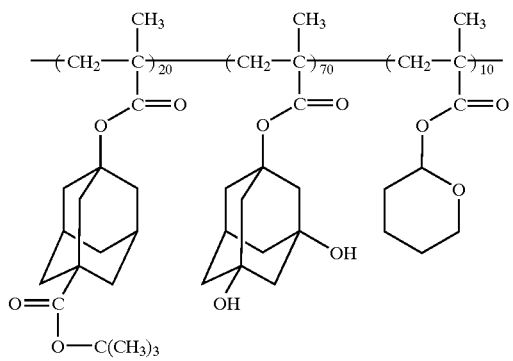

In an Erlenmeyer flask, 3.22 g (10.0 mmole) of monomer [1-1] (methacrylate), 6.50 g (35.3 mmole) of monomer [5-2] (methacrylate), 0.93 g (5.0 mmole) of monomer [10-1] (methacrylate) and 1.06 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.12 g of the target resin. The recovered polymer was subjected to GPC analysis to find that the polymer had a weight average molecular weight (Mw) of 8500 and a dispersion (Mw/Mn) of 2.40. In $^1$H-NMR (in DMSO-d6) spectrum, signals were observed at 0.8–2.4 (broad), 1.6, 1.9, 2.1, 3.8, 3.9, 4.6 and 5.9 ppm.

Example 36

Synthesis of Resin Having the Following Structure

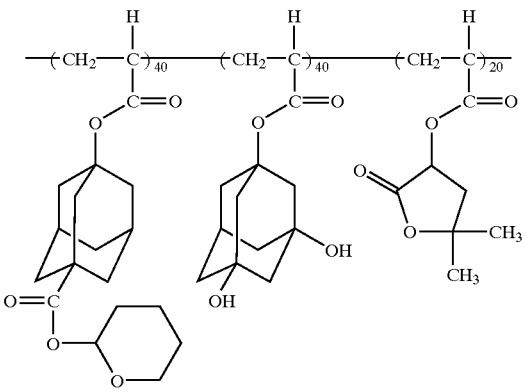

In an Erlenmeyer flask, 5.51 g (18.0 mmole) of monomer [1-4] (acrylate), 4.00 g (18.0 mmole) of monomer [5-2] (acrylate), 1.76 g (9.0 mmole) of monomer [9-3] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.25 g of the target resin. The recovered polymer was subjected to GPC analysis to find that the polymer had a weight average molecular weight (Mw) of 9000 and a dispersion (Mw/Mn) of 2.03. In $^1$H-NMR (in DMSO-d6) spectrum, signals were observed at 0.8–2.4 (broad), 1.6, 1.9, 2.1, 3.8, 3.9, 4.6, 5.3 and 5.9 ppm.

Example 37

Synthesis of Resin Having the Following Structure

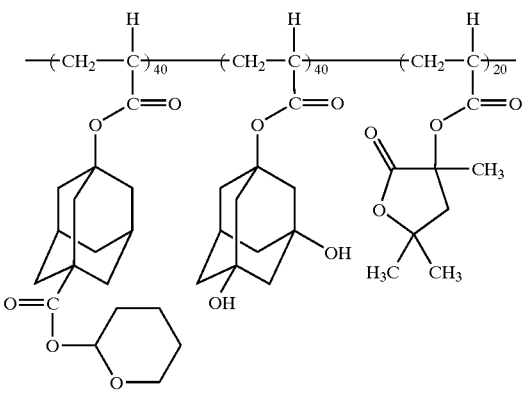

In an Erlenmeyer flask, 5.19 g (15.5 mmole) of monomer [1-4] (acrylate), 3.70 g (15.5 mmole) of monomer [5-2] (acrylate), 1.53 g (7.8 mmole) of monomer [9-4] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.61 g of the target resin. The recovered polymer was subjected to GPC analysis to find that the polymer had a weight average molecular weight (Mw) of 8900 and a dispersion (Mw/Mn) of 2.14. In $^1$H-NMR (in DMSO-d6) spectrum, signals were observed at 0.8–2.4 (broad), 1.5, 1.9, 2.1, 3.8, 3.9, 4.6 and 5.9 ppm.

Example 38

Synthesis of Resin Having the Following Structure

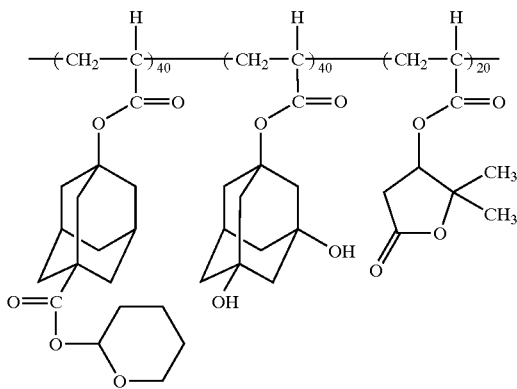

In an Erlenmeyer flask, 5.51 g (18.0 mmole) of monomer [1-4] (acrylate), 4.00 g (18.0 mmole) of monomer [5-2] (acrylate), 1.76 g (9.0 mmole) of monomer [3-5] (acrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.39 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.6, 1.9, 2.1, 3.8, 3.9, 4.6 and 5.9 ppm.

Example 39
Synthesis of Resin Having the Following Structure

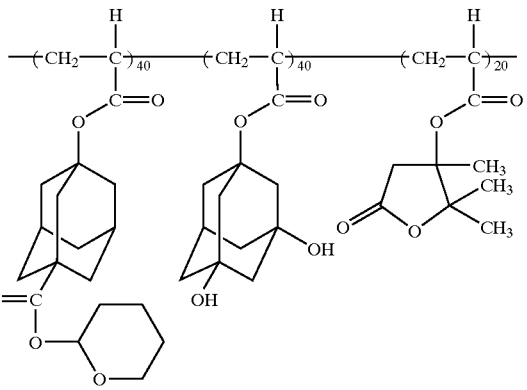

In an Erlenmeyer flask, 5.33 g (16.0 mmole) of monomer [1-4] (acrylate), 3.80 g (16.0 mmole) of monomer [5-2] (acrylate), 1.56 g (8.0 mmole) of monomer [3-6] (acrylate) and 1.06 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.66 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.6, 1.9, 2.1, 3.8, 3.9, 4.6 and 5.9 ppm.

Example 40
Synthesis of Resin Having the Following Structure

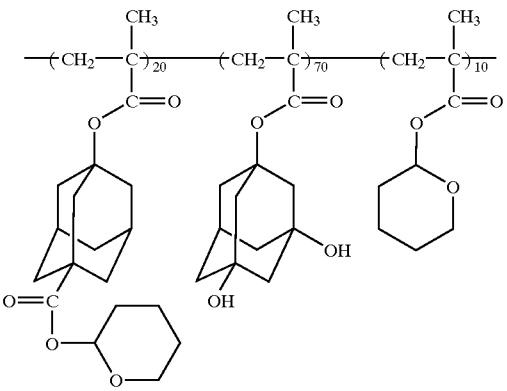

In an Erlenmeyer flask, 3.51 g (10.0 mmole) of monomer [1-4] (methacrylate), 6.50 g (35.3 mmole) of monomer [5-2] (methacrylate), 0.52 g (5.0 mmole) of monomer [10-1] (methacrylate) and 1.10 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.37 g of the target resin. The recovered polymer was subjected to GPC analysis to find that the polymer had a weight average molecular weight (Mw) of 9500 and a dispersion (Mw/Mn) of 2.46. In $^1$H-NMR (in DMSO-d6) spectrum, signals were observed at 0.8–2.4 (broad), 1.6, 1.9, 2.1, 3.8, 3.9, 4.6 and 5.9 ppm.

Example 41

Synthesis of Resin Having the Following Structure

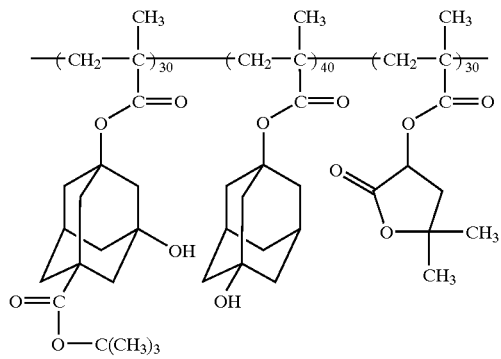

In an Erlenmeyer flask, 3.64 g (11.3 mmole) of monomer [1-3] (methacrylate), 3.56 g (15.1 mmole) of monomer [5-1] (methacrylate), 2.23 g (11.3 mmole) of monomer [9-3] (methacrylate) and 0.94 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.29 g of the target resin. The recovered polymer was subjected to GPC analysis to find that the polymer had a weight average molecular weight (Mw) of 7900 and a dispersion (Mw/Mn) of 2.08. In $^1$H-NMR (in DMSO-d6) spectrum, signals were observed at 0.8–2.4 (broad), 1.6, 1.9, 2.1, 3.8, 3.9, 4.6 and 5.9 ppm.

Example 42

Synthesis of Resin Having the Following Structure

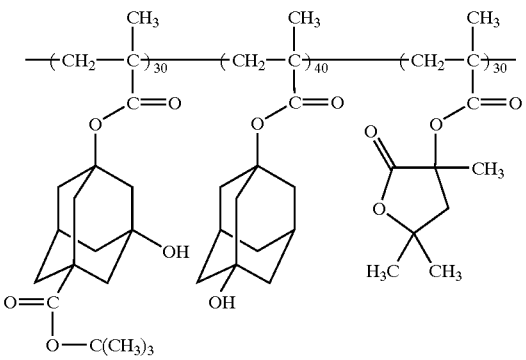

In an Erlenmeyer flask, 3.86 g (11.5 mmole) of monomer [1-3] (methacrylate), 3.63 g (15.4 mmole) of monomer [5-1] (methacrylate), 2.46 g (11.5 mmole) of monomer [9-4] (methacrylate) and 0.99 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.06 g of the target resin. The recovered polymer was subjected to GPC analysis to find that the polymer had a weight average molecular weight (Mw) of 7900 and a dispersion (Mw/Mn) of 2.08. In $^1$H-NMR (in DMSO-d6) spectrum, signals were observed at 0.8–2.4 (broad), 1.6, 1.9, 2.1, 3.6 and 4.6 ppm.

Example 43

Synthesis of Resin Having the Following Structure

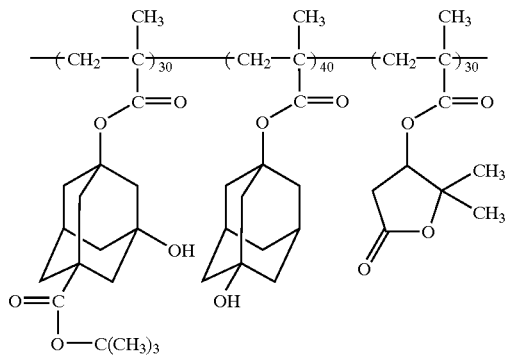

In an Erlenmeyer flask, 4.27 g (12.7 mmole) of monomer [1-3] (methacrylate), 4.00 g (17.0 mmole) of monomer [5-1] (methacrylate), 2.51 g (12.7 mmole) of monomer [3-5] (methacrylate) and 1.07 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.43 g of the target resin. The recovered polymer was subjected to GPC analysis to find that the polymer had a weight average molecular weight (Mw) of 7700 and a dispersion (Mw/Mn) of 2.07. In $^1$H-NMR (in DMSO-d6) spectrum, signals were observed at 0.8–2.4 (broad), 1.6, 1.9, 2.1, 3.8, 4.6 and 5.3 ppm.

Example 44

Synthesis of Resin Having the Following Structure

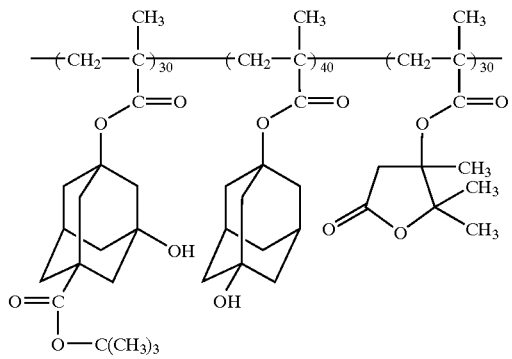

In an Erlenmeyer flask, 3.85 g (11.2 mmole) of monomer [1-3] (methacrylate), 3.6 g (16.3 mmole) of monomer [5-1] (methacrylate), 2.26 g (11.2 mmole) of monomer [3-6] (methacrylate) and 1.07 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.12 g of the target resin. The recovered polymer was subjected to GPC analysis to find that the polymer had a weight average molecular weight (Mw) of 7500 and a dispersion (Mw/Mn) of 1.98. In $^1$H-NMR (in DMSO-d6) spectrum, signals were observed at 0.8–2.4 (broad), 1.5, 1.9, 2.1, 3.8 and 5.3 ppm.

Example 45

Synthesis of Resin Having the Following Structure

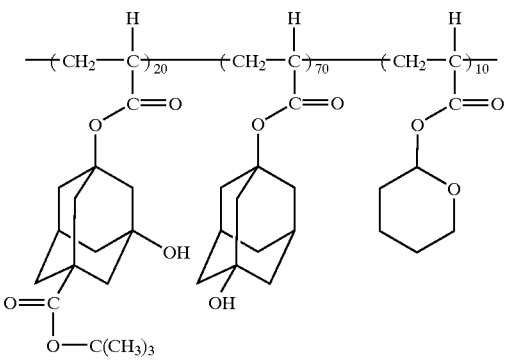

In an Erlenmeyer flask, 2.65 g (8.2 mmole) of monomer [1-3] (acrylate), 6.4 g (28.8 mmole) of monomer [5-1] (acrylate), 0.70 g (4.1 mmole) of monomer [10-1] (acrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.86 g of the target resin. The recovered polymer was subjected to GPC analysis to find that the polymer had a weight average molecular weight (Mw) of 8500 and a dispersion (Mw/Mn) of 2.40. In $^1$H-NMR (in DMSO-d6) spectrum, signals were observed at 0.8–2.4 (broad), 1.5, 1.9, 2.1, 3.8, 3.9, 4.6 and 5.9 ppm.

Example 46

Synthesis of Resin Having the Following Structure

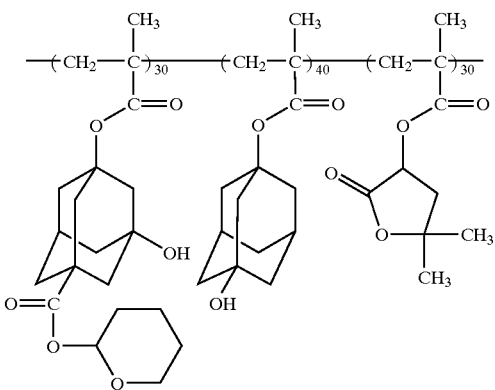

In an Erlenmeyer flask, 4.40 g (12.0 mmole) of monomer [1-6] (methacrylate), 3.80 g (16.1 mmole) of monomer [5-1] (methacrylate), 2.39 g (12.0 mmole) of monomer [9-3] (methacrylate) and 1.05 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.58 g of the target resin. The recovered polymer was subjected to GPC analysis to find that the polymer had a weight average molecular weight (Mw) of 7900 and a dispersion (Mw/Mn) of 2.21. In $^1$H-NMR (in DMSO-d6) spectrum, signals were observed at 0.8–2.4 (broad), 1.6, 1.9, 2.1, 3.8, 3.9, 4.6, 5.3 and 5.9 ppm.

Example 47

Synthesis of Resin Having the Following Structure

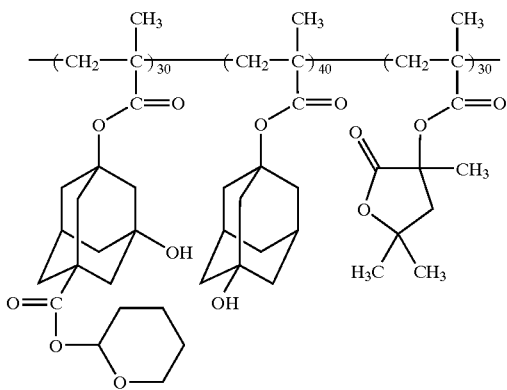

In an Erlenmeyer flask, 4.18 g (11.4 mmole) of monomer [1-6] (methacrylate), 3.62 g (15.3 mmole) of monomer [5-1] (methacrylate), 2.39 g (11.4 mmole) of monomer [9-4] (methacrylate) and 0.99 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.61 g of the target resin. The recovered polymer was subjected to GPC analysis to find that the polymer had a weight average molecular weight (Mw) of 8100 and a dispersion (Mw/Mn) of 2.28. In $^1$H-NMR (in DMSO-d6) spectrum, signals were observed at 0.8–2.4 (broad), 1.6, 1.9, 2.1, 3.8, 3.9, 4.6 and 5.9 ppm.

Example 48
Synthesis of Resin Having the Following Structure

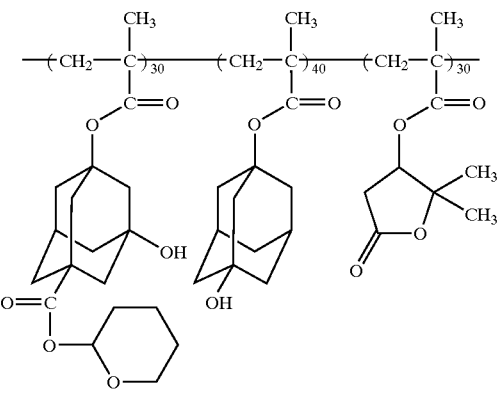

In an Erlenmeyer flask, 4.18 g (11.4 mmole) of monomer [1-6] (methacrylate), 3.62 g (15.3 mmole) of monomer [5-1] (methacrylate), 2.39 g (11.4 mmole) of monomer [3-5] (methacrylate) and 0.99 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.99 g of the target resin. The recovered polymer was subjected to GPC analysis to find that the polymer had a weight average molecular weight (Mw) of 8100 and a dispersion (Mw/Mn) of 2.28. In $^1$H-NMR (in DMSO-d6) spectrum, signals were observed at 0.8–2.4 (broad), 1.5, 1.9, 2.1, 3.8, 3.9, 4.6 and 5.9 ppm.

Example 49
Synthesis of Resin Having the Following Structure

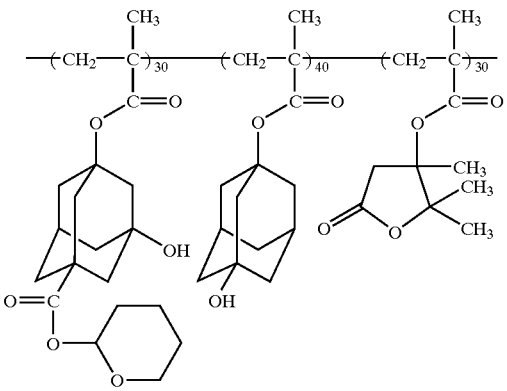

In an Erlenmeyer flask, 4.18 g (11.7 mmole) of monomer [1-6] (methacrylate), 3.68 g (15.6 mmole) of monomer [5-1] (methacrylate), 2.48 g (11.7 mmole) of monomer [3-6] (methacrylate) and 1.02 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.61 g of the target resin. The recovered polymer was subjected to GPC analysis to find that the polymer had a weight average molecular weight (Mw) of 8500 and a dispersion (Mw/Mn) of 2.36. In $^1$H-NMR (in DMSO-d6) spectrum, signals were observed at 0.8–2.4 (broad), 1.6, 1.9, 2.1, 3.8, 3.9, 4.6, 5.3 and 5.9 ppm.

Example 50

Synthesis of Resin Having the Following Structure

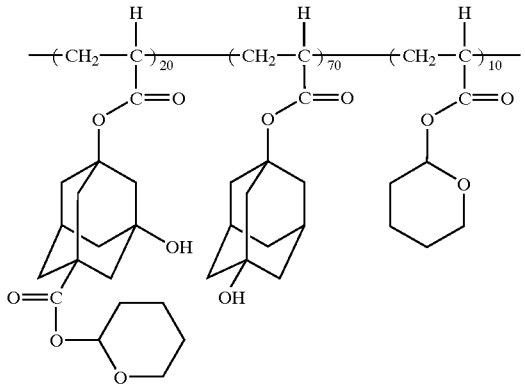

In an Erlenmeyer flask, 2.65 g (8.2 mmole) of monomer [1-6] (acrylate), 6.4 g (28.8 mmole) of monomer [5-1] (acrylate), 0.70 g (4.1 mmole) of monomer [10-1] (acrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.38 g of the target resin. The recovered polymer was subjected to GPC analysis to find that the polymer had a weight average molecular weight (Mw) of 9500 and a dispersion (Mw/Mn) of 2.51. In $^1$H-NMR (in DMSO-d6) spectrum, signals were observed at 0.8–2.4 (broad), 1.6, 1.9, 2.1, 3.8, 3.9, 4.6 and 5.9 ppm.

Example 51
Synthesis of Resin Having the Following Structure

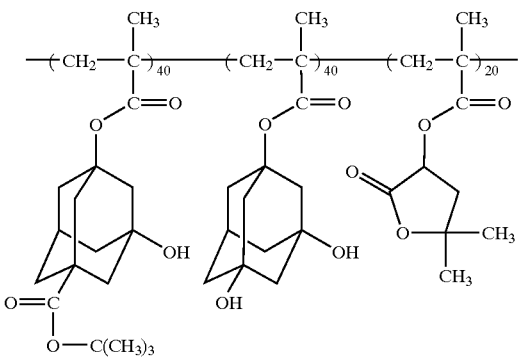

In an Erlenmeyer flask, 5.51 g (18.0 mmole) of monomer [1-3] (methacrylate), 4.00 g (18.0 mmole) of monomer [5-2] (methacrylate), 1.76 g (9.0 mmole) of monomer [9-3] (methacrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.12 g of the target resin. The recovered polymer was subjected to GPC analysis to find that the polymer had a weight average molecular weight (Mw) of 9200 and a dispersion (Mw/Mn) of 2.40. In $^1$H-NMR (in DMSO-d6) spectrum, signals were observed at 0.8–2.4 (broad), 1.5, 1.9, 2.1, 3.8, 3.9, 4.6 and 5.3 ppm.

Example 52
Synthesis of Resin Having the Following Structure

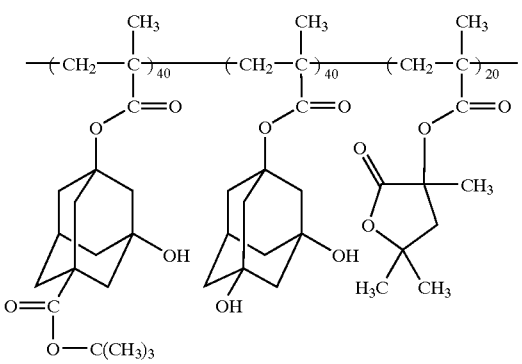

In an Erlenmeyer flask, 5.64 g (16.8 mmole) of monomer [1-3] (methacrylate), 4.23 g (16.8 mmole) of monomer [5-2] (methacrylate), 1.78 g (8.4 mmole) of monomer [9-4] (methacrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.98 g of the target resin. The recovered polymer was subjected to GPC analysis to find that the polymer had a weight average molecular weight (Mw) of 8800 and a dispersion (Mw/Mn) of 2.31. In $^1$H-NMR (in DMSO-d6) spectrum, signals were observed at 0.8–2.4 (broad), 1.6, 1.9, 2.1 and 4.6 ppm.

Example 53

Synthesis of Resin Having the Following Structure

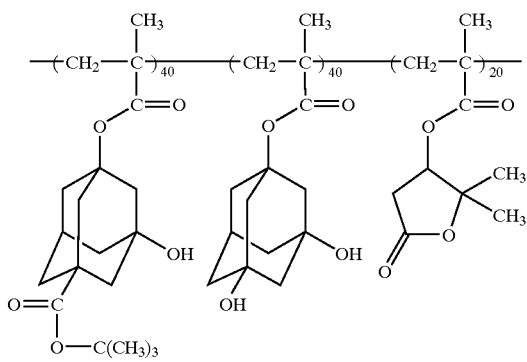

In an Erlenmeyer flask, 5.51 g (18.0 mmole) of monomer [1-3] (methacrylate), 4.00 g (18.0 mmole) of monomer [5-2] (methacrylate), 1.76 g (9.0 mmole) of monomer [3-5] (methacrylate) and 1.03 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.61 g of the target resin. The recovered polymer was subjected to GPC analysis to find that the polymer had a weight average molecular weight (Mw) of 9000 and a dispersion (Mw/Mn) of 2.35. In $^1$H-NMR (in DMSO-d6) spectrum, signals were observed at 0.8–2.4 (broad), 1.6, 1.9, 2.1, 4.6, 5.3 and 5.9 ppm.

Example 54
Synthesis of Resin Having the Following Structure

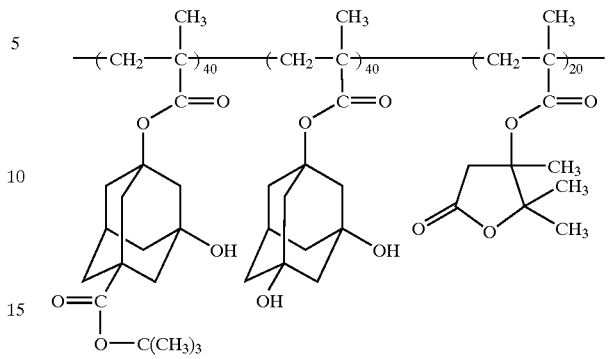

In an Erlenmeyer flask, 4.89 g (14.6 mmole) of monomer [1-3] (methacrylate), 3.67 g (14.6 mmole) of monomer [5-2] (methacrylate), 1.55 g (7.3 mmole) of monomer [3-6] (methacrylate) and 1.01 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.72 g of the target resin. The recovered polymer was subjected to GPC analysis to find that the polymer had a weight average molecular weight (Mw) of 9200 and a dispersion (Mw/Mn) of 2.39. In $^1$H-NMR (in DMSO-d6) spectrum, signals were observed at 0.8–2.4 (broad), 1.6, 1.9, 2.1, 4.2 and 4.6 ppm.

Example 55
Synthesis of Resin Having the Following Structure

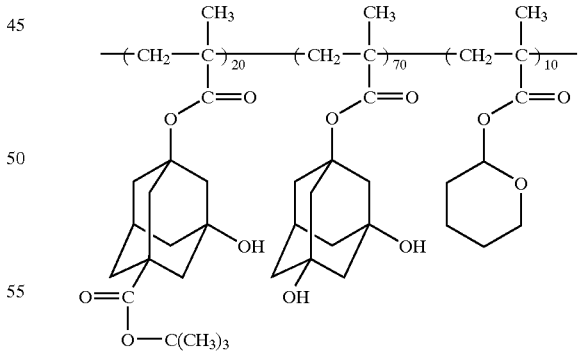

In an Erlenmeyer flask, 2.65 g (8.2 mmole) of monomer [1-3] (methacrylate), 6.4 g (28.8 mmole) of monomer [5-2] (methacrylate), 0.70 g (4.1 mmole) of monomer [10-1] (methacrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.33 g of the target resin. The recovered polymer was subjected to GPC analysis to find that the polymer had a weight average molecular weight (Mw) of 8900 and a dispersion (Mw/Mn) of 2.19. In $^1$H-NMR (in DMSO-d6) spectrum, signals were observed at 0.8–2.4 (broad), 1.5, 1.9, 2.1, 3.8, 3.9, 4.6 and 5.9 ppm.

Example 56

Synthesis of Resin Having the Following Structure

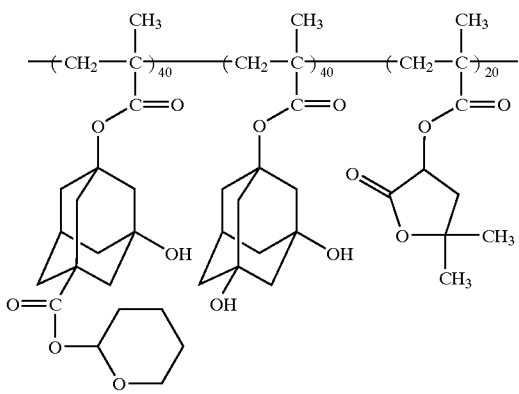

In an Erlenmeyer flask, 5.42 g (14.9 mmole) of monomer [1-6] (methacrylate), 3.75 g (14.9 mmole) of monomer [5-2] (methacrylate), 1.47 g (7.5 mmole) of monomer [9-3] (methacrylate) and 1.16 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.53 g of the target resin. The recovered polymer was subjected to GPC analysis to find that the polymer had a weight average molecular weight (Mw) of 9600 and a dispersion (Mw/Mn) of 2.43. In $^1$H-NMR (in DMSO-d6) spectrum, signals were observed at 0.8–2.4 (broad), 1.5, 1.9, 2.1, 3.8, 3.9, 4.6 and 5.9 ppm.

Example 57
Synthesis of Resin Having the Following Structure

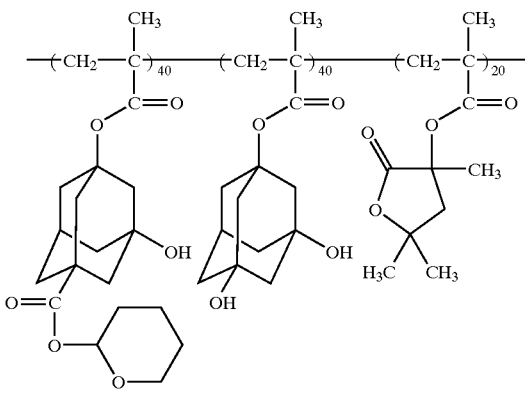

In an Erlenmeyer flask, 5.81 g (15.9 mmole) of monomer [1-6] (methacrylate), 4.02 g (15.9 mmole) of monomer [5-2] (methacrylate), 169 g (8.0 mmole) of monomer [9-4] (methacrylate) and 1.11 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.49 g of the target resin. The recovered polymer was subjected to GPC analysis to find that the polymer had a weight average molecular weight (Mw) of 9600 and a dispersion (Mw/Mn) of 2.48. In $^1$H-NMR (in DMSO-d6) spectrum, signals were observed at 0.8–2.4 (broad), 1.6, 1.9, 2.1, 3.8, 3.9, 4.6 and 5.9 ppm.

Example 58
Synthesis of Resin Having the Following Structure

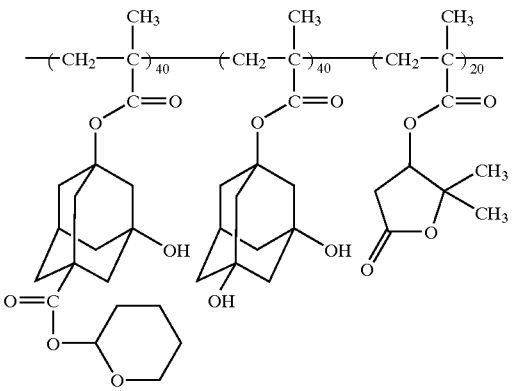

In an Erlenmeyer flask, 5.49 g (15.1 mmole) of monomer [1-6] (methacrylate), 3.80 g (15.1 mmole) of monomer [5-2] (methacrylate), 1.50 g (7.6 mmole) of monomer [3-5] (methacrylate) and 1.21 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.61 g of the target resin. The recovered polymer was subjected to GPC analysis to find that the polymer had a weight average molecular weight (Mw) of 9800 and a dispersion (Mw/Mn) of 2.41. In $^1$H-NMR (in DMSO-d6) spectrum, signals were observed at 0.8–2.4 (broad), 1.6, 1.9, 2.1, 3.8, 3.9, 4.6, 5.3 and 5.9 ppm.

Example 59

Synthesis of Resin Having the Following Structure

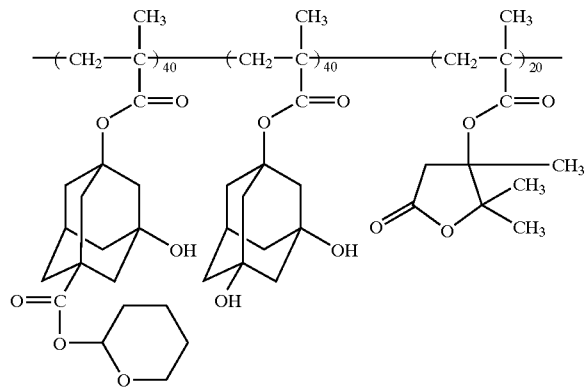

In an Erlenmeyer flask, 5.13 g (14.1 mmole) of monomer [1-6] (methacrylate), 3.55 g (14.1 mmole) of monomer [5-2] (methacrylate), 1.50 g (7.1 mmole) of monomer [3-6] (methacrylate) and 1.01 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.61 g of the target resin. The recovered polymer was subjected to GPC analysis to find that the polymer had a weight average molecular weight (Mw) of 9800 and a dispersion (Mw/Mn) of 2.41. In $^1$H-NMR (in DMSO-d6) spectrum, signals were observed at 0.8–2.4 (broad), 1.5, 1.9, 2.1, 3.8, 3.9, 4.3, 4.6 and 5.9 ppm.

Example 60

Synthesis of Resin Having the Following Structure

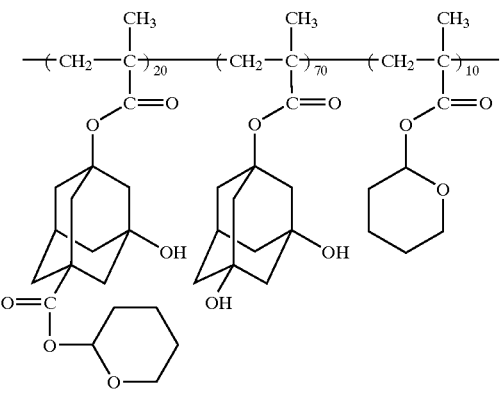

In an Erlenmeyer flask, 2.65 g (7.3 mmole) of monomer [1-6] (methacrylate), 6.4 g (25.5 mmole) of monomer [5-2] (methacrylate), 0.67 g (3.7 mmole) of monomer [10-1] (methacrylate) and 0.98 g of an initiator ("V-65" produced by Wako Pure Chemical Industries, Ltd.) were placed, and were completely dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.33 g of the target resin. The recovered polymer was subjected to GPC analysis to find that the polymer had a weight average molecular weight (Mw) of 9500 and a dispersion (Mw/Mn) of 2.51. In $^1$H-NMR (in DMSO-d6) spectrum, signals were observed at 0.8–2.4 (broad), 1.6, 1.9, 2.1, 3.8, 3.9, 4.6 and 5.9 ppm.

Example 61

Synthesis of Resin Having the Following Structure

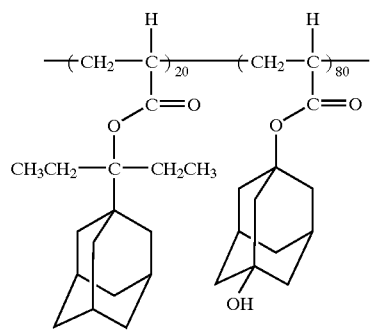

In an Erlenmeyer flask, 2.22 g (7.7 mmole) of monomer [4-1] (acrylate), 7.25 g (30.7 mmole) of monomer [6-1] (acrylate) and 0.95 g of an initiator ("V-65" produced by Wako Pure Chemical Industries, Ltd.) were placed, and were dissolved in 25 g of THF (tetrahydrofuran) to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.15 g of the target resin. The recovered polymer was subjected to GPC analysis to find that the polymer had a weight average molecular weight (Mw) of 7500 and a dispersion (Mw/Mn) of 2.05. In $^1$H-NMR (in DMSO-d6) spectrum, signals were observed at 0.8–2.4 (broad), 1.5, 1.9, 2.1 and 4.6 ppm.

Example 62
Synthesis of Resin Having the Following Structure

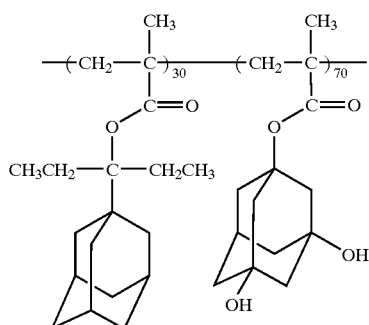

In an Erlenmeyer flask, 3.53 g (12.2 mmole) of monomer [4-1] (methacrylate), 7.17 g (28.4 mmole) of monomer [6-2] (methacrylate) and 1.07 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.82 g of the target resin. The recovered polymer was subjected to GPC analysis to find that the polymer had Mw of 8100 and a dispersion (Mw/Mn) of 2.32. In 1H-NMR (in DMSO-d6) spectrum, signals were observed at 0.8–2.4 (broad), 1.6, 1.9, 2.1 and 4.6 ppm.

Example 63
Synthesis of Resin Having the Following Structure

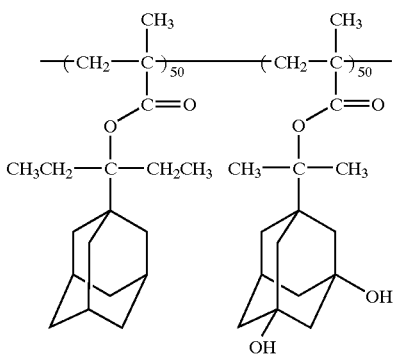

In an Erlenmeyer flask, 5.20 g (18.0 mmole) of monomer [4-1] (methacrylate), 5.27 g (18.0 mmole) of monomer [6-9] (methacrylate) and 1.05 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 6.82 g of the target resin. The recovered polymer was subjected to GPC analysis to find that the polymer had Mw of 8300 and a dispersion (Mw/Mn) of 2.18. In $^1$H-NMR (in DMSO-d6) spectrum, signals were observed at 0.8–2.4 (broad), 1.6, 1.9, 2.1 and 4.6 ppm.

Example 64

Synthesis of Resin Having the Following Structure

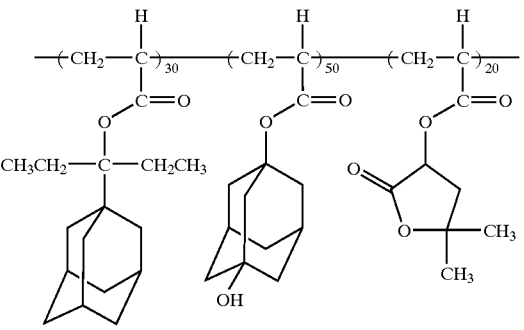

In an Erlenmeyer flask, 4.09 g (15.5 mmole) of monomer [4-1] (acrylate), 5.55 g (25.0 mmole) of monomer [6-1] (acrylate), 1.86 g (10.1 mmole) of monomer [9-3] (acrylate) and 1.15 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure wasrepeated once again to yield 7.87 g of the target resin. The recovered polymer was subjected to GPC analysis to find that the polymer had Mw of 7800 and a dispersion (Mw/Mn) of 1.97. In $^1$H-NMR (in DMSO-d6) spectrum, signals were observed at 0.8–2.9 (broad), 1.6, 1.9, 2.1, 4.6 and 5.3 ppm.

Example 65
Synthesis of Resin Having the Following Structure

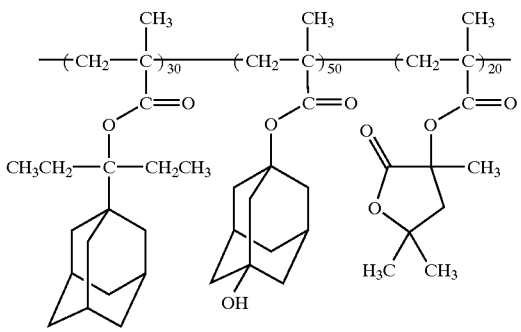

In an Erlenmeyer flask, 3.90 g (13.4 mmole) of monomer [4-1] (methacrylate), 5.28 g (22.4 mmole) of monomer [6-1] (methacrylate), 1.90 g (9.0 mmole) of monomer [9-4] (methacrylate) and 1.10 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.26 g of the target resin. The recovered polymer was subjected to GPC analysis to find that the polymer had Mw of 7900 and a dispersion (Mw/Mn) of 1.97. In $^1$H-NMR (in DMSO-d6) spectrum, signals were observed at 0.8–2.4 (broad), 1.6, 1.9, 2.1 and 4.6 ppm.

Example 66
Synthesis of Resin Having the Following Structure

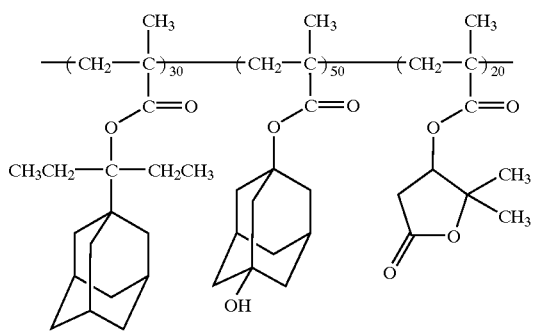

In an Erlenmeyer flask, 3.50 g (12.1 mmole) of monomer [4-1] (methacrylate), 4.75 g (20.1 mmole) of monomer [6-1] (methacrylate), 1.59 g (8.0 mmole) of monomer [3-5] (methacrylate) and 0.98 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.18 g of the target resin. The recovered polymer was subjected to GPC analysis to find that the polymer had Mw of 7600 and a dispersion (Mw/Mn) of 1.95. In $^1$H-NMR (in DMSO-d6) spectrum, signals were observed at 0.8–2.4 (broad), 1.6, 1.9, 2.1, 4.3, 4.6 and 5.3 ppm.

Example 67
Synthesis of Resin Having the Following Structure

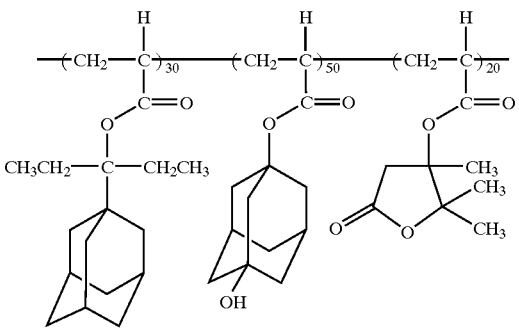

In an Erlenmeyer flask, 3.50 g (12.7 mmole) of monomer [4-1] (acrylate), 4.75 g (21.4 mmole) of monomer [6-1] (acrylate), 1.70 g (8.6 mmole) of monomer [3-6] (acrylate) and 0.99 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.35 g of the target resin. The recovered polymer was subjected to GPC analysis to find that the polymer had Mw of 8000 and a dispersion (Mw/Mn) of 2.05. In $^1$H-NMR (in DMSO-d6) spectrum, signals were observed at 0.8–2.5 (broad), 1.6, 1.9, 2.1, 4.3 and 4.6 ppm.

Example 68
Synthesis of Resin Having the Following Structure

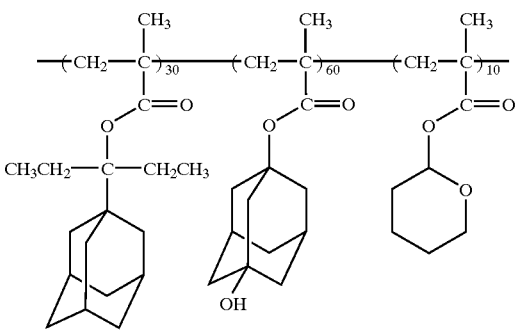

In an Erlenmeyer flask, 3.99 g (13.8 mmole) of monomer [4-1] (methacrylate), 6.50 g (27.5 mmole) of monomer [6-1] (methacrylate), 0.84 g (4.6 mmole) of monomer [10-1]

(methacrylate) and 0.99 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.61 g of the target resin. The recovered polymer was subjected to GPC analysis to find that the polymer had Mw of 8000 and a dispersion (Mw/Mn) of 2.05. In $^1$H-NMR (in DMSO-d6) spectrum, signals were observed at 0.8–2.4 (broad), 1.6, 1.9, 2.1, 3.8, 3.9, 4.3, 4.6 and 5.9 ppm.

Example 69

Synthesis of Resin Having the Following Structure

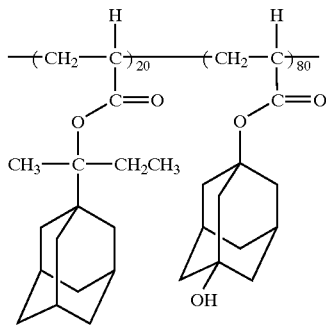

In an Erlenmeyer flask, 2. 12 g (8. 1 mmole) of monomer [4-3] (acrylate), 7.25 g (32.7 mmole) of monomer [6-1] (acrylate) and 0.94 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.44 g of the target resin. The recovered polymer was subjected to GPC analysis to find that the polymer had Mw of 7500 and a dispersion (Mw/Mn) of 1.93. In $^1$H-NMR (in DMSO-d6) spectrum, signals were observed at 0.8–2.5 (broad), 1.6, 1.9, 2.1 and 4.6 ppm.

Example 70
Synthesis of Resin Having the Following Structure

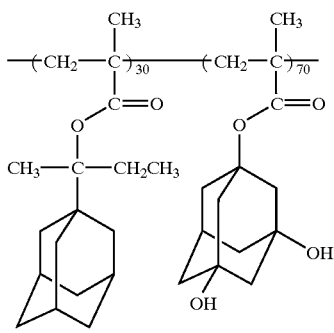

In an Erlenmeyer flask, 3.38 g (12.2 mmole) of monomer [4-3] (methacrylate), 7.20 g (28.6 mmole) of monomer [6-2] (methacrylate) and 1.06 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.84 g of the target resin. The recovered polymer was subjected to GPC analysis to find that the polymer had Mw of 9100 and a dispersion (Mw/Mn) of 2.34. In $^1$H-NMR (in DMSO-d6) spectrum, signals were observed at 0.8–2.5 (broad), 1.5, 1.9, 2.1 and 4.6 ppm.

Example 71
Synthesis of Resin Having the Following Structure

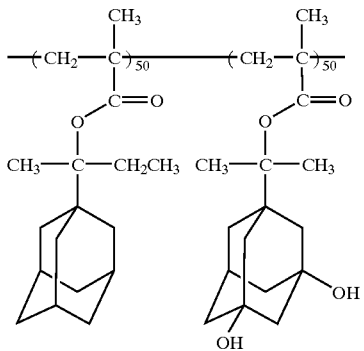

In an Erlenmeyer flask, 4.80 g (17.4 mmole) of monomer [4-3] (methacrylate), 5.11 g (17.4 mmole) of monomer [6-9] (methacrylate) and 0.99 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.29 g of the target resin. The recovered polymer was subjected to GPC analysis to find that the polymer had Mw of 8700 and a dispersion (Mw/Mn) of 2.19. In $^1$H-NMR (in DMSO-d6) spectrum, signals were observed at 0.8–2.5 (broad), 1.5, 1.9, 2.1 and 4.6 ppm.

Example 72

Synthesis of Resin Having the Following Structure

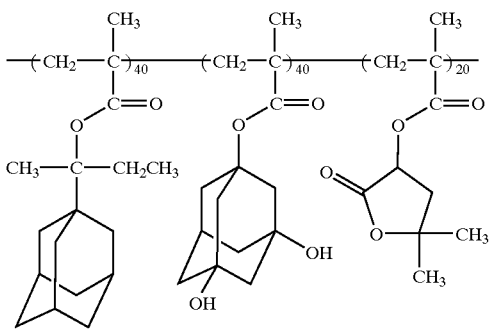

In an Erlenmeyer flask, 4.50 g (16.3 mmole) of monomer [4-3] (methacrylate), 4.11 g (16.3 mmole) of monomer [6-2] (methacrylate), 1.61 g (8.2 mmole) of monomer [9-3] (methacrylate) and 1.02 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.23 g of the target resin. The recovered polymer was subjected to GPC analysis to find that the polymer had Mw of 7800 and a dispersion (Mw/Mn) of 1.97. In $^1$H-NMR (in DMSO-d6) spectrum, signals were observed at 0.8-2.5 (broad), 1.6, 1.9, 2.1, 4.6 and 5.3 ppm.

Example 73

Synthesis of Resin Having the Following Structure

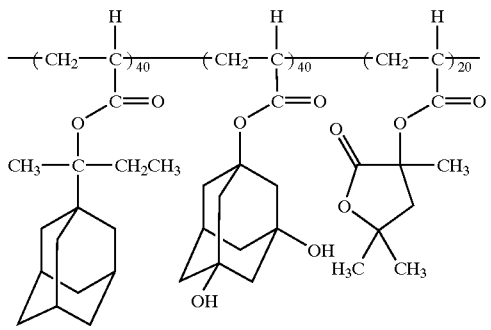

In an Erlenmeyer flask, 4.50 g (17.2 mmole) of monomer [4-3] (acrylate), 4.11 g (17.2 mmole) of monomer [6-2] (acrylate), 1.74 g (8.6 mmole) of monomer [9-4] (acrylate) and 1.03 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.94 g of the target resin. The recovered polymer was subjected to GPC analysis to find that the polymer had Mw of 7600 and a dispersion (Mw/Mn) of 1.95. In $^1$H-NMR (in DMSO-d6) spectrum, signals were observed at 0.8–2.5 (broad), 1.6, 1.9, 2.1 and 4.6 ppm.

Example 74

Synthesis of Resin Having the Following Structure

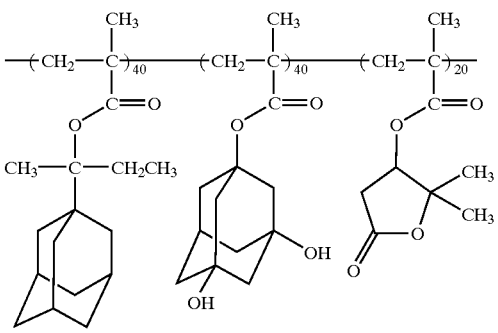

In an Erlenmeyer flask, 4.63 g (16.8 mmole) of monomer [4-3] (methacrylate), 4.23 g (16.8 mmole) of monomer [6-2] (methacrylate), 1.66 g (8.4 mmole) of monomer [3-5] (methacrylate) and 1.05 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.11 g of the target resin. The recovered polymer was subjected to GPC analysis to find that the polymer had Mw of 7600 and a dispersion (Mw/Mn) of 1.95. In $^1$H-NMR (in DMSO-d6) spectrum, signals were observed at 0.8–2.4 (broad), 1.6, 1.9, 2.1, 4.3, 4.6 and 5.3 ppm.

Example 75
Synthesis of Resin Having the Following Structure

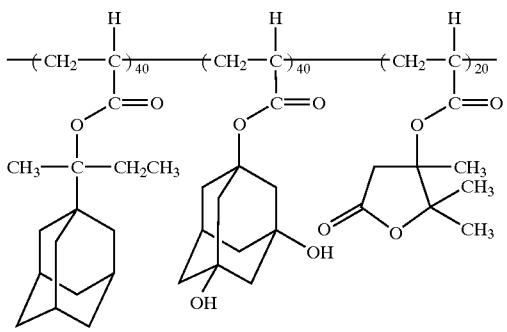

In an Erlenmeyer flask, 4.25 g (16.2 mmole) of monomer [4-3] (acrylate), 3.86 g (16.2 mmole) of monomer [6-2] (acrylate), 1.60 g (8.1 mmole) of monomer [3-6] (acrylate) and 0.97 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.21 g of the target resin. The recovered polymer was subjected to GPC analysis to find that the polymer had Mw of 7600 and a dispersion (Mw/Mn) of 1.95. In $^1$H-NMR (in DMSO-d6) spectrum, signals were observed at 0.8–2.5 (broad), 1.6, 1.9, 2.1, 4.3 and 4.6 ppm.

Example 76
Synthesis of Resin Having the Following Structure

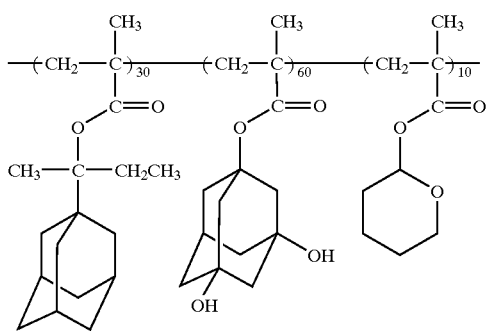

In an Erlenmeyer flask, 3.99 g (13.8 mmole) of monomer [4-3] (methacrylate), 6.50 g (27.5 mmole) of monomer [6-2] (methacrylate), 0.84 g (4.6 mmole) of monomer [10-1] (methacrylate) and 0.99 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.35 g of the target resin. The recovered polymer was subjected to GPC analysis to find that the polymer had Mw of 8200 and a dispersion (Mw/Mn) of 2.21. In $^1$H-NMR (in DMSO-d6) spectrum, signals were observed at 0.8–2.4 (broad), 1.6, 1.9, 2.2, 3.8, 3.9, 4.3, 4.6 and 5.9 ppm.

Example 77
Synthesis of Resin Having the Following Structure

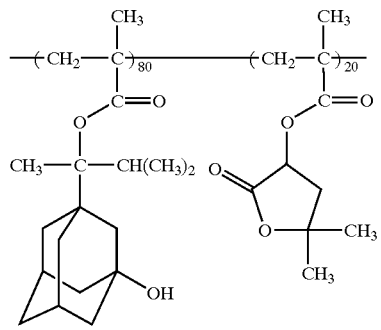

In an Erlenmeyer flask, 8.32 g (27.2 mmole) of monomer [4-6] (methacrylate), 1.35 g (6.8 mmole) of monomer [9-3] (methacrylate) and 0.97 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.26 g of the target resin. The recovered polymer was subjected to GPC analysis to find that the polymer had Mw of 8000 and a dispersion (Mw/Mn) of 2.26. In $^1$H-NMR (in DMSO-d6) spectrum, signals were observed at 0.8–2.5 (broad), 1.6, 1.9, 2.1, 4.6 and 5.3 ppm.

Example 78
Synthesis of Resin Having the Following Structure

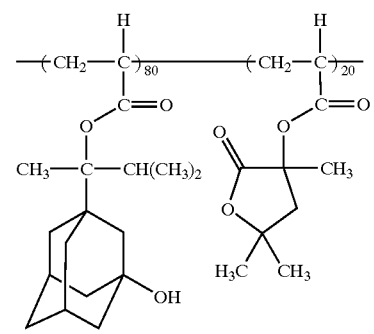

In an Erlenmeyer flask, 8.35 g (28.6 mmole) of monomer [4-6] (acrylate), 1.42 g (7.1 mmole) of monomer [9-4] (acrylate) and 0.98 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.82 g of the target resin. The recovered polymer was subjected to GPC analysis to find that the polymer had Mw of 8400 and a dispersion (Mw/Mn) of 2.32. In $^1$H-NMR (in DMSO-d6) spectrum, signals were observed at 0.8–2.5 (broad), 1.6, 1.9, 2.1 and 4.6 ppm.

Example 79

Synthesis of Resin Having the Following Structure

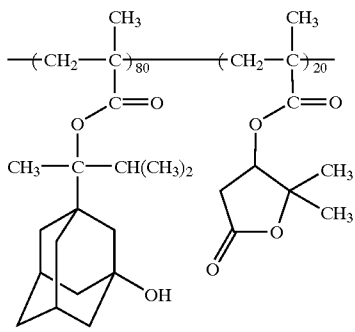

In an Erlenmeyer flask, 8.38 g (27.4 mmole) of monomer [4-6] (methacrylate), 1.36 g (6.8 mmole) of monomer [3-5] (methacrylate) and 0.97 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.84 g of the target resin. The recovered polymer was subjected to GPC analysis to find that the polymer had Mw of 8500 and a dispersion (Mw/Mn) of 2.33. In $^1$H-NMR (in DMSO-d6) spectrum, signals were observed at 0.8–2.5 (broad), 1.6, 1.9, 2.1, 4.6 and 5.3 ppm.

Example 80
Synthesis of Resin Having the Following Structure

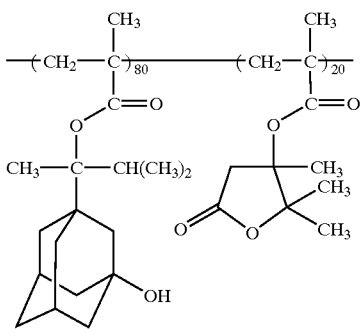

In an Erlenmeyer flask, 8.22 g (26.9 mmole) of monomer [4-6] (methacrylate), 1.42 g (6.7 mmole) of monomer [3-6] (methacrylate) and 0.96 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.41 g of the target resin. The recovered polymer was subjected to GPC analysis to find that the polymer had Mw of 7900 and a dispersion (Mw/Mn) of 2.26. In $^1$H-NMR (in DMSO-d6) spectrum, signals were observed at 0.8–2.4 (broad), 1.6, 1.9, 2.1, 4.3 and 4.6 ppm.

Example 81
Synthesis of Resin Having the Following Structure

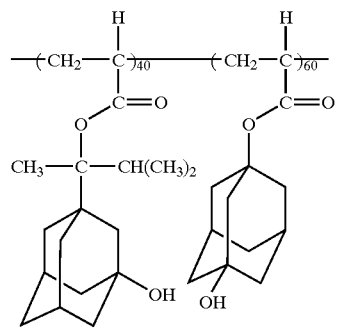

In an Erlenmeyer flask, 4.49 g (15.4 mmole) of monomer [4-6] (acrylate), 5.20 g (23.4 mmole) of monomer [6-1] (acrylate) and 0.97 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.46 g of the target resin. The recovered polymer was subjected to GPC analysis to find that the polymer had Mw of 7500 and a dispersion (Mw/Mn) of 2.13. In $^1$H-NMR (in DMSO-d6) spectrum, signals were observed at 0.8–2.5 (broad), 1.6, 1.9, 2.1 and 4.6 ppm.

Example 82

Synthesis of Resin Having the Following Structure

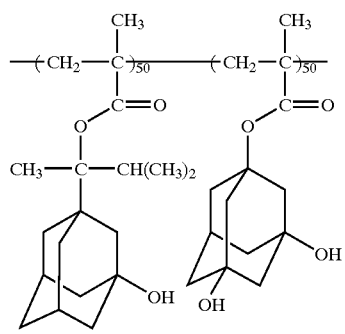

In an Erlenmeyer flask, 4.55 g (14.9 mmole) of monomer [4-6] (methacrylate), 5.58 g (22.1 mmole) of monomer [6-1] (methacrylate) and 1.01 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.74 g of the target resin. The recovered polymer was subjected to GPC analysis to find that the polymer had Mw of 7800 and a dispersion (Mw/Mn) of 2.13. In $^1$H-NMR (in DMSO-d6) spectrum, signals were observed at 0.8–2.4 (broad), 1.5, 1.9, 2.1 and 4.6 ppm.

Example 83

Synthesis of Resin Having the Following Structure

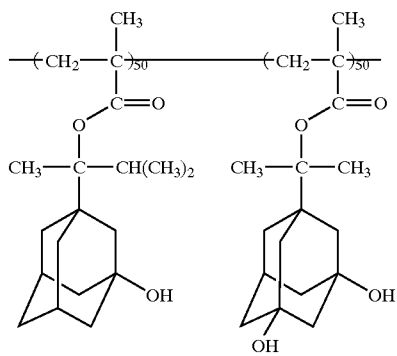

In an Erlenmeyer flask, 5.48 g (17.9 mmole) of monomer [4-6] (methacrylate), 4.51 g (17.9 mmole) of monomer [6-9] (methacrylate) and 0.99 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.49 g of the target resin. The recovered polymer was subjected to GPC analysis to find that the polymer had Mw of 8100 and a dispersion (Mw/Mn) of 2.16. In $^1$H-NMR (in DMSO-d6) spectrum, signals were observed at 0.8–2.5 (broad), 1.6, 1.9, 2.1 and 4.6 ppm.

Example 84

Synthesis of Resin Having the Following Structure

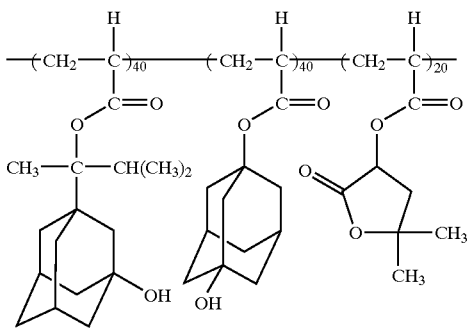

In an Erlenmeyer flask, 4.45 g (15.2 mmole) of monomer [4-6] (acrylate), 3.38 g (15.2 mmole) of monomer [6-1] (acrylate), 1.40 g (7.6 mmole) of monomer [9-3] (acrylate) and 0.92 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.25 g of the target resin. The recovered polymer was subjected to GPC analysis to find that the polymer had Mw of 7900 and a dispersion (Mw/Mn) of 1.95. In $^1$H-NMR (in DMSO-d6) spectrum, signals were observed at 0.8–2.9 (broad), 1.6, 1.9, 2.1, 4.6 and 5.3 ppm.

Example 85
Synthesis of Resin Having the Following Structure

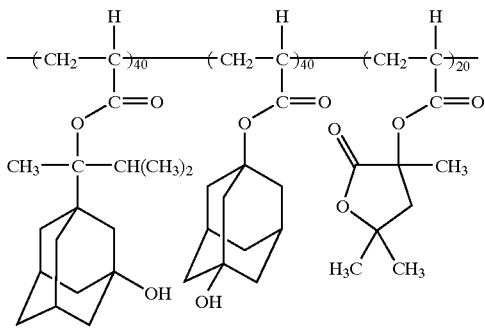

In an Erlenmeyer flask, 4.56 g (15.6 mmole) of monomer [4-6] (acrylate), 3.46 g (15.6 mmole) of monomer [6-1] (acrylate), 1.54 g (7.8 mmole) of monomer [9-4] (acrylate) and 0.95 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.25 g of the target resin. The recovered polymer was subjected to GPC analysis to find that the polymer had Mw of 8200 and a dispersion (Mw/Mn) of 2.12. In $^1$H-NMR (in DMSO-d6) spectrum, signals were observed at 0.8–2.4 (broad), 1.6, 1.9, 2.1 and 4.6 ppm.

Example 86
Synthesis of Resin Having the Following Structure

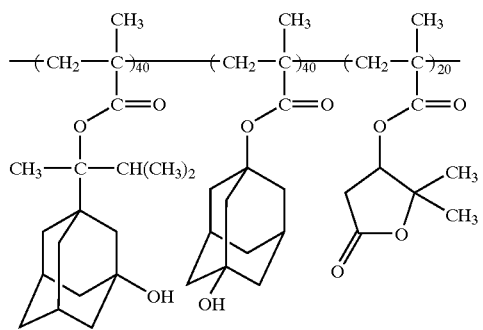

In an Erlenmeyer flask, 4.60 g (15.0 mmole) of monomer [4-6] (methacrylate), 3.55 g (15.0 mmole) of monomer [6-1] (methacrylate), 1.49 g (7.5 mmole) of monomer [3-5] (methacrylate) and 0.96 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.31 g of the target resin. The recovered polymer was subjected to GPC analysis to find that the polymer had Mw of 8200 and a dispersion (Mw/Mn) of 2.23. In $^1$H-NMR (in DMSO-d6) spectrum, signals were observed at 0.8–2.5 (broad), 1.6, 1.9, 2.1, 4.3, 4.6 and 5.3 ppm.

Example 87
Synthesis of Resin Having the Following Structure

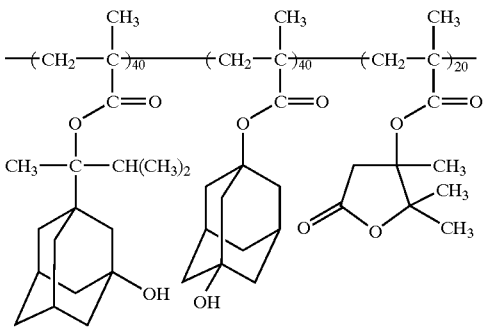

In an Erlenmeyer flask, 4.65 g (15.2 mmole) of monomer [4-6] (methacrylate), 3.55 g (15.2 mmole) of monomer [6-1] (methacrylate), 1.61 g (7.6 mmole) of monomer [3-6] (methacrylate) and 0.96 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.64 g of the target resin. The recovered polymer was subjected to GPC analysis to find that the polymer had Mw of 8500 and a dispersion (Mw/Mn) of 2.29. In $^1$H-NMR (in DMSO-d6) spectrum, signals were observed at 0.8–2.4 (broad), 1.6, 1.9, 2.1, 4.3 and 4.6 ppm.

Example 88
Synthesis of Resin Having the Following Structure

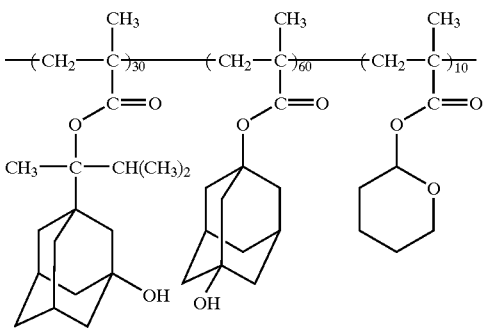

In an Erlenmeyer flask, 3.99 g (13.8 mmole) of monomer [4-6] (methacrylate), 6.50 g (27.5 mmole) of monomer [6-1] (methacrylate), 0.84 g (4.6 mmole) of monomer [10-1]

(methacrylate) and 0.99 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.34 g of the target resin. The recovered polymer was subjected to GPC analysis to find that the polymer had Mw of 8100 and a dispersion (Mw/Mn) of 2.10. In $^1$H-NMR (in DMSO-d6) spectrum, signals were observed at 0.8–2.4 (broad), 1.5, 1.9, 2.1, 3.8, 3.9, 4.3, 4.6 and 5.9 ppm.

Example 89

Synthesis of Resin Having the Following Structure

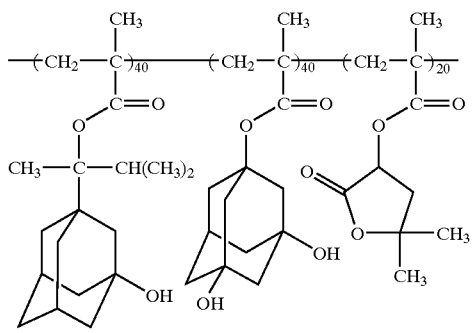

In an Erlenmeyer flask, 4.50 g (16.3 mmole) of monomer [4-6] (methacrylate), 4.11 g (16.3 mmole) of monomer [6-2] (methacrylate), 1.61 g (8.2 mmole) of monomer [9-3] (methacrylate) and 1.02 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.23 g of the target resin. The recovered polymer was subjected to GPC analysis to find that the polymer had Mw of 8000 and a dispersion (Mw/Mn) of 1.99. In $^1$H-NMR (in DMSO-d6) spectrum, signals were observed at 0.8–2.5 (broad), 1.6, 1.9, 2.1, 4.6 and 5.3 ppm.

Example 90

Synthesis of Resin Having the Following Structure

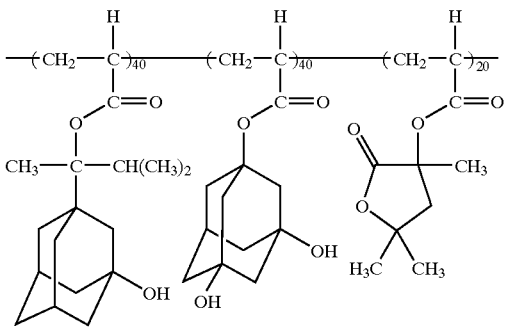

In an Erlenmeyer flask, 4.53 g (15.5 mmole) of monomer [4-6] (acrylate), 3.69 g (15.5 mmole) of monomer [6-2] (acrylate), 1.54 g (7.8 mmole) of monomer [9-4] (acrylate) and 0.96 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.23 g of the target resin. The recovered polymer was subjected to GPC analysis to find that the polymer had Mw of 8300 and a dispersion (Mw/Mn) of 2.20. In $^1$H-NMR (in DMSO-d6) spectrum, signals were observed at 0.8–2.5 (broad), 1.6, 1., 2.2 and 4.6 ppm.

Example 91

Synthesis of Resin Having the Following Structure

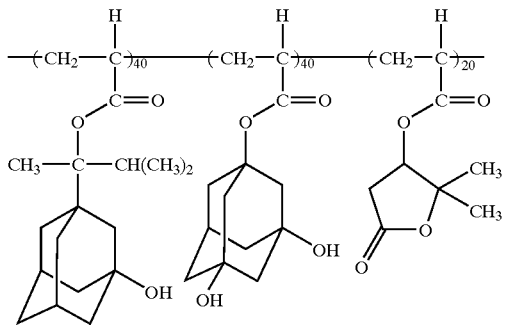

In an Erlenmeyer flask, 4.50 g (15.4 mmole) of monomer [4-6] (acrylate), 3.67 g (15.4 mmole) of monomer [6-2] (acrylate), 1.42 g (7.2 mmole) of monomer [3-5] (acrylate) and 0.95 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.23 g of the target resin. The recovered polymer was subjected to GPC analysis to find that the polymer had Mw of 8300 and a dispersion (Mw/Mn) of 2.06. In $^1$H-NMR (in DMSO-d6) spectrum, signals were observed at 0.8–2.4 (broad), 1.6, 1.9, 2.1, 4.3, 4.6 and 5.3 ppm.

Example 92
Synthesis of Resin Having the Following Structure

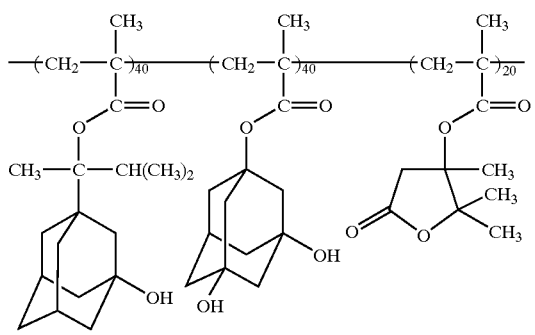

In an Erlenmeyer flask, 4.50 g (15.4 mmole) of monomer [4-6] (methacrylate), 3.67 g (15.4 mmole) of monomer [6-2] (methacrylate), 1.42 g (7.2 mmole) of monomer [3-5] (methacrylate) and 0.95 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 7.23 g of the target resin. The recovered polymer was subjected to GPC analysis to find that the polymer had Mw of 8300 and a dispersion (Mw/Mn) of 2.06. In $^1$H-NMR (in DMSO-d6) spectrum, signals were observed at 0.8–2.4 (broad), 1.6, 1.9, 2.2, 4.3 and 4.6 ppm.

Example 93
Synthesis of Resin Having the Following Structure

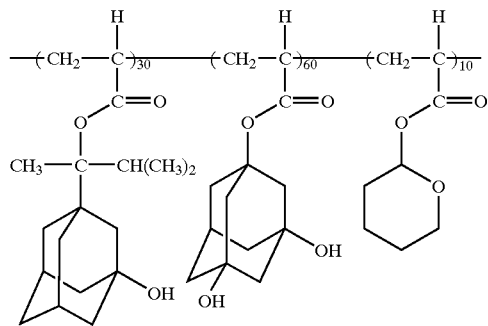

In an Erlenmeyer flask, 3.75 g (12.8 mmole) of monomer [4-6] (acrylate), 6.11 g (25.7 mmole) of monomer [6-2] (acrylate), 0.73 g (4.3 mmole) of monomer [10-1] (acrylate) and 1.05 g of an initiator ("V-65" produced by Wako Pure Chemical Industries, Ltd.) were placed, and were dissolved in 25 g of THF to yield a monomer solution. Separately, 15 g of THF was placed in a 100-ml flask equipped with a reflux condenser and a three-way stopcock, and the above-prepared monomer solution was supplied thereto in a nitrogen atmosphere over 90 minutes using a transfer pump. After the completion of supply, the resulting mixture was stirred for 10 hours, while maintaining the temperature at 60° C., and the reaction mixture was put into 500 ml of hexane, and the formed precipitation was separated by filtration. The reprecipitation and purification procedure was repeated once again to yield 8.35 g of the target resin. The recovered polymer was subjected to GPC analysis to find that the polymer had Mw of 8200 and a dispersion (Mw/Mn) of 2.21. In $^1$H-NMR (in DMSO-d6) spectrum, signals were observed at 0.8–2.5 (broad), 1.6, 1.9, 2.1, 3.8, 3.9, 4.3, 4.6 and 5.9 ppm.

Test Example

A total of 100 parts by weight of each of the polymers obtained in the examples, 10 parts by weight of triphenyl-sulfonium hexafluoroantimonate, and a solvent ethyl lactate were mixed to thereby prepare a photoresist resin composition having a polymer concentration of 17% by weight. This photoresist resin composition was applied onto a silicon wafer by spin coating to form a photosensitive layer 1.0 µm thick. The photosensitive layer was subjected to prebaking on a hot plate at a temperature of 100° C. for 150 seconds, and was exposed to light through a mask using KrF excimer laser 247 nm in wavelength at an irradiance of 30 mJ/cm$^2$. The exposed layer was then subjected to post-exposure baking at a temperature of 100° C. for 60 seconds; was subjected to development in a 0.3 M aqueous tetramethylammonium hydroxide solution for 60 seconds; and was rinsed with pure water to yield a pattern with a 0.25-µm line and space in any case.

What is claimed is:

1. A polymeric compound comprising at least one monomer unit selected from the following formulae (I), (II), (III) and (IV):

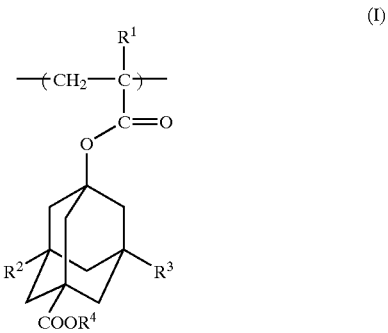

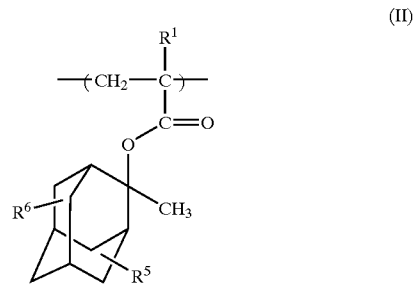

-continued (III)

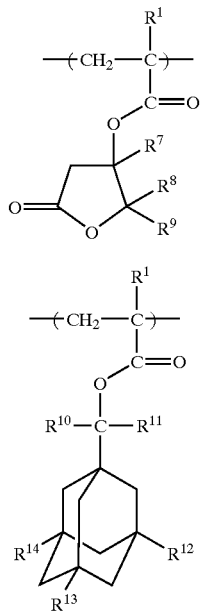

(IV)

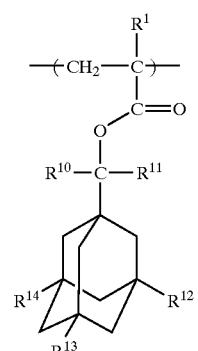

(wherein $R^1$ is a hydrogen atom or a methyl group, $R^2$ and $R^3$ are the same or different and are each a hydrogen atom, a hydroxyl group or a —COOR$^4$ group, where $R^4$ is a t-butyl group, a 2-tetrahydrofuranyl group, a 2-tetrahydropyranyl group or an 2-oxepanyl group; $R^5$ and $R^6$ are the same or different and are each a hydrogen atom, a hydroxyl group or an oxo group; $R^7$, $R^8$ and $R^9$ are the same or different and are each a hydrogen atom or a methyl group; $R^{10}$ and $R^{11}$ are the same or different and are each a hydrocarbon group having 1 to 8 carbon atoms; $R^{12}$, $R^{13}$ and $R^{14}$ are the same or different and are each a hydrogen atom, a hydroxyl group or a methyl group; wherein if all of $R^{12}$ to $R^{14}$ are each a hydrogen atom or a hydroxyl group, $R^{10}$ and $R^{11}$ are not coincidentally methyl groups)
[wherein, when the polymeric compound comprises a monomer unit of Formula (II) in which $R^5=R^6=H$ or comprises a monomer unit of Formula (III), the polymeric compound further comprises at least one monomer unit selected from among a monomer unit represented by Formula (I), a monomer unit of Formula (II) in which at least one of $R^5$ and $R^6$ is a hydroxyl group or an oxo group, a monomer unit represented by Formula (IV) and a monomer unit represented by the following Formula (V):

(V)

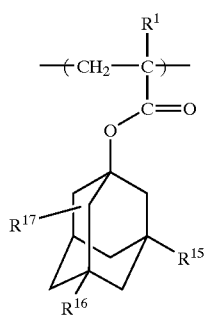

(wherein $R^{15}$ and $R^{16}$ are the same or different and are each a hydrogen atom, a hydroxyl group or a carboxyl group; $R^{17}$ is a hydroxyl group, an oxo group or a carboxyl group; and $R^1$ has the same meaning as defined above)].

2. A polymeric compound according to claim 1, comprising at least one monomer unit selected from among Formulae (I), (II) and (III); and at least one monomer unit represented by the following Formula (V):

(V)

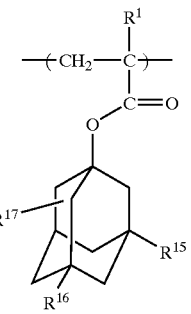

(wherein $R^1$ is a hydrogen atom or a methyl group; $R^{15}$ and $R^{16}$ are the same or different and are each a hydrogen atom, a hydroxyl group or a carboxyl group; and $R^{17}$ is a hydroxyl group, an oxo group or a carboxyl group).

3. A polymeric compound according to claim 1, comprising at least one monomer unit represented by Formula (IV); and at least one monomer unit (excluding the monomer unit represented by Formula (IV)) selected from the following formulae (VI) and (II):

(VI)

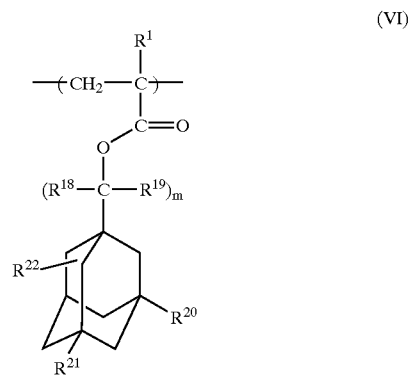

(II)

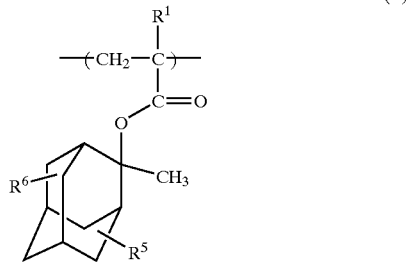

(wherein $R^1$ is a hydrogen atom or a methyl group; $R^{18}$ and $R^{19}$ are the same or different and are each a hydrocarbon group having 1 to 8 carbon atoms; $R^{20}$ and $R^{21}$ are the same or different and are each a hydrogen atom, a hydroxyl group, a carboxyl group or a —COOR group; $R^{22}$ is a hydroxyl group, an oxo group, a carboxyl group or a —COOR group, where R is a t-butyl group, a 2-tetrahydrofuranyl group, a 2-tetrahydropyranyl group or an 2-oxepanyl group; m denotes 0 or 1; and $R^5$ and $R^6$ are the same or different and are each a hydrogen atom, a hydroxyl group or an oxo group).

4. A polymeric compound according to any one of claims 1 to 3, further comprising at least one monomer unit selected from among a monomer unit represented by the following Formula (VII):

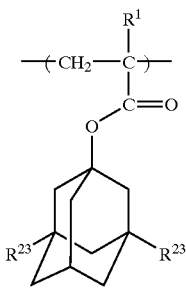

(VII)

(wherein $R^1$ and $R^{23}$ are the same or different and are each a hydrogen atom or a methyl group),
a monomer unit represented by the following Formula (VIII):

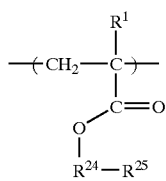

(VIII)

(wherein $R^{24}$ is a tricyclo[5.2.1.0$^{2,6}$]decylmethyl group, a tetracyclo[4.4.0.1$^{2,5}$.1$^{7,10}$]dodecylmethyl group, a norbornyl group, an isobornyl group or a 2-norbornylmethyl group; $R^{25}$ is a substituent of $R^{24}$ and is a hydrogen atom, a hydroxyl group, a hydroxymethyl group, a carboxyl group or a —COOR$^{26}$ group, where $R^{26}$ is a t-butyl group, a 2-tetrahydrofuranyl group, a 2-tetrahydropyranyl group or an 2-oxepanyl group; and $R^1$ has the same meaning as defined above),
a monomer unit represented by the following Formula (IX):

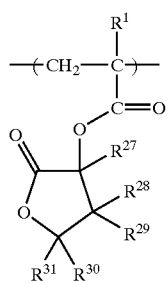

(IX)

(wherein $R^{27}$, $R^{28}$, $R^{29}$, $R^{30}$ and $R^{31}$ are the same or different and are each a hydrogen atom or a methyl group; and $R^1$ has the same meaning as defined above), a monomer unit represented by the following Formula (X):

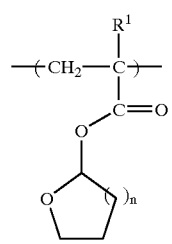

(X)

(wherein n denotes an integer of 1 to 3; and $R^1$ has the same meaning as defined above), and a monomer unit represented by the following Formula (XI):

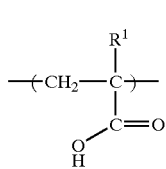

(XI)

(wherein $R^1$ has the same meaning as defined above).

5. A polymeric compound according to claim 1, wherein the total content of monomer units each having an adamantane skeleton occupies 50% to 100% by weight of total monomer units constituting the polymer.

6. A polymeric compound according to claim 1, wherein the total content of monomer units having an adamantane skeleton occupies 70% to 100% by weight of total monomer units constituting the polymer.

7. A polymeric compound according to claim 1, wherein said polymeric compound is for use as a photoresist resin.

8. A photoresist resin composition, comprising a polymeric compound according to claim 1, and a light-activatable acid generator.

* * * * *

UNITED STATES PATENT AND TRADEMARK OFFICE
CERTIFICATE OF CORRECTION

PATENT NO.         : 6,692,889 B1                                          Page 1 of 1
APPLICATION NO. : 09/806857
DATED               : February 17, 2004
INVENTOR(S)        : Yoshinori Funaki et al.

It is certified that error appears in the above-identified patent and that said Letters Patent is hereby corrected as shown below:

On the Title page, Item (86) should read:

Item (86) PCT No.: PCT/JP00/05168

Signed and Sealed this

Second Day of January, 2007

JON W. DUDAS
*Director of the United States Patent and Trademark Office*